US010283357B2

(12) United States Patent
Dolzhnikov et al.

(10) Patent No.: US 10,283,357 B2
(45) Date of Patent: May 7, 2019

(54) COMPOSITIONALLY MATCHED MOLECULAR SOLDERS FOR SEMICONDUCTORS

(71) Applicant: The University of Chicago, Chicago, IL (US)

(72) Inventors: Dmitriy S. Dolzhnikov, Chicago, IL (US); Hao Zhang, Urbana, IL (US); Jaeyoung Jang, Chicago, IL (US); Jae Sung Son, Ulsan (KR); Matthew G. Panthani, Ames, IA (US); Dmitri V. Talapin, Riverside, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 15/528,871

(22) PCT Filed: Dec. 1, 2015

(86) PCT No.: PCT/US2015/063145
§ 371 (c)(1),
(2) Date: May 23, 2017

(87) PCT Pub. No.: WO2016/089840
PCT Pub. Date: Jun. 9, 2016

(65) Prior Publication Data

US 2018/0144934 A1 May 24, 2018

Related U.S. Application Data

(60) Provisional application No. 62/085,966, filed on Dec. 1, 2014.

(51) Int. Cl.
*H01L 21/02* (2006.01)
*H01L 29/66* (2006.01)
(Continued)

(52) U.S. Cl.
CPC ...... *H01L 21/02568* (2013.01); *C01B 19/002* (2013.01); *C01B 19/007* (2013.01);
(Continued)

(58) Field of Classification Search
None
See application file for complete search history.

(56) References Cited

U.S. PATENT DOCUMENTS

2002/0055040 A1 5/2002 Mukherjee et al.
2005/0009229 A1 1/2005 Mitzi
(Continued)

FOREIGN PATENT DOCUMENTS

EP 0880187 11/2004

OTHER PUBLICATIONS

Thiele, Gunther, et al., K4[PbSe4]*en*NH3: A Non-Oxide, Non-Halide Inorganic Lead(IV) Compound, Angew. Chem. Int. Ed. 53:18, Mar. 20, 2014, pp. 4699-4703.
(Continued)

*Primary Examiner* — Angel Roman
(74) *Attorney, Agent, or Firm* — Bell & Manninng, LLC

(57) ABSTRACT

Chalcogenidometallates of group IIB, IV and V elements and, particularly, alkali metal-containing chalcogenidometallates of cadmium, lead and bismuth are provided. Also provided are methods of using the chalcogenidometallates as molecular solders to form metal chalcogenide structures, including thin films, molded objects and bonded surfaces composed of metal chalcogenides.

22 Claims, 26 Drawing Sheets

Cd K
Te N

(51) Int. Cl.
*H01L 29/267* (2006.01)
*C01B 19/00* (2006.01)
*H01L 29/786* (2006.01)
*H01L 29/22* (2006.01)

(52) U.S. Cl.
CPC .... *H01L 21/02628* (2013.01); *H01L 29/2203* (2013.01); *H01L 29/267* (2013.01); *H01L 29/66969* (2013.01); *H01L 29/78681* (2013.01); *C01P 2002/84* (2013.01); *C01P 2004/02* (2013.01); *C01P 2004/03* (2013.01); *C01P 2004/04* (2013.01); *C01P 2006/40* (2013.01)

(56) References Cited

U.S. PATENT DOCUMENTS

2007/0160747 A1 7/2007 Mitzi et al.
2007/0163644 A1 7/2007 Van Duren et al.
2007/0169811 A1* 7/2007 Van Duren .......... B22F 1/0055 136/262
2012/0104325 A1 5/2012 Talapin et al.
2012/0282730 A1* 11/2012 Liao .......................... C09D 11/52 438/95
2013/0312831 A1 11/2013 Mitzi et al.
2015/0122315 A1* 5/2015 Shin ......................... H01L 29/73 136/255
2015/0129838 A1* 5/2015 Lewis ............. H01L 31/035218 257/21
2016/0049542 A1* 2/2016 Agrawal ............... C01B 19/002 438/95
2017/0018669 A1* 1/2017 Williams ........ H01L 31/035263
2017/0250298 A1* 8/2017 Korgel ................ H01L 31/0445
2017/0320037 A1* 11/2017 Bourdais ............. H01L 31/1828

OTHER PUBLICATIONS

Wang, Robert Y., Electronic and optical switching of solution-phase deposited SNSe2 phase change memory material, Journal of Applied Physics 109, 113506, Jun. 1, 2011, pp. 113506-1 to 113506-6.

International Search Report and Written Opinion mailed in PCT Patent Application No. PCT/US2015/063145, dated Mar. 21, 2016.

Jang et al., Solution-Processed Transistors Using Colloidal Nanocrystals with Composition-Matched Molecular "Solders": Approaching Single Crystal Mobility, NanoLetters 15, Aug. 17, 2015, pp. 6309-6317.

* cited by examiner

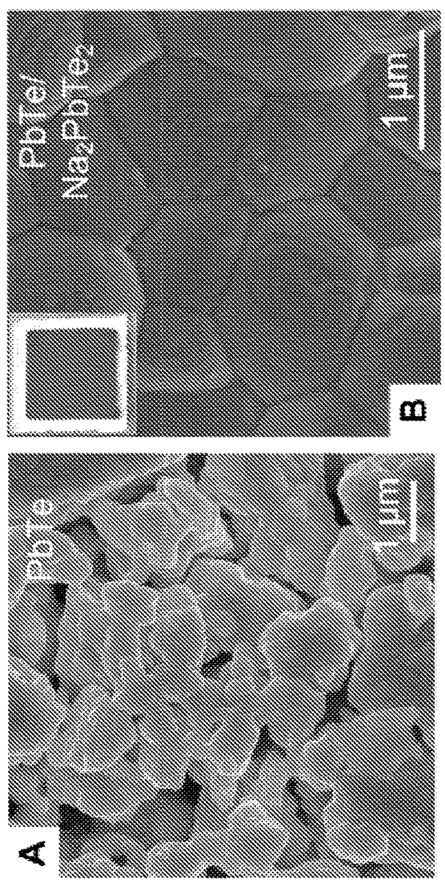
FIG. 3A
FIG. 3B
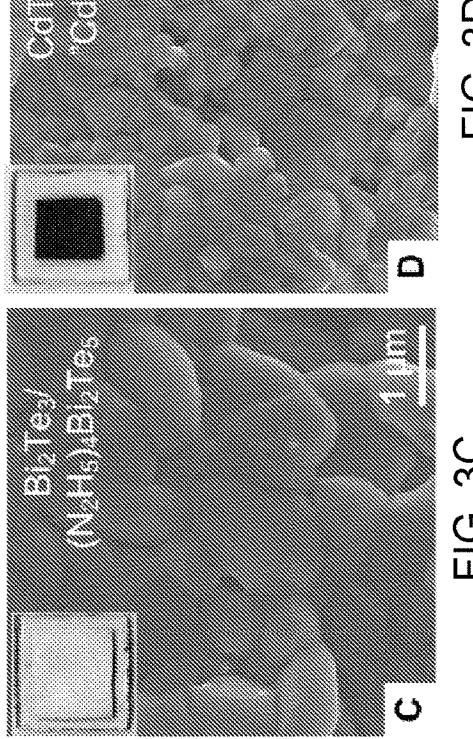
FIG. 3C
FIG. 3D
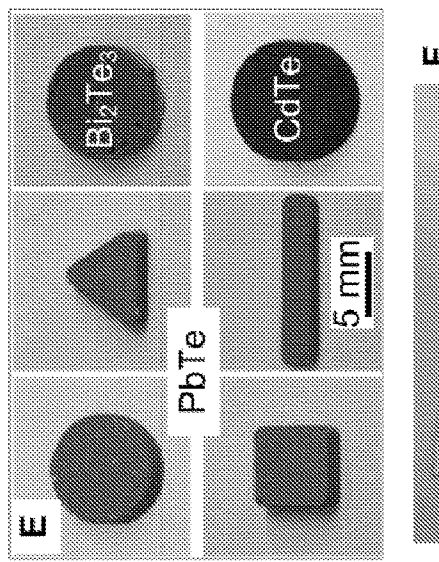
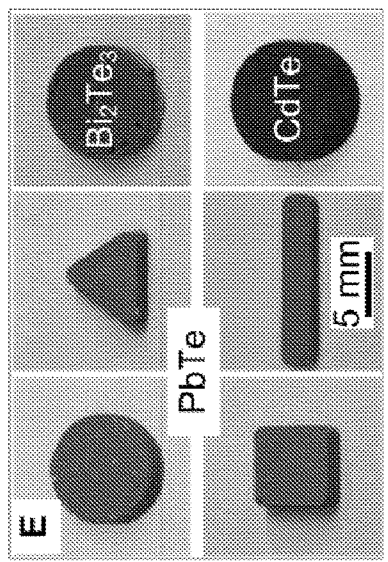
FIG. 3E
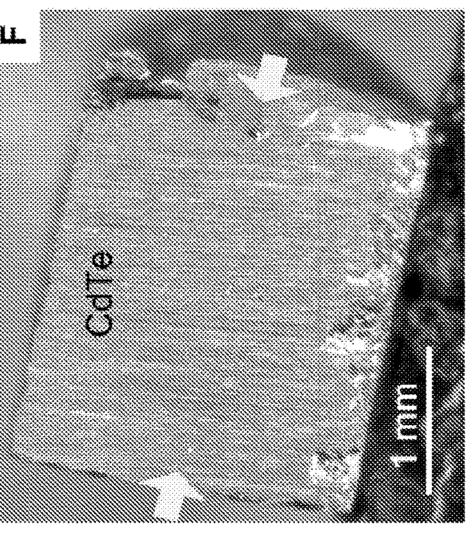
FIG. 3F

COMPOSITIONALLY MATCHED MOLECULAR SOLDERS FOR SEMICONDUCTORS

CROSS-REFERENCE TO RELATED APPLICATIONS

The present application is a National Stage Entry of International Application No. PCT/US2015/063145 that was filed on Dec. 1, 2015, which claims priority to U.S. Provisional Patent Application No. 62/085,966 that was filed on Dec. 1, 2014, the entire contents of which are hereby incorporated by reference.

BACKGROUND

Two pieces of metal, such as copper wires, can be mechanically and electrically connected using soldering, a process in which metallic items are joined together by introducing a filler metal (solder) with a lower melting point. Soldering and related processes (e.g., brazing) are very useful in many areas, from microelectronics to plumbing. At the same time there are no established methods for joining semiconductor pieces under mild conditions without disrupting semiconducting properties at the joint. In other words, there is no "semiconductor solder" for technologically important inorganic semiconductors.

SUMMARY

Chalcogenidometallate compounds, including alkali metal-containing chalcogenidometallates, of group IIB, IV and V elements are provided. Also provided are methods of using the chalcogenidometallates as molecular solders to form various structures, including thin films, molded objects and bonded surfaces, composed of metal chalcogenides. In addition, methods for fabricating field effect transistors that incorporate the metal chalcogenide films as a conducting channel are provided.

One embodiment of a method of forming a structure of a metal chalcogenide comprises the steps of: coating a surface of a substrate with a dispersion comprising metal chalcogenide particles, a compositionally matched metal chalcogenide precursor and a solvent, wherein the metal chalcogenide precursor is a chalcogenidometallate of a group IIB, group IV or group V element; and annealing the coating to form the structure of the metal chalcogenide.

One embodiment of a method of molding a three-dimensional object of a metal chalcogenide comprises the steps of: filling a mold with a dispersion comprising metal chalcogenide particles, a compositionally matched metal chalcogenide precursor and a solvent; evaporating excess solvent to form a dried composite; and annealing the dried composite to form a molded three-dimensional object of a metal chalcogenide.

One embodiment of a method of bonding metal chalcogenide surfaces comprises the steps of: coating a first metal chalcogenide surface with a dispersion comprising a compositionally matched metal chalcogenide precursor and a solvent; contacting a second metal chalcogenide surface with the first metal chalcogenide surface; and annealing the coating to bond the second metal chalcogenide surface to the first metal chalcogenide surface. This method can be used to bond together macroscopic objects, such as wafers—including single-crystalline semiconductor wafers.

The molecular solders include alkali metal-containing chalcogenidometallates having the formulas: (1) $A_2MCh_2$, where A is K, Na or Cs; M is Cd or Pb; and Ch is Se or Te; (2) $A_2Cd_2Se_3$, where A is K, Na or Cs; (3) $A_4Bi_2Ch_5$, where A is K, Na or Cs and Ch is Te or Se; and (4) $A_6Bi_xSb_yTe_6$, wherein A is Na, K or Cs and $0 \leq x \leq 2$, $0 \leq y \leq 2$, and $x+y=2$. A few specific examples of these chalcogenidometallates are $A_2PbTe_2$, wherein A is Na, K, or Cs; $A_2PbSe_2$, wherein A is Na or Cs; $Cs_2CdCh_2$, wherein Ch is Se or Te, and $A_6Bi_{0.5}Sb_{1.5}Te_6$, where A is Na, K or Cs.

The molecular solders also include chalcogenidometallates that comprise organic cations or ammonium cations. These chalcogenidometallates can have the formulas listed directly above, except that A is an organic cation, rather than K, Na or Cs. Examples of organic and ammonium "A" cations include ammonium ($NH_4^+$) and alkylammonium ($NR_4^+$); hydrazinium ($N_2H_5^+$) and alkylhydrazinium ($N_2H_{5-x}R_x^+$, $0 \leq x \leq 5$); sulfonium ($R_3S^+$); and iodonium ($R_2I^+$), where R represents an alkyl group, an aryl group, or a combination thereof.

One embodiment of a method of making a field effect transistor (FET) comprises the steps of: coating a layer of a dielectric material with a dispersion comprising metal chalcogenide particles, a compositionally matched metal chalcogenide precursor and a solvent, wherein the metal chalcogenide precursor is a chalcogenidometallate of a group IIB, group IV or group V element; annealing the coating to form a film comprising the metal chalcogenide; forming a source electrode on the film comprising the metal chalcogenide; forming a drain electrode on the film comprising the metal chalcogenide; and forming a gate electrode on the layer of dielectric material. The resulting FETs may be characterized by high linear regime carrier mobilities, including linear regime carrier mobilities of 200 $cm^2/Vs$ or higher.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3A. SEM image of ball-milled PbTe micro-particles annealed at 500° C. for 30 min.

FIG. 3B. SEM image of a film of similar PbTe micro-particles annealed in the presence of 5 wt. % $Na_2PbTe_2$. The film was annealed at 500° C. for 30 min. The inset shows a film optical micrograph.

FIG. 3C. SEM image of a film made of $Bi_2Te_3$ micro-particles annealed in the presence of 5 wt. % $(N_2H_5)_4Bi_2Te_5$.

The film was annealed at 400° C. for 30 min. The inset shows a film optical micrograph.

FIG. 3D. SEM image of a film made of CdTe NCs annealed in the presence of 20 wt. % "CdTe-gel". The film was annealed at 450° C. for 30 min. The inset shows a film optical micrograph.

FIG. 3E. Three dimensional blocks of PbTe, $Bi_2Te_3$, and CdTe cast using graphite molds of various shapes from micro-particles mixed with corresponding "solders": $Na_2PbTe_2$ for PbTe, $Na_4Bi_2Te_5$ for $Bi_2Te_3$, and $Na_2CdTe_2$ for CdTe.

FIG. 3F. An image showing two CdTe crystals with mechanically polished (111) faces "soldered" with $Na_2CdTe_2$ at 500° C.

Figure 4B:
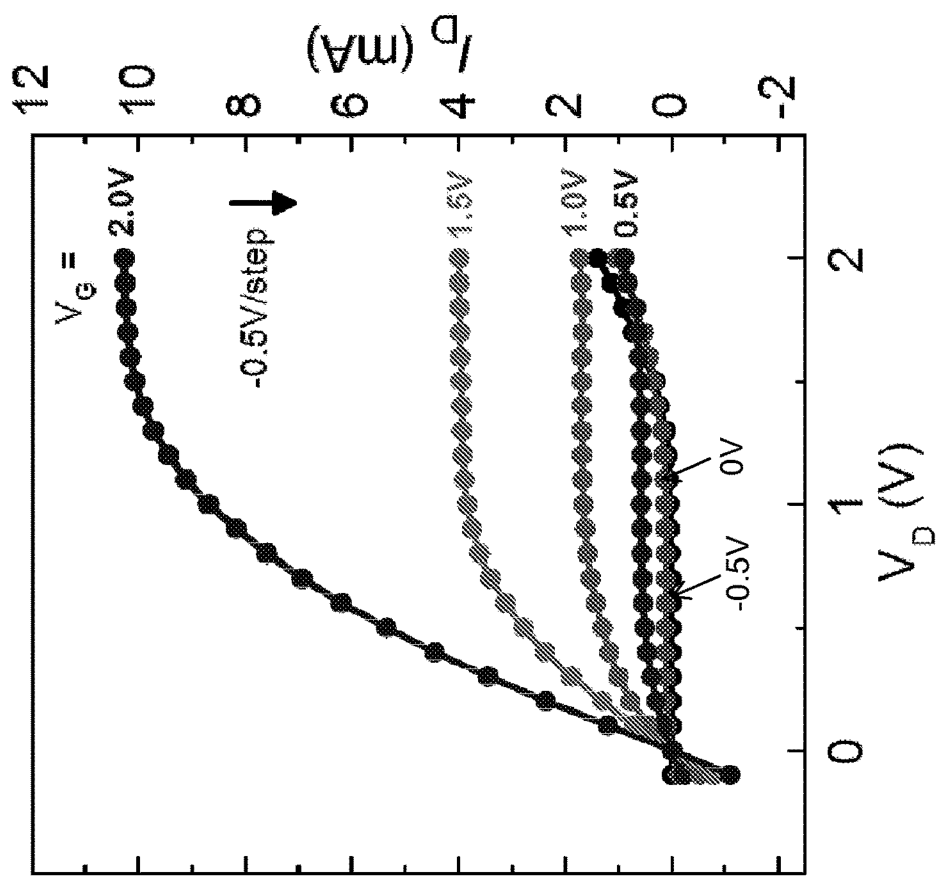
Figure 4A:
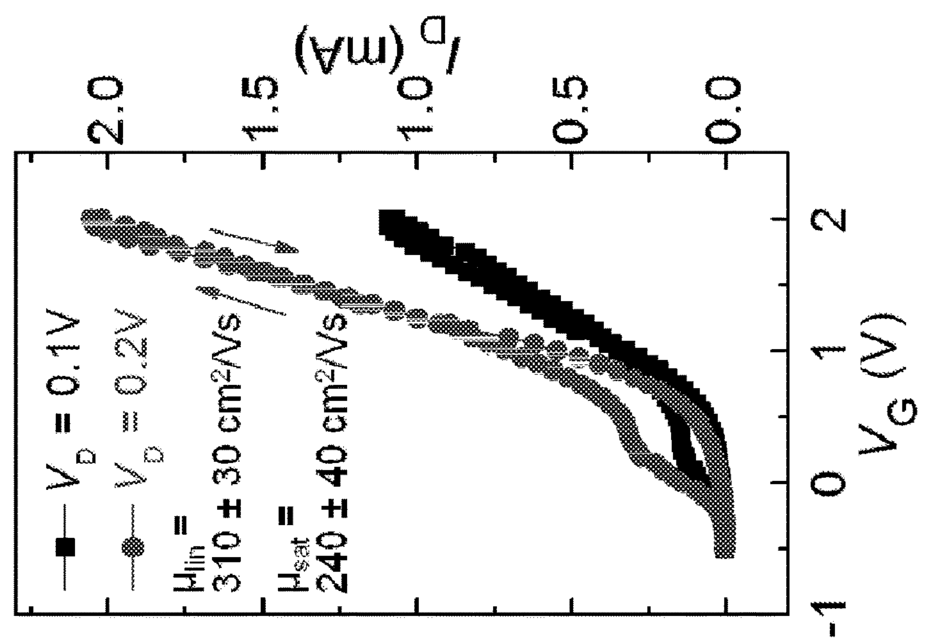

FIG. 4A. Transfer characteristics of an FET with a channel made of spin-coated 4.7 nm CdSe NCs capped with $Na_2Cd_2Se_3$ ligands and annealed at 300° C. for 30 min. FET channel width and length were 1500 μm and 45 μm, respectively. An electron mobility of 310±30 cm$^2$/Vs was observed for 5 different batches of devices.

FIG. 4B. Output characteristics of the FET with a channel made of spin-coated 4.7 nm CdSe NCs capped with $Na_2Cd_2Se_3$ ligands and annealed at 300° C. for 30 min.

Figure 5A:
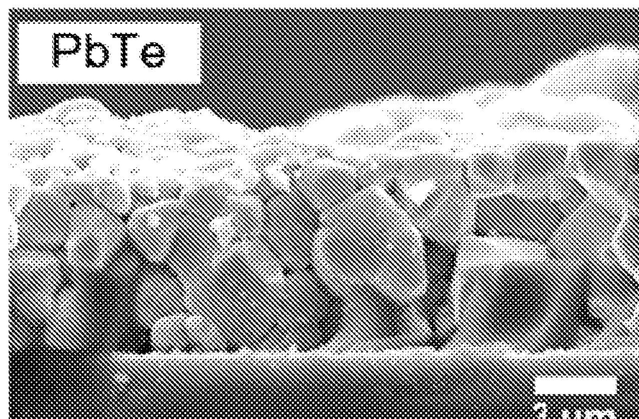

FIG. 5A. Cross-sectional SEM image of thin films of annealed PbTe microparticles with 5 wt. % of $Na_2PbTe_2$.

Figure 5B:
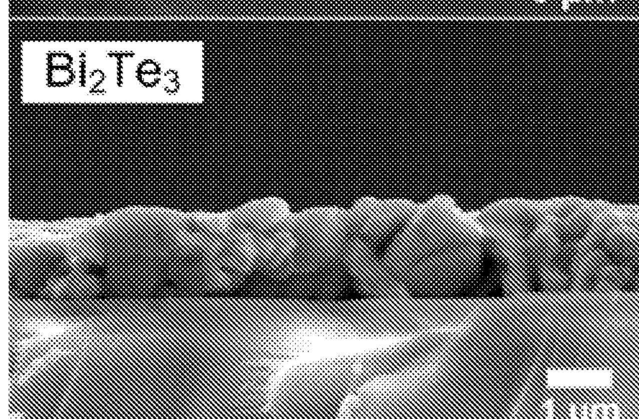

FIG. 5B. Cross-sectional SEM image of $Bi_2Te_3$ microparticles annealed in the presence of 5 wt. % of $(N_2H_5)_4Bi_2Te_5$.

Figure 5C:
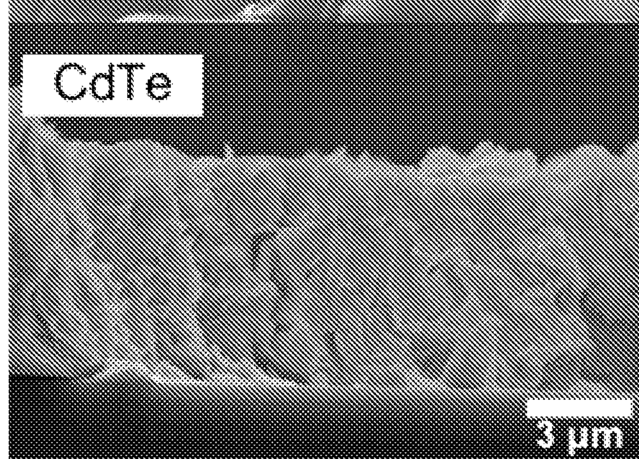

FIG. 5C. Cross-sectional SEM image of CdTe nanocrystals annealed in the presence of 20 wt. % of CdTe gel.

Figure 6B:
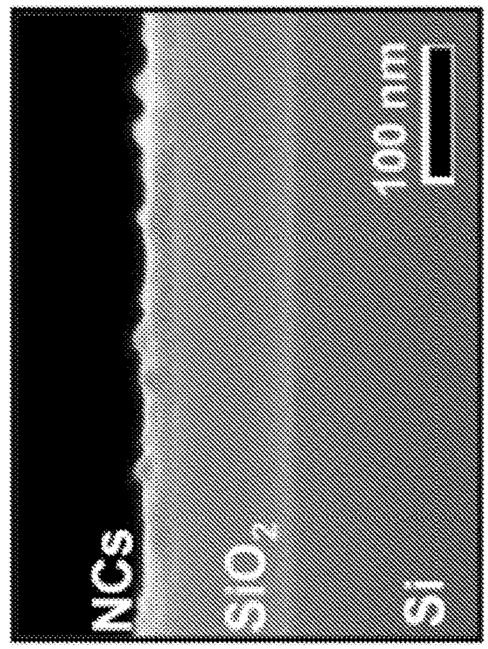
Figure 6A:
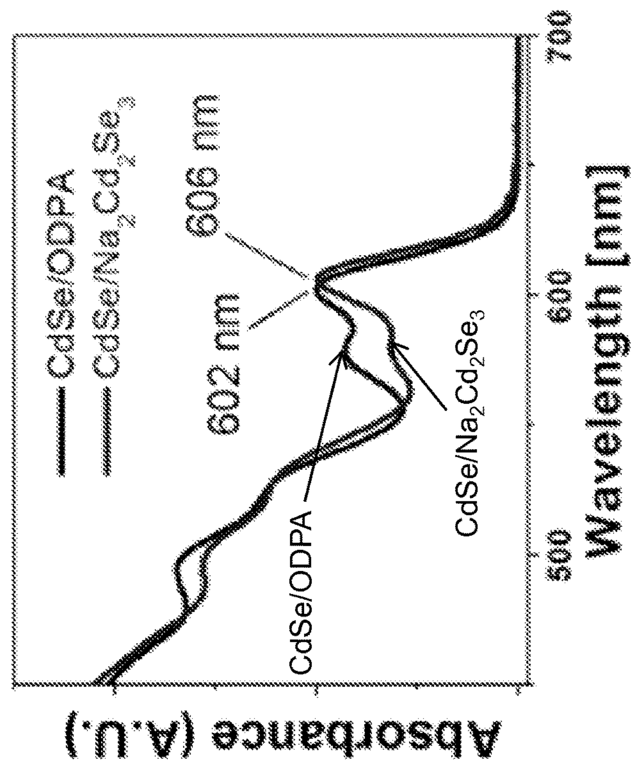

FIG. 6A. Absorption spectra of CdSe NCs capped with ODPA in toluene and capped with $Na_2Cd_2Se_3$ in hydrazine.

FIG. 6B. Cross-sectional SEM image of a thin film composed of CdSe NCs capped with $Na_2Cd_2Se_3$ and annealed at 250° C.

Figure 6C:
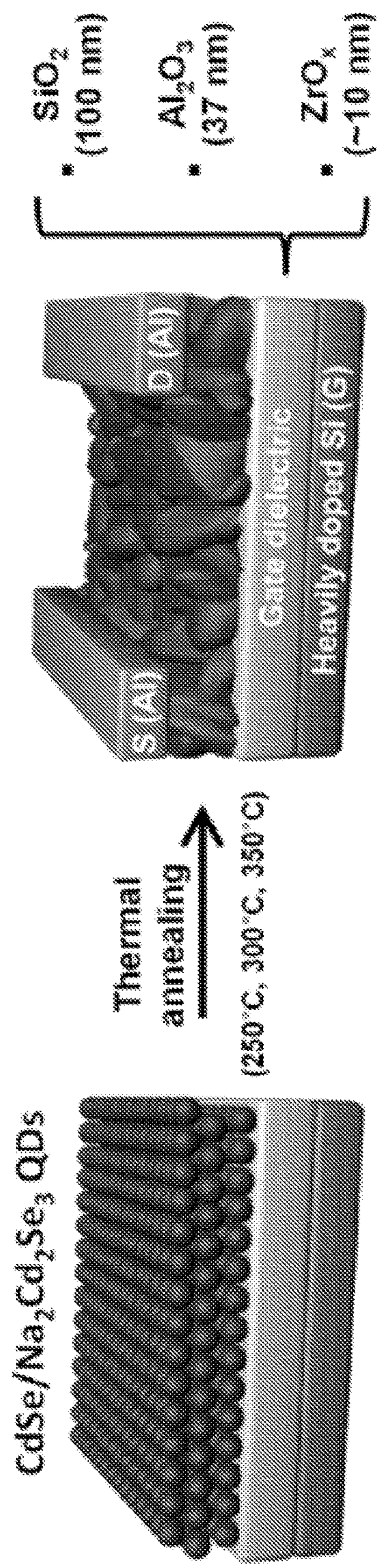

FIG. 6C. Schematic illustration of the experimental procedure used to fabricate a CdSe NC FET and the structure of the CdSe NC FET.

Figure 7C:
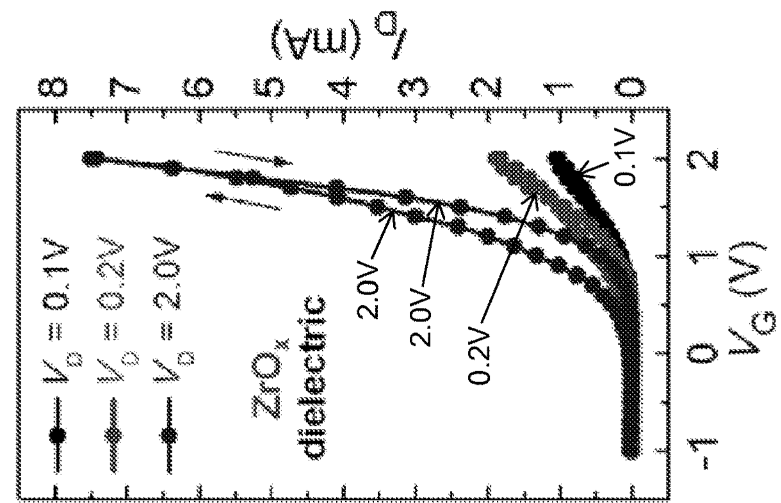
Figure 7B:
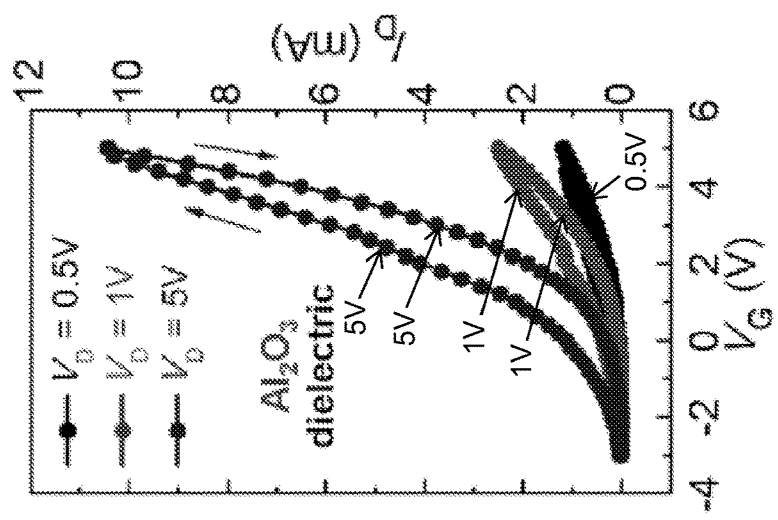
Figure 7A:
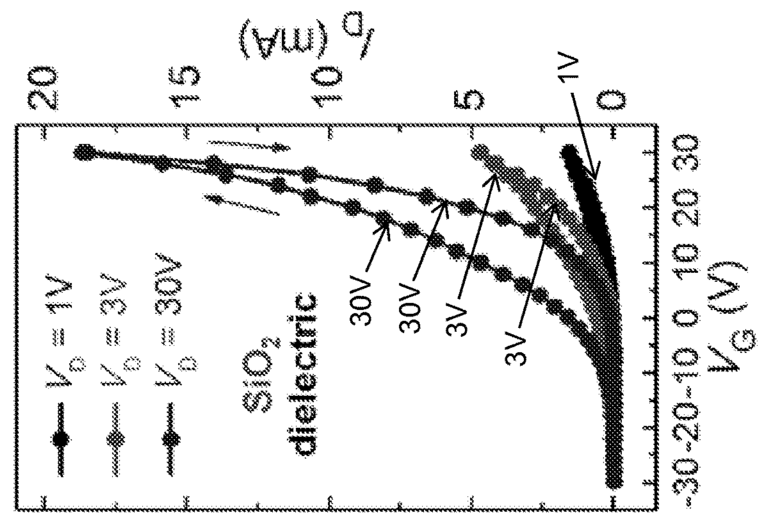

FIG. 7A. Representative transfer ($I_D$ vs $V_G$) characteristics of a CdSe NC FET using an $SiO_2$ dielectric layer (channel width W=1500 μm and channel length L=60 μm). CdSe NCs in the FET channel were soldered with $Na_2Cd_2Se_3$ ligands at 250° C.

FIG. 7B. Representative transfer ($I_D$ vs $V_G$) characteristics of a CdSe NC FET using an $Al_2O_3$ dielectric layer (channel width W=1500 μm and channel length L=60 μm). CdSe NCs in the FET channel were soldered with $Na_2Cd_2Se_3$ ligands at 250° C.

FIG. 7C. Representative transfer ($I_D$ vs $V_G$) characteristics of a CdSe NC FET using a $ZrO_x$ dielectric layer (channel width W=1500 μm and channel length L=30 μm). CdSe NCs in the FET channel were soldered with $Na_2Cd_2Se_3$ ligands at 250° C.

Figure 7F:
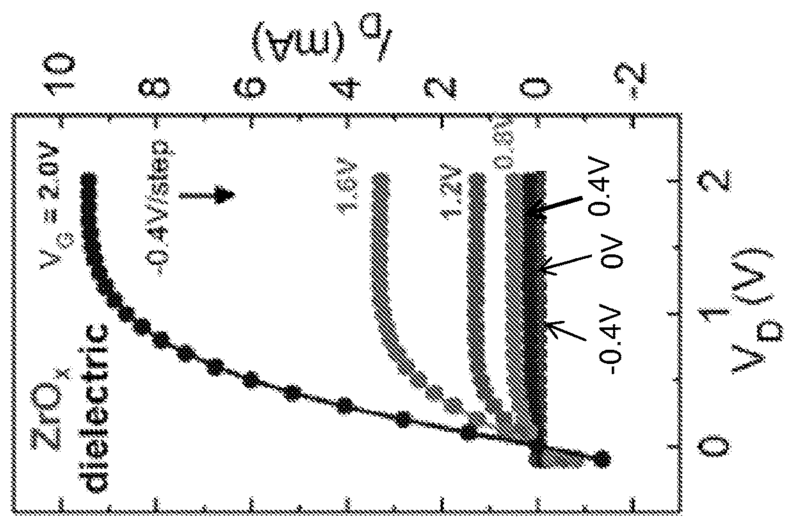
Figure 7E:
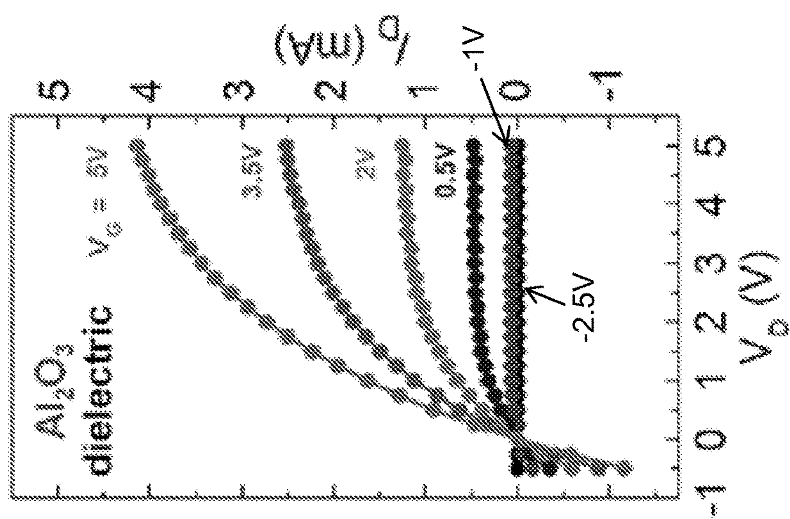
Figure 7D:
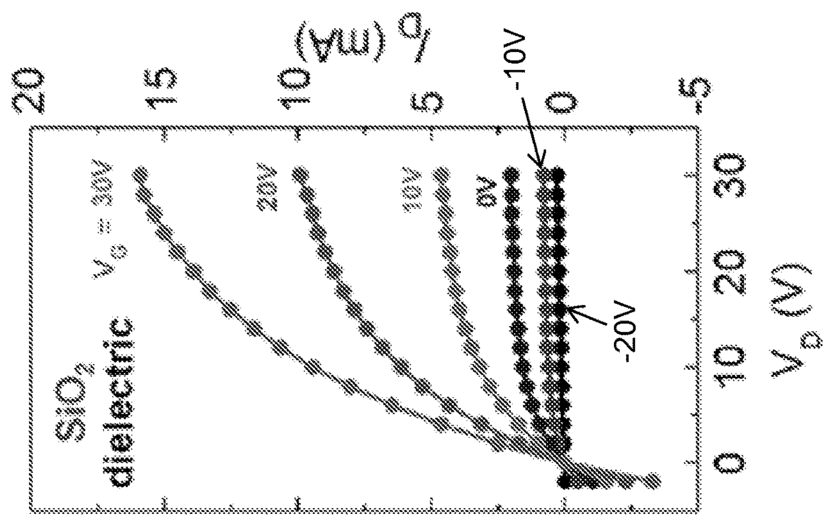

FIG. 7D. Representative output ($I_D$ vs $V_D$) characteristics of a CdSe NC FET using an $SiO_2$ dielectric layer (channel width W=1500 μm and channel length L=60 μm). CdSe NCs in the FET channel were soldered with $Na_2Cd_2Se_3$ ligands at 250° C.

FIG. 7E. Representative output ($I_D$ vs $V_D$) characteristics of a CdSe NC FET using an $Al_2O_3$ dielectric layer (channel width W=1500 μm and channel length L=60 μm). CdSe NCs in the FET channel were soldered with $Na_2Cd_2Se_3$ ligands at 250° C.

FIG. 7F. Representative output ($I_D$ vs $V_D$) characteristics of a CdSe NC FET using a $ZrO_x$ dielectric layer (channel width W=1500 μm and channel length L=30 μm). CdSe NCs in the FET channel were soldered with $Na_2Cd_2Se_3$ ligands at 250° C.

Figure 8B:
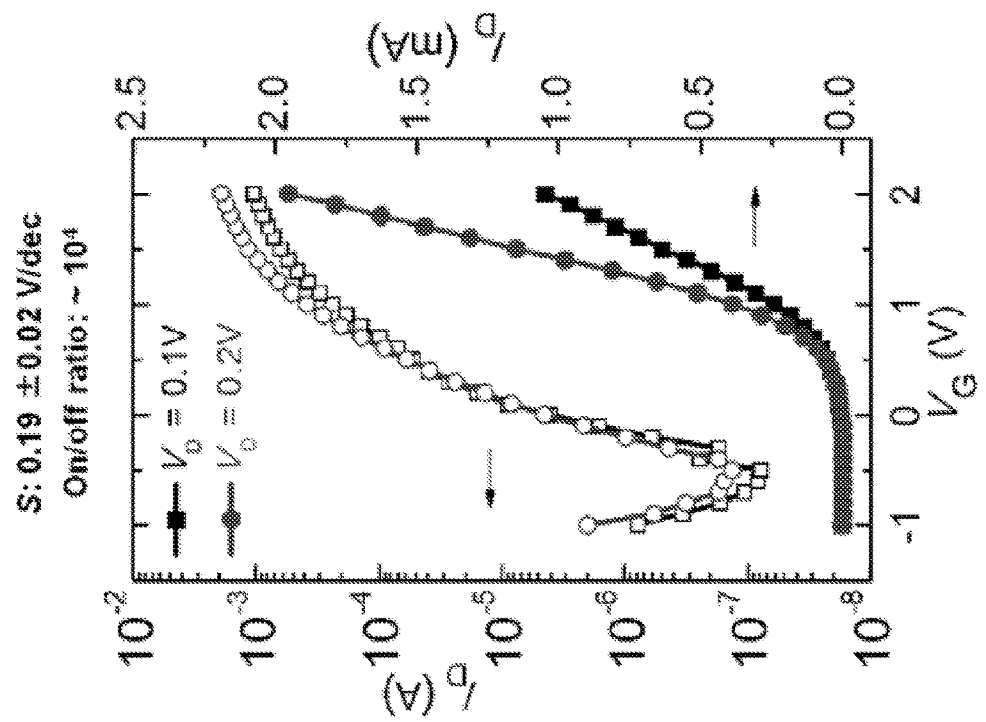
Figure 8A:
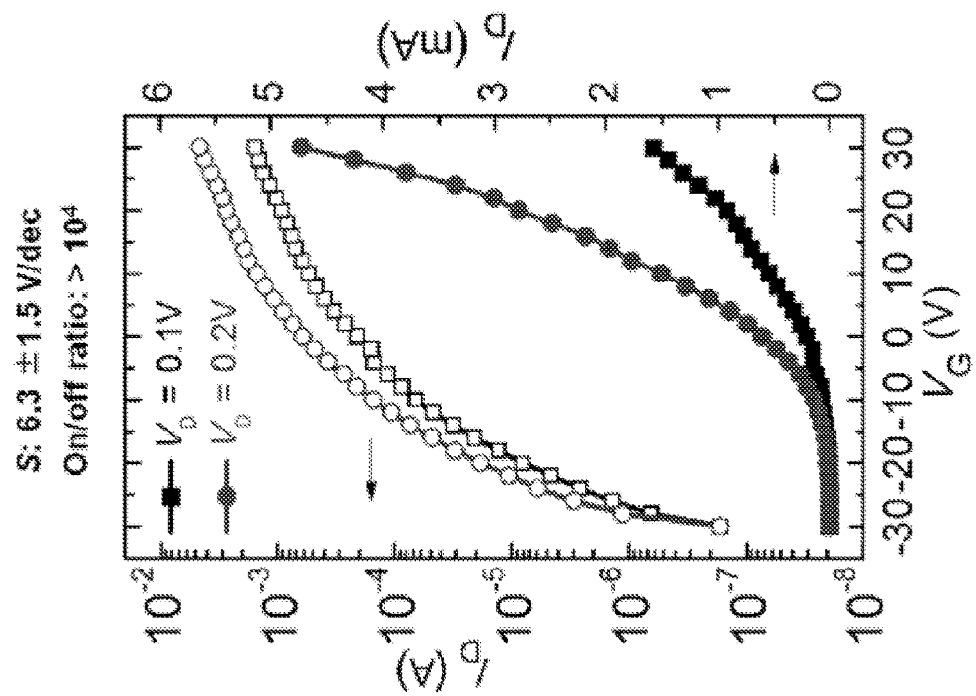

FIG. 8A. Transfer characteristics of a CdSe NC FET using a $SiO_2$ gate dielectric with on/off ratios and average values of subthreshold slope (S).

FIG. 8B. Transfer characteristics of a CdSe NC FET using a $ZrO_x$ gate dielectric with on/off ratios and average values of subthreshold slope (S).

Figure 9B:
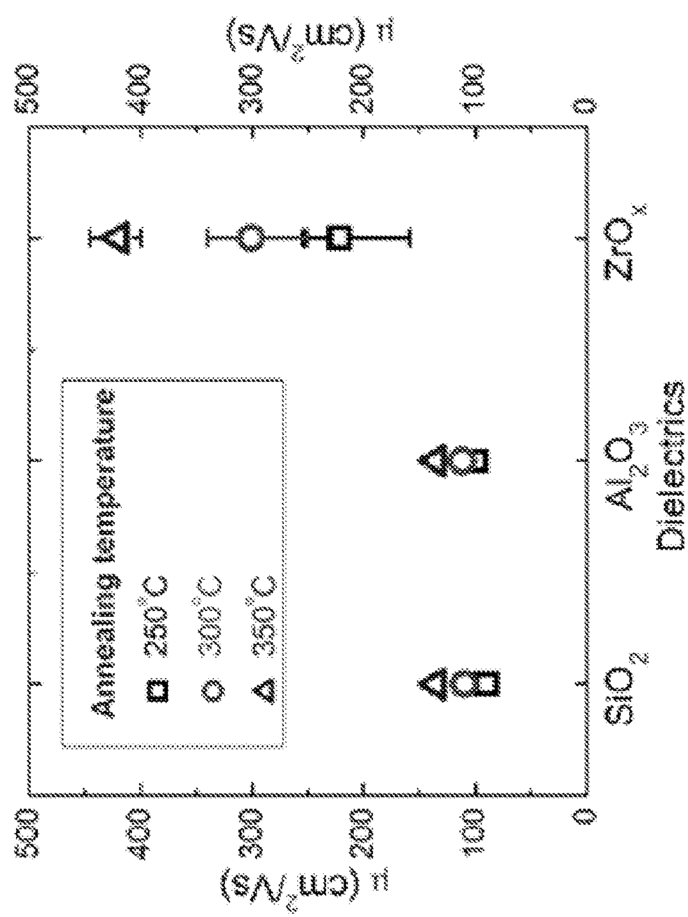
Figure 9A:
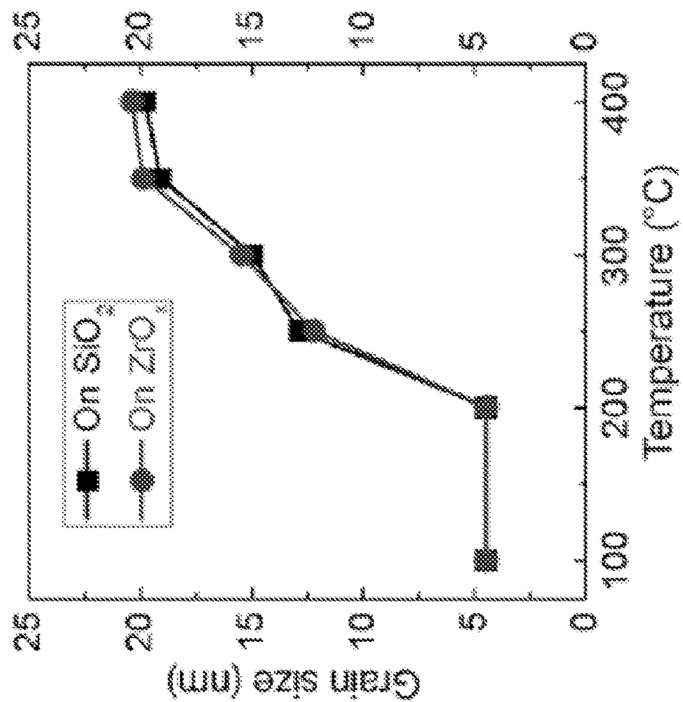

FIG. 9A. Temperature dependence of the Scherrer grain size on annealing temperature of $[Cd_2Se_3]^{2-}$-capped CdSe NCs spin-coated on $SiO_2$ and $ZrO_x$ gate dielectrics.

FIG. 9B. Plot of FET mobilities of $[Cd_2Se_3]^{2-}$-capped CdSe NCs spin-coated on $SiO_2$, $Al_2O_3$, and $ZrO_x$ gate dielectrics and annealed at different temperatures. Several, typically 5 or 6, different batches of devices were measured for each experimental condition. For the devices with $SiO_2$ and $Al_2O_3$ gate dielectrics, the deviations of mobilities were about ±7-12 cm$^2$/Vs, depending on the annealing temperature.

Figure 10A:
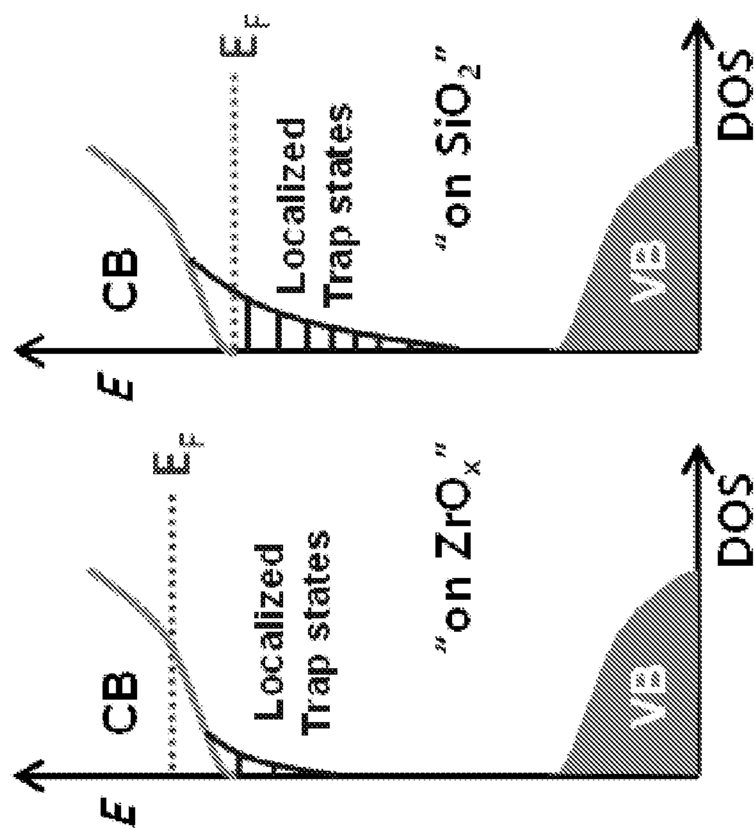

FIG. 10A. Schematic diagrams of electronic structures of CdSe NCs (left) on $ZrO_x$ dielectrics and (right) on $SiO_2$ dielectrics, describing operation of FETs.

Figure 10C:
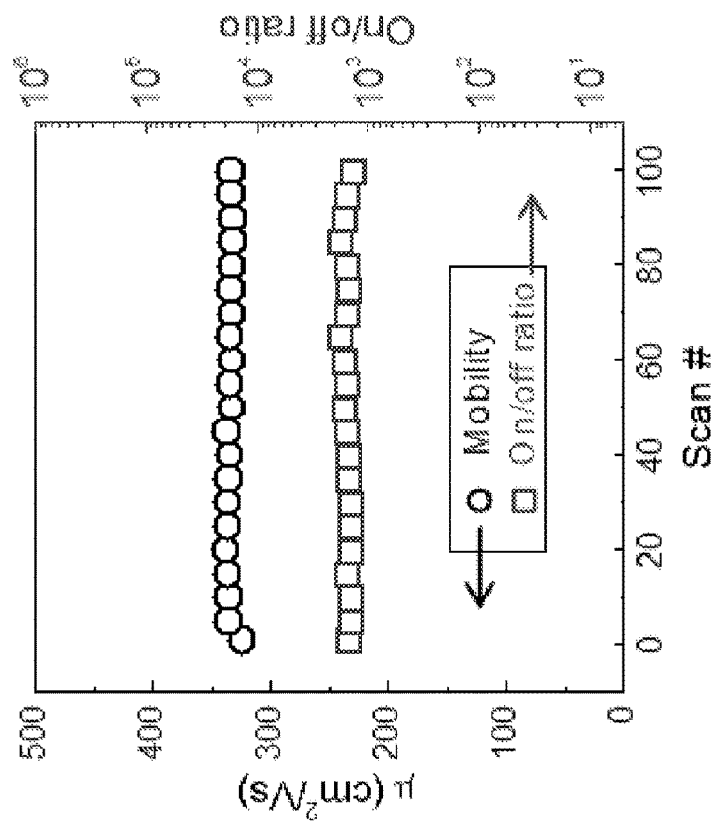
Figure 10B:
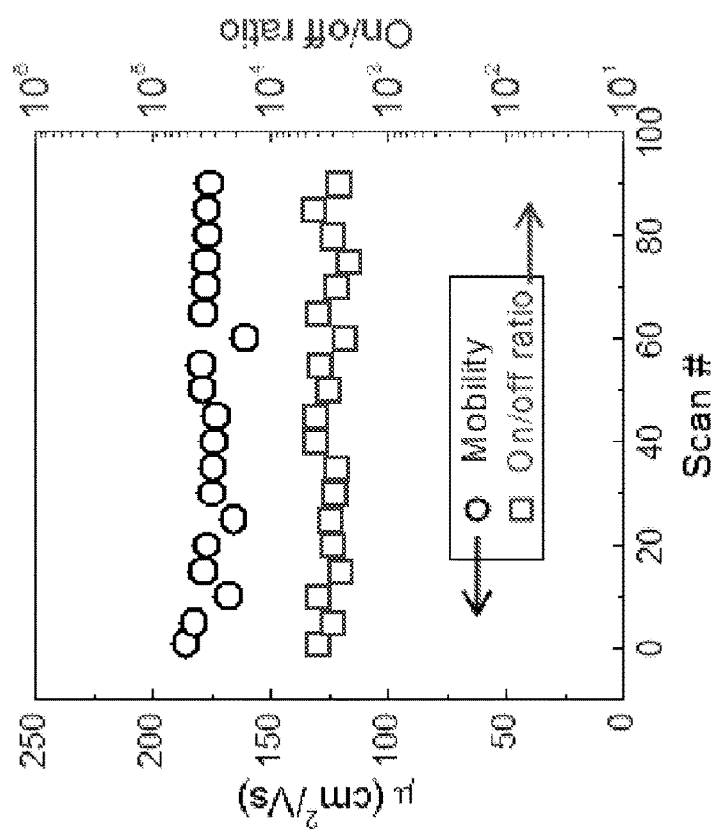

FIG. 10B. μ and on/off ratio values of $[Cd_2Se_3]^{2-}$-capped CdSe NC FETs versus cycling number. The NCs were annealed at 250° C. (W=1500 μm and L=30 μm).

FIG. 10C. μ and on/off ratio values of $[Cd_2Se_3]^{2-}$-capped CdSe NC FETs versus cycling number. The NCs were annealed at 300° C. (W=1500 μm and L=45 μm).

Figure 10D:
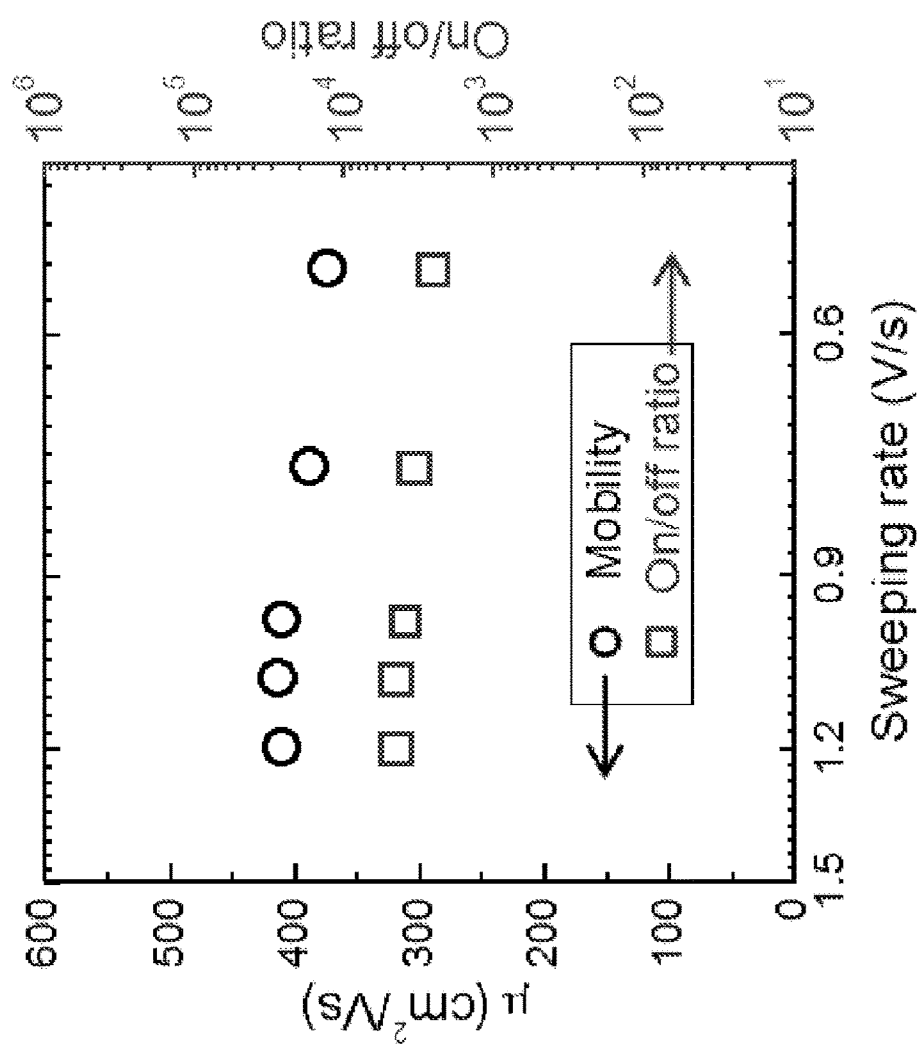

FIG. 10D. μ and on/off ratio values versus sweeping rate of $[Cd_2Se_3]^{2-}$-capped CdSe NC FETs using $ZrO_x$ dielectrics.

Figure 11A:
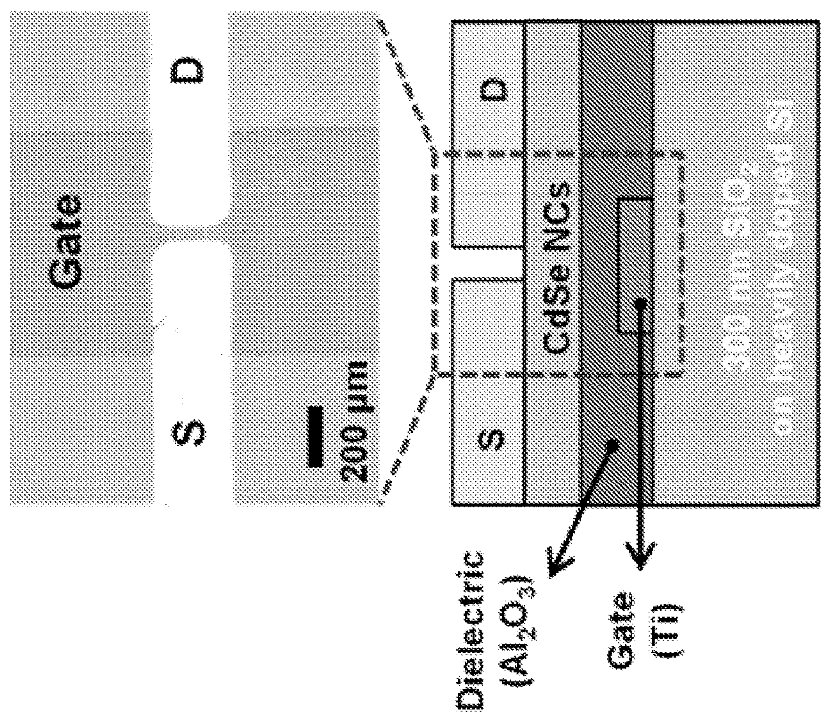

FIG. 11A. (bottom) Schematic device structure of a soldered CdSe NC FET used in switching speed measurements and (top) an optical microscope image showing the top view of the device (W=280 μm and L=50 μm).

Figure 11C:
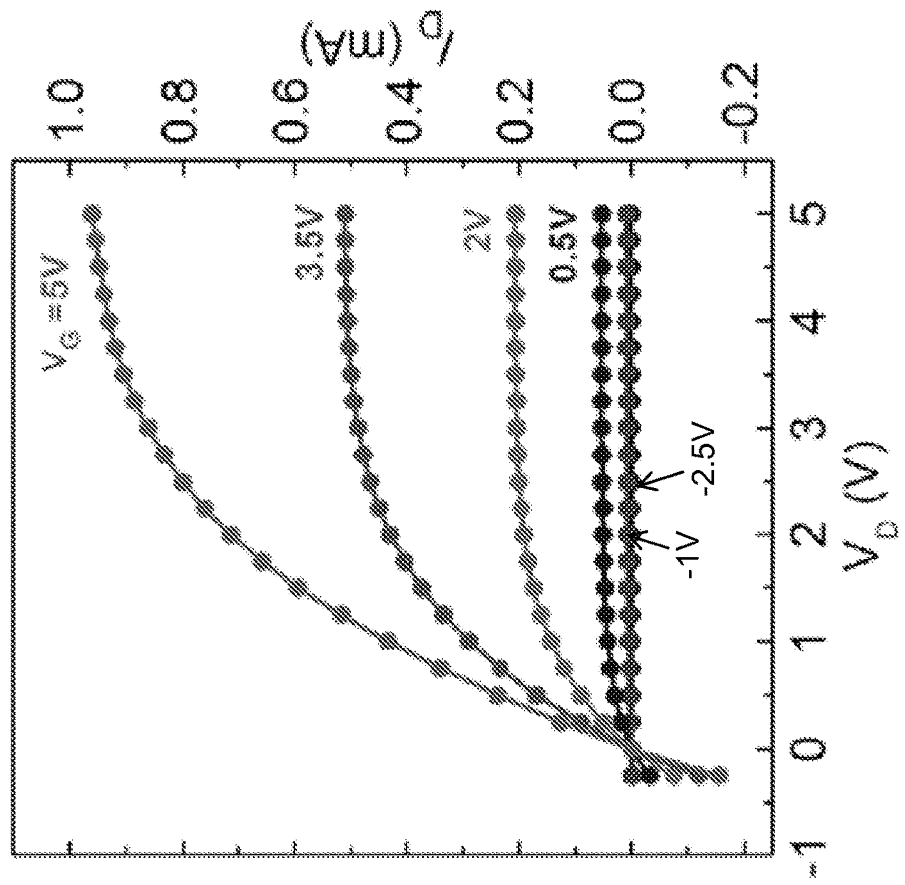
Figure 11B:
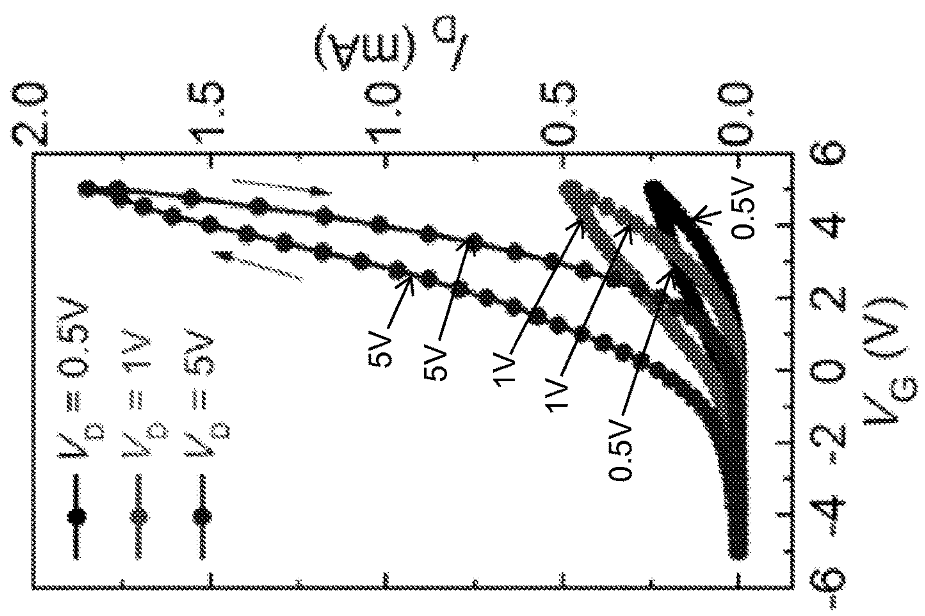

FIG. 11B. Transfer characteristics of the FET shown in FIG. 11A.

FIG. 11C. Output characteristics of the FET shown in FIG. 11A.

Figure 11D:
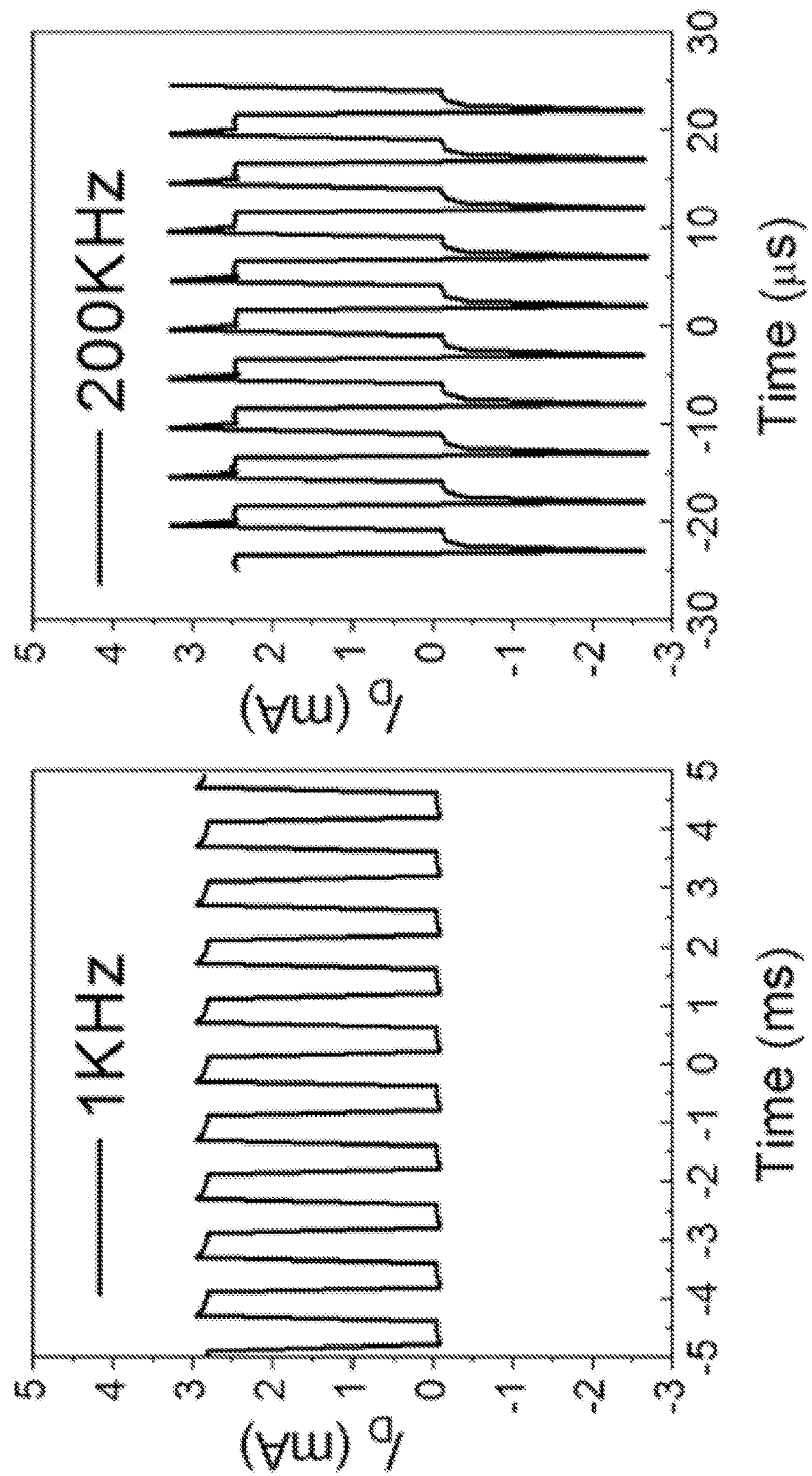

FIG. 11D. Drain current responses to a square wave signal applied to the gate voltage of the FET shown in FIG. 11A, with 1 kHz (left panel) and 200 kHz (right panel) frequencies.

Figure 11E:
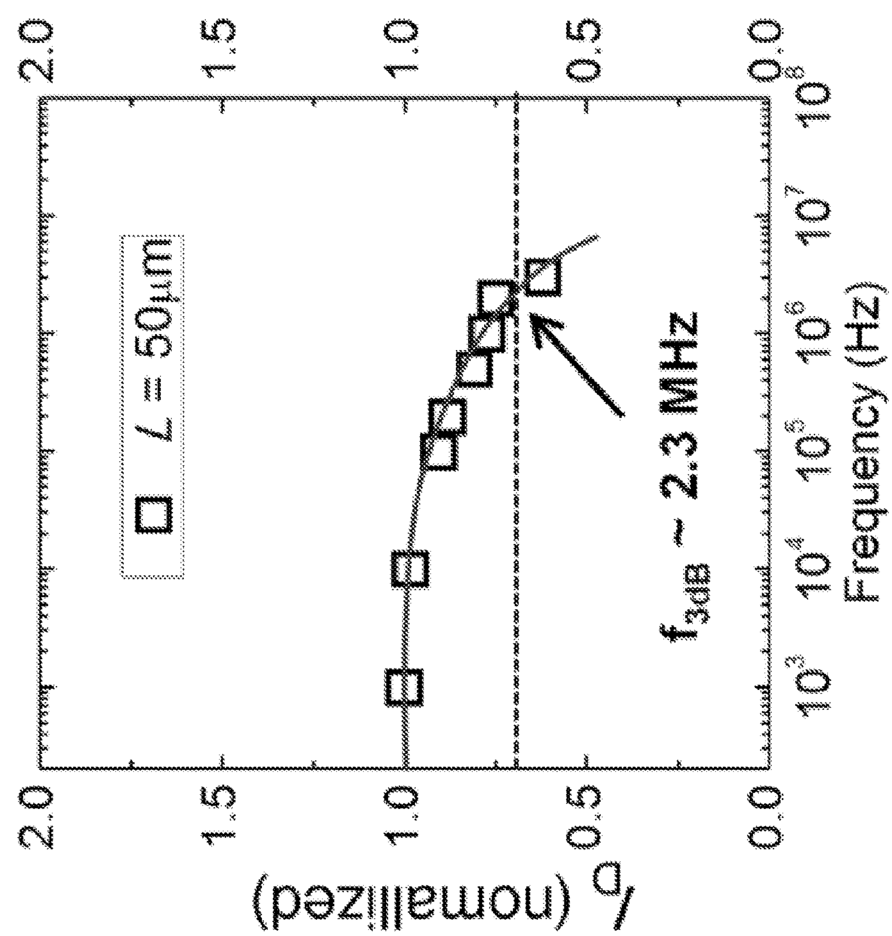

FIG. 11E. Plot of the maximum value of the normalized drain current over the frequency for the FET shown in FIG. 11A. The solid line is a guide to the eye and the dotted line shows the 70% value of the normalized drain current. The $f_{3\ dB}$ was determined at the intersecting point of the two lines.

Figure 12A:
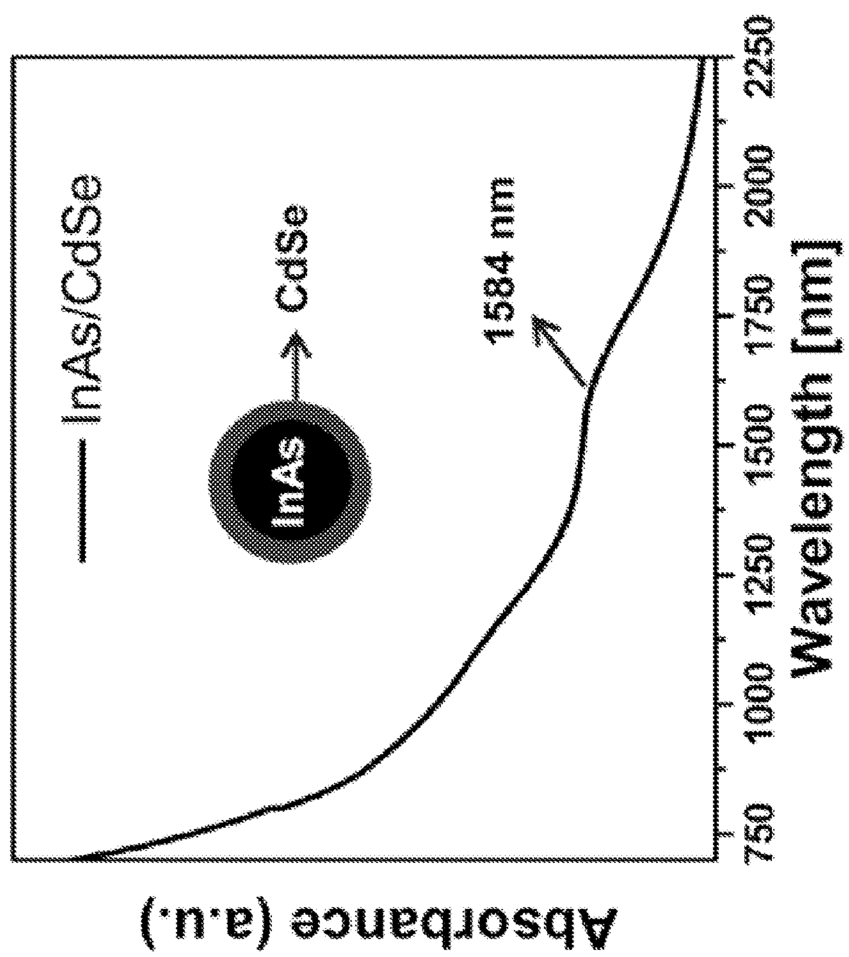

FIG. 12A. Absorption spectrum of organic capped InAs/CdSe core-shell NCs in trichloroethylene.

Figure 12C:
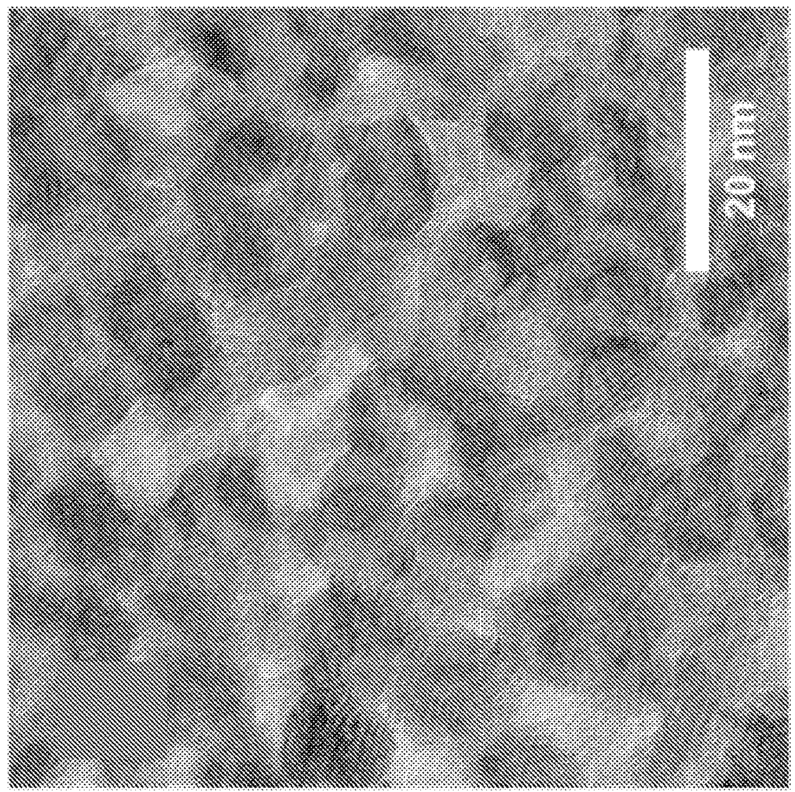
Figure 12B:
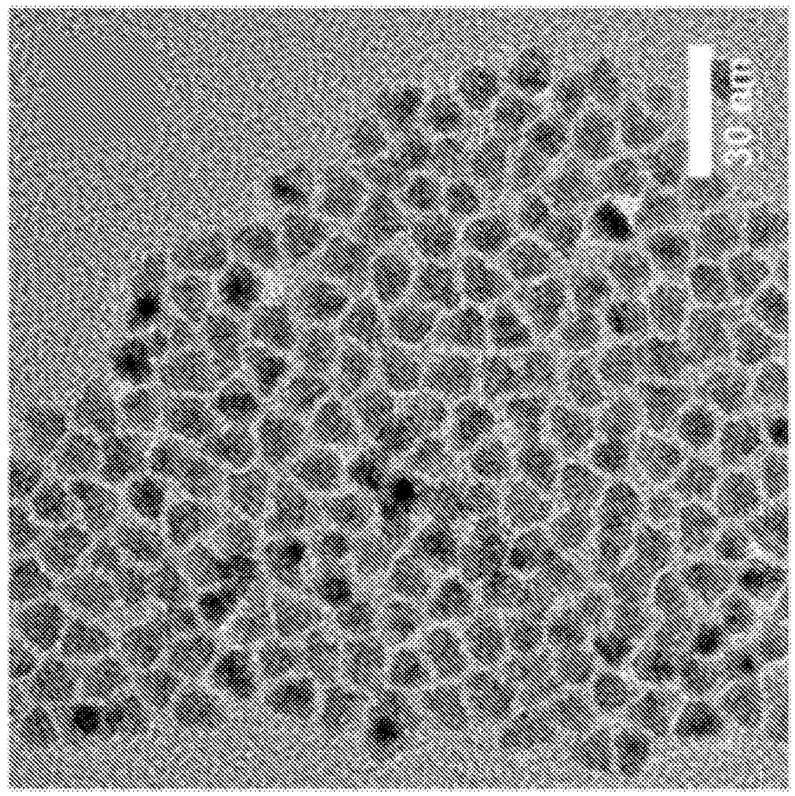

FIG. 12B. TEM image of $[Cd_2Se_3]^{2-}$-capped InAs/CdSe core-shell NCs before annealing.

FIG. 12C. TEM image of $[Cd_2Se_3]^{2-}$-capped InAs/CdSe core-shell NCs after annealing at 300° C. for 30 min.

Figure 12D:
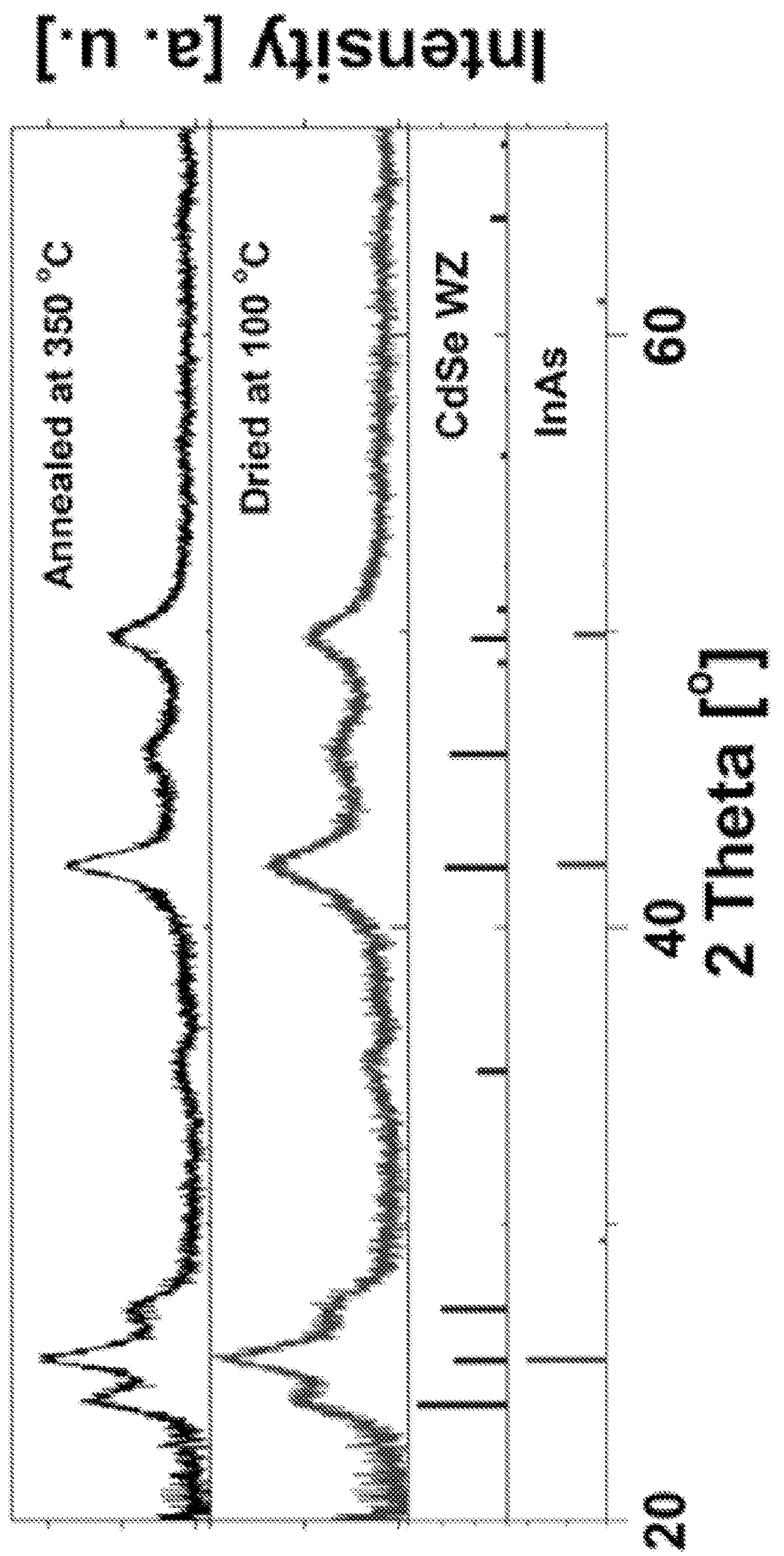

FIG. 12D. Powder XRD patterns of $[Cd_2Se_3]^{2-}$-capped InAs/CdSe core-shell NC thin films after drying at 100° C. and annealing at 300° C. The vertical lines in the bottom panels are the corresponding positions and intensities of x-ray reflections for bulk wurtzite-phase CdSe and InAs, respectively.

Figure 12F:
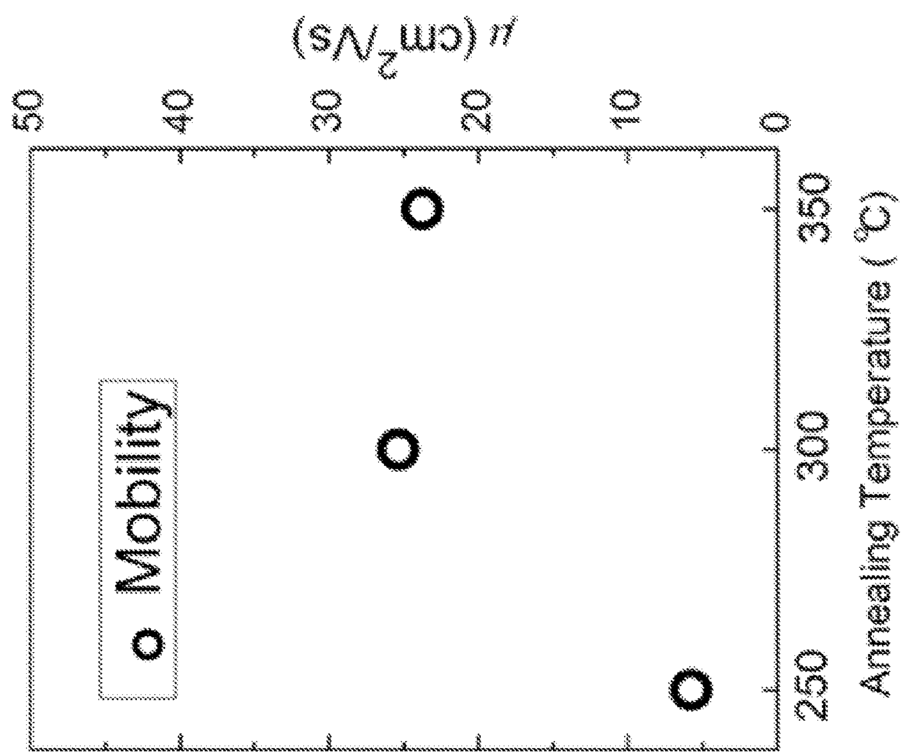
Figure 12E:
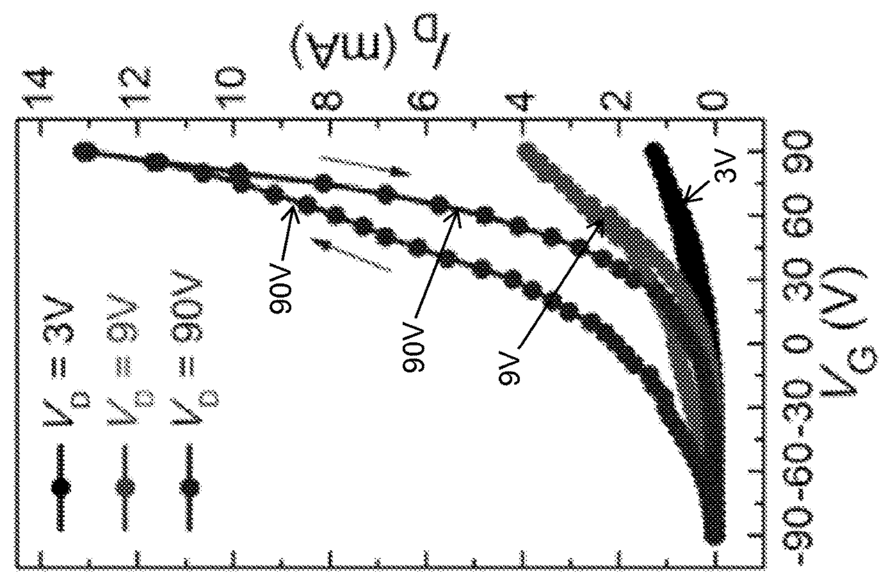

FIG. 12E. Transfer characteristics of $[Cd_2Se_3]^{2-}$-capped InAs/CdSe core-shell NC FETs (W=1500 μm and L=60 μm). The gate dielectric was 300 nm-thick $SiO_2$ and the NCs were annealed at 300° C. for 30 min.

FIG. 12F. Effect of annealing temperature on electron mobility of $[Cd_2Se_3]^{2-}$-capped InAs/CdSe core-shell NC FETs.

Figure 12G:
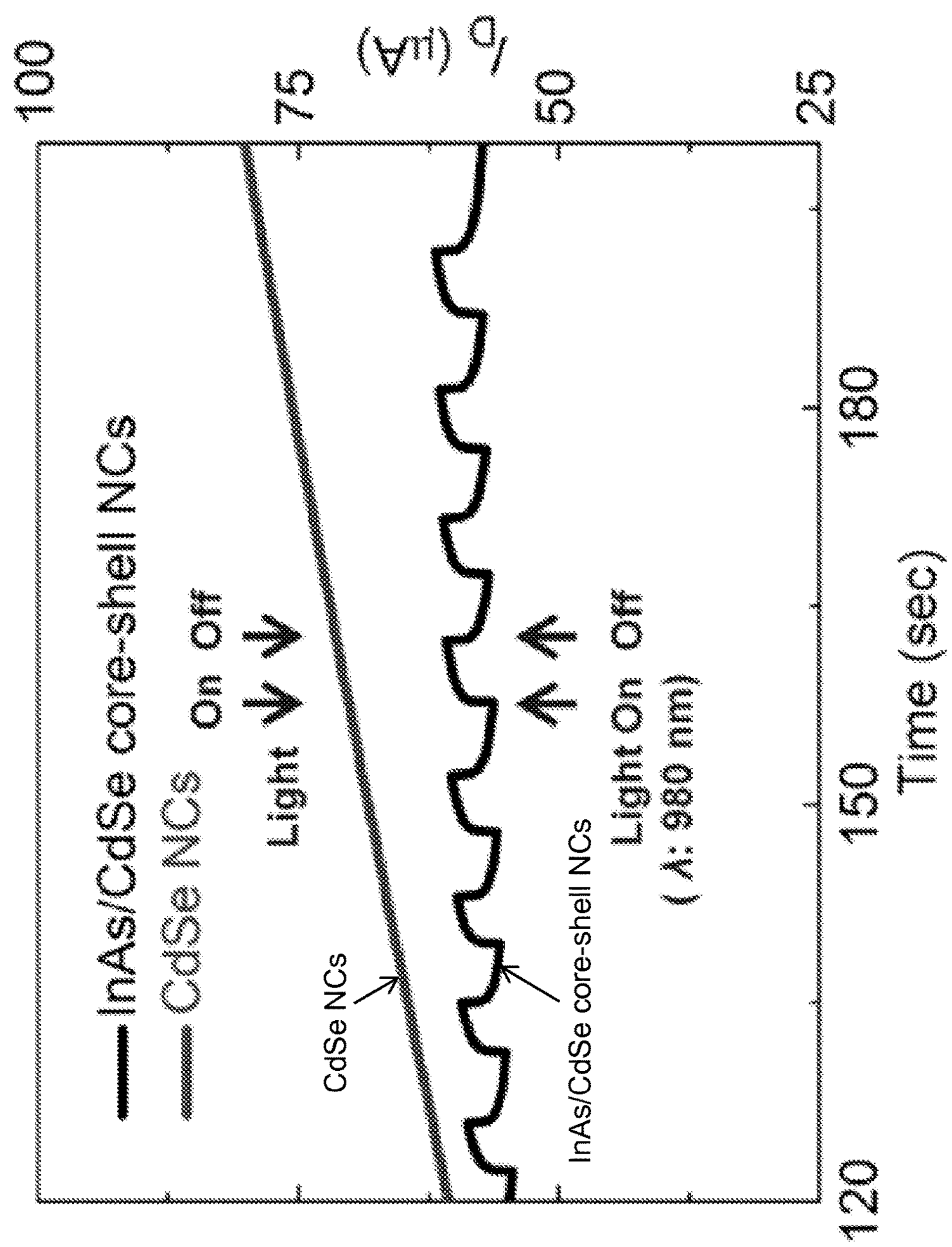

FIG. 12G. Photoresponse of FETs made of $[Cd_2Se_3]^{2-}$-capped InAs/CdSe core-shell NCs and CdSe NCs annealed at 300° C., measured upon illumination with 980 nm light at a $V_G$ of 0V and a $V_D$ of 9V.

Figure 13:
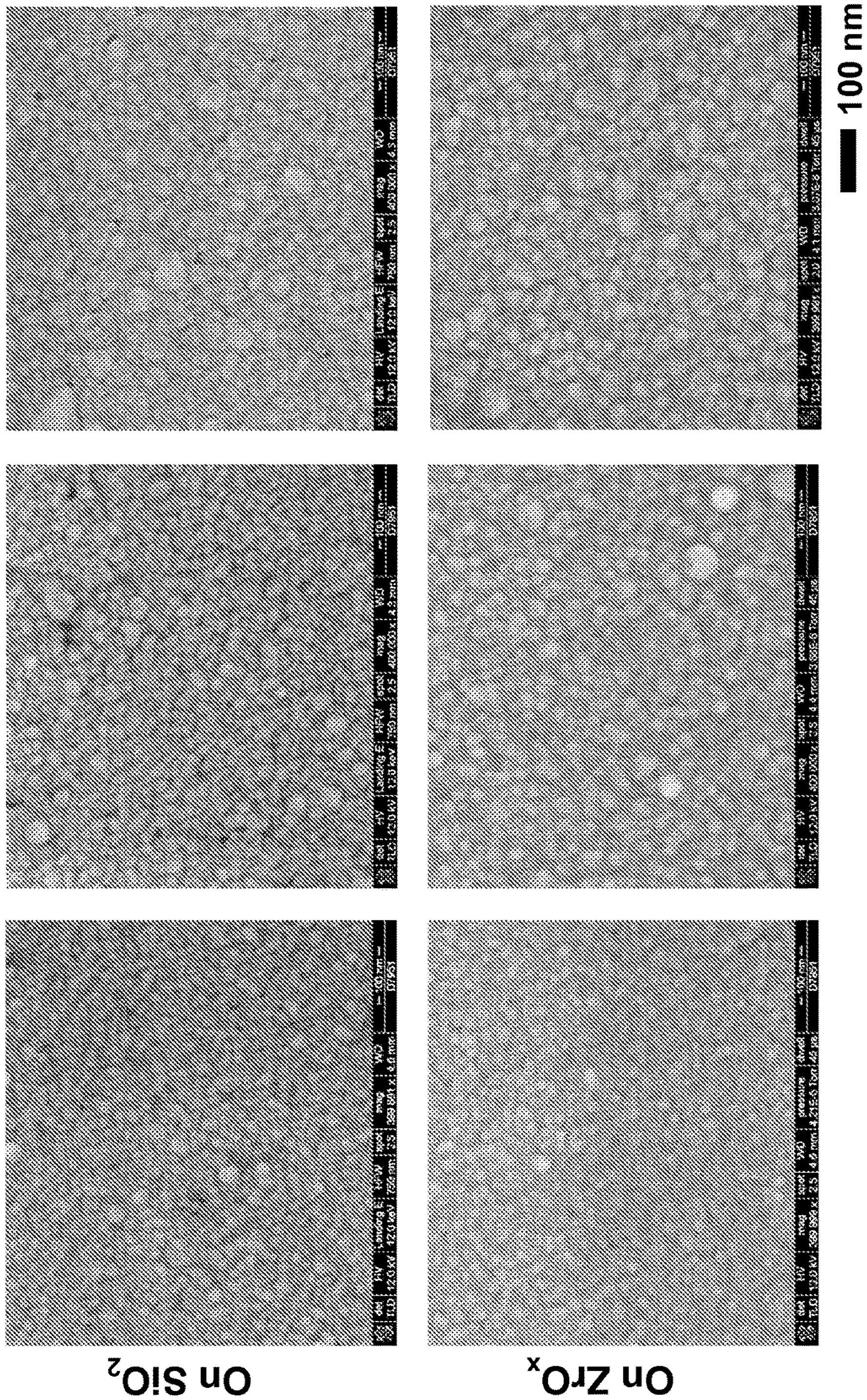

FIG. 13. Top-view SEM images of $[Cd_2Se_3]^{2-}$-capped CdSe NC thin films of on (top row) $SiO_2$ and (bottom row) $ZrO_x$ dielectrics after annealing at (left column) 250° C., (middle column) 300° C., and (right column) 350° C. for 30 min.

DETAILED DESCRIPTION

Chalcogenidometallates of group IIB, IV or V elements and, particularly, chalcogenidometallates of cadmium, lead, and bismuth, are provided. The chalcogenidometallates may comprise ammonium cations, organic cations, or alkali metal cations. Also provided are methods of using the chalcogenidometallates as molecular solders to form thin films, molded objects and bonded surfaces composed of metal chalcogenides. Methods for fabricating field effect transistors that incorporate the metal chalcogenide thin films are also provided.

The chalcogenidometallates can be employed as "solders" for a variety of metal chalcogenides, including cadmium, bismuth and lead-based chalcogenide semiconductors that are widely used in photovoltaic and thermoelectric applications. The chalcogenidometallates are metal chalcogenide precursors, in that they decompose into metal chalcogenides upon mild heat treatment. As a result, the solders can be used to bond crystal surfaces and link nano-, meso- and wafer-scale metal chalcogenide crystals together by combining or coating the crystals with the chalcogenidometallates and then subjecting the chalcogenidometallates to a mild heat treatment, whereby they are converted into metal chalcogenides. In some embodiments, the solders can be used for bonding semiconducting grains and can serve to minimize mobility losses and charge trapping at grain boundaries. In some embodiments, the solders provide multifunctional inorganic linkers that can provide metal chalcogenide materials with high electron mobilities and with enhanced or reduced thermal conductivities (through control over phonon scattering), spin-filtering (through incorporation of spin-polarized linkers), and the ability to self-heal.

The molecular solders include chalcogenidometallates having the formulas: (1) $A_2MCh_2$, where A is K, Na or Cs; M is Cd or Pb; and Ch is Se or Te; (2) $A_2Cd_2Se_3$, where A is K, Na or Cs; (3) $A_4Bi_2Ch_5$, where A is K, Na or Cs and Ch is Te or Se; and (4) $A_6Bi_{0.5}Sb_{1.5}Te_6$, where A is Na, K or Cs. Alternatively, the chalcogenidometallates may comprise a homogenous composition of more than one compound, wherein the stoichiometry of the composition is represented by: (1) $A_2MCh_2$, where A is K, Na or Cs; M is Cd or Pb; and Ch is Se or Te; (2) $A_2Cd_2Se_3$, where A is K, Na or Cs; (3) $A_4Bi_2Ch_5$, where A is K, Na or Cs and Ch is Te or Se; and (4) $A_6Bi_{0.5}Sb_{1.5}Te_6$, where A is Na, K or Cs. In some embodiments the chalcogenidometallates comprise more than one chalcogen. For example, a chalcogenidometallate solder may comprise S and Se, S and Te or Se and Te atoms. After the decomposition of the precursor into its metal chalcogenide and the "soldering" of the metal chalcogenide particles, the alkali metal of the precursor may remain in trace amounts in the final composition as a dopant in the form of, for example, an alkali carbonate, telluride or selenide.

The chalcogenidometallates can be made by reacting an alkali metal chalcogenide with a group IIB, group IV or a group V chalcogenide in a solvent to form an alkali metal-containing chalcogenidometallate of a group IIB, group IV or group V element. Some embodiments of the chalcogenidometallates can be made by reacting an alkali metal chalcogenide with a cadmium, bismuth or lead chalcogenide in a solvent to form an alkali metal-containing chalcogenidometallate of Cd, Bi or Pb. The alkali metal chalcogenide can be a pre-formed compound that is added to the reaction solution. Alternatively, the alkali metal chalcogenide can be formed in situ in a reaction solution by reacting an alkali metal hydride with an elemental chalcogen in a solvent. The in situ-formed alkali metal chalcogenide then goes on to react with the cadmium, bismuth or lead chalcogenide to form the alkali metal-containing chalcogenidometallate in solution. In other methods, the chalcogenidometallates are formed by reacting an alkali metal hydride with an elemental chalcogen and cadmium oxide, bismuth oxide or lead oxide in a solvent.

Optionally, the alkali metal cation of the chalcogenidometallate can be ion exchanged with an organic cation in order to provide a molecular solder with enhanced solubility in a given solvent. For example, the alkali metal cation can be exchanged with an organic cation or an ammonium cation, including an alkylammonium cation, such as didodecyldimethyl ammonium or tetraethyl ammonium. Alternatively, the alkali metal cation can be replaced with a hydrazinium cation. Alternatively, the alkali metal cation can be replaced with a sulfonium ($R_3S^+$) or iodonium ($R_2I^+$) cation, where R represents an alkyl group, an aryl group, or a combination thereof.

The solvents may be polar or non-polar organic solvents. Examples of polar solvents that can be used in the reaction solutions and/or the casting and molding compositions (described below) include hydrazine, acetonitrile, N,N-dimethylformamide, N-methylformamide, dimethyl sulfoxide, and formamide.

The alkali metal-containing chalcogenidometallate can also be converted into a metal chalcogenide gel ("chalcogel") to provide a gel-based solder for film casting, object molding and/or wafer bonding.

One embodiment of a method of forming a film of a metal chalcogenide comprises the steps of: coating a surface of a substrate with a solution comprising metal chalcogenide particles, a compositionally matched metal chalcogenide precursor and a solvent; and annealing the coating under conditions that convert the metal chalcogenide precursor into its metal chalcogenide to provide the metal chalcogenide film. Coating may be carried out by, for example, drop casting or spin coating. Typical annealing temperatures are in the range from about 200° C. to about 400° C., including temperatures in the range from about 250° C. to about 300° C., with annealing times of one hour or less. However, temperatures and times outside of these ranges can also be used. In addition, the conversion of the precursor to its corresponding metal chalcogenide in this method, and the other methods described herein, can be achieved by other means, including optical pumping, electrical heating, or mechanical stimulation. In this method, the metal chalcogenide precursor may be an alkali metal-containing chalcogenidometallate, an organic cation-exchanged chalcogenidometallate or a metal chalcogenide gel formed from an alkali metal-containing chalcogenidometallate. In some embodiments of the methods, the chalcogenidometallate may exchange with organic capping ligands on the surface of the metal chalcogenide particles to provide chalcogenidometallate-capped particles in the solution.

In some embodiments of the methods described herein, the metal chalcogenide precursors take the form of metal particles, such as metal nanoparticles, capped with chalcogenidometallate ligands. Such precursors can be used to form thermoelectric materials in which the thermal and electrical conductivities are decoupled, as is preferred for high thermoelectric efficiency. For example, bismuth nanocrystals capped with $(N_2H_5)_4Sb_2Te_7$ chalcogenidometallate ligands can be used as a solder for micron-size $Bi_xSb_{2-x}Te_3$ particles. These compositionally matched all-inorganic nanocrystals with a low melting point can be used to chemically bond the BiSbTe micro-particles. As will be appreciated by one skilled in the art, depending on the composition of the BiSbTe particles, $(N_2H_5)_4Sb_2Te_7$-capped Bi nanocrystals will either increase or decrease the concentration of majority (hole) carriers near grain boundaries in BiSbTe films made from the precursors. Therefore, the electrical conductivity (σ), the Seebeck coefficient (S), and thermal conductivity (k) can be independently tuned to optimize the thermoelectric figure of merit (ZT). This approach allows the crystalline grain size in the film to be small enough to frustrate phonon transport (low k), while exploiting interfacial chemistry to promote carrier mobility (high σ).

As used here, the phrase "compositionally matched" indicates that the metal chalcogenide precursor converts into the metal chalcogenide of the particles upon heat treatment. For example, CdSe nanocrystals with $Na_2Cd_2Se_3$ "solder" can be used to form CdSe films.

The resulting films may be continuous, polycrystalline films and may be characterized by high electron mobilities. For example, some embodiments of the films have electron mobilities of at least 300 $cm^2/Vs$. Methods for measuring electron mobilities are described in the examples below.

In addition to films, the metal chalcogenide precursor solders can be used to mold three-dimensional objects of metal chalcogenides. Combining small amounts (for example, 10 wt. % or less) of the metal chalcogenide precursors with metal chalcogenide particles provides a composite that can be cast in a mold at atmospheric pressure, without the need to apply additional external pressure or extreme temperatures. One embodiment of a method for molding a three-dimensional object of a metal chalcogenide comprises the steps of: filling a mold with a solution comprising metal chalcogenide particles, a compositionally matched metal chalcogenide precursor and a solvent; evaporating excess solvent to provide a dried composite; and annealing the dried composite to form the molded three-dimensional object of the metal chalcogenide.

The metal chalcogenide particles used to cast films and objects may be, for example, nanoscale particles or mesoscale particles. The particles may be nanoparticles made using bottom-up growth techniques, such as colloidal growth. Such particles typically have sizes of about 40 nm or less (e.g., about 10 nm or less). The particles may also be larger particles made by top-down techniques, such as by grinding and milling macroscale materials. Such particles may have sizes in the range from about 40 nm to about 1000 nm or greater. The particles may be, for example, particles of binary, ternary, or quaternary chalcogenides of a group IIB, group IV, or group V element, such as cadmium, bismuth, lead, zinc, mercury, antimony, tin, and germanium. Specific examples of these include CdS, CdSe, CdTe, $Hg_xCd_{1-x}Te$, PbS, PbSe, PbTe, $(Bi_xSb_{1-x})_2Te_3$, $Bi_2Te_3$ and $(Bi_xSb_{1-x})_2(Te_{1-x}Se_x)_3$ where $0<x<1$.

In some embodiments, the metal chalcogenide particles are core-shell particles comprising a core of a first material encapsulated by a shell comprising a metal chalcogenide. In these embodiments, the metal chalcogenide precursor solders are compositionally matched with the metal chalcogenide of the shell. The core material may be, but need not be, a metal chalcogenide. For example, the core may comprise a group IV semiconductor, such as Si, Ge or SiGe alloys; a group III-V semiconductor, such as alloys of Al, In and/or Ga with N, P, As and/or Sb (e.g., InN, InP, InAs or GaAs); or a group II-VI semiconductor. In some embodiments, the core material is a photoactive material that absorbs incident radiation, such as infrared radiation, and generates charge carriers, which can be transported by the metal chalcogenide in thin films made from the core-shell particles.

Typically, the amount of metal chalcogenide precursor in the solutions used to cast films and objects is the range from about 1 to about 30 weight percent (wt. %), based on the total weight of the metal chalcogenide precursor and the metal chalcogenide particles. This includes embodiments in which the solutions comprise about 5 to about 25 wt. % metal chalcogenide precursor, based on the total weight of the metal chalcogenide precursor and the metal chalcogenide particles. However, amounts outside of these ranges can also be used.

In another application, the metal chalcogenide precursor solders are used to bond together the surfaces of macroscale metal chalcogenide objects, such as metal chalcogenide wafers. The objects and wafers can comprise polycrystalline metal chalcogenides or single-crystalline metal chalcogenides. One embodiment of a method of bonding metal chalcogenide wafers together comprises the steps of: coating the surface of a first metal chalcogenide wafer with a solution comprising a compositionally matched metal chalcogenide precursor and a solvent; contacting a surface of a second metal chalcogenide wafer with the coated surface of the first metal chalcogenide wafer; and annealing the coating to bond the second metal chalcogenide wafer to the first metal chalcogenide wafer. As used here, the phrase "compositionally matched" indicates that the metal chalcogenide precursor converts into the metal chalcogenide of the bonded objects upon heat treatment. The objects may be, for example, objects of binary or ternary cadmium, bismuth or lead chalcogenides, examples of which include CdSe, CdTe, $Hg_xCd_{1-x}Te$, PbTe, $(Bi_xSb_{1-x})_2Te_3$ and $Bi_2Te_3$.

In another application, solutions comprising the metal chalcogenide particles and metal chalcogenide precursor solders are used to create patterns or objects by two dimensional (2D) or three dimensional (3D) printing, or additive manufacturing. Examples of additive manufacturing techniques are described in International Patent Application PCT/US2013/043664, U.S. patent application Ser. Nos. 13/748,568, 14/112,252, and U.S. Pat. Nos. 6,375,874, 6,416,850, and 7,706,909, all of which are incorporated by reference herein in their entirety. For example, in one embodiment of a method for printing a 2D or 3D object a solution comprising metal chalcogenide particles, a compositionally matched metal chalcogenide precursor and a solvent is dispensed onto a substrate through one or more nozzles in the printhead of a printer and then the printed solution is annealed to convert the metal chalcogenide precursor into its metal chalcogenide. In some embodiments, laser beams can be used for local heating of coatings comprising the metal chalcogenide particles and metal chalcogenide precursors to generate 2D patterns and 3D shapes of the metal chalcogenides. In certain embodiments, mild selective laser heating for the local "soldering" can be used for pattern generation and irreversible binding of nano- or microscopic metal chalcogenide grains. In other embodiments, optical excitation of the molecular solder triggers chemical reactions, resulting in irreversible binding of nano- or mesoscopic-sized metal chalcogenide grains. Unexposed material will typically retain its soluble, slurry or powder nature for easy removal. In certain embodiments, approximately micron-scale lateral resolution and sub-micron-scale vertical resolution can be achieved. Certain embodiments of printable inorganic metal chalcogenides can be used in sensors, electronics, and thermoelectrics. For example, 2D or 3D printed metal chalcogenides can be used in light detectors (e.g., IR focal plane arrays), and thermoelectric devices.

Materials suitable for additive manufacturing include, but are not limited to, particles of inorganic semiconductors (e.g., II-VI semiconductors such as CdSe, CdTe, IV-VI semiconductors such as PbS, PbSe, PbTe, and III-V semiconductors such as InP, InAs, and GaAs) held together with the present compositionally matched solders. Typical examples include: $(N_2H_5)_2In_2Se_4$, which cleanly decomposes into $In_2Se_3$ above 250° C.; and $(N_2H_5)_2CdTe_2$, $(N_2H_5)_4Bi_2Te_5$, and $Na_2PbTe_2$, which form CdTe, $Bi_2Te_3$ and PbTe, respectively, upon heating. These precursors can be thermally converted to a semiconducting phase to provide connectivity between nano- or micro-grains, generating materials with high electron mobility. In the last example, $Na^+$ ions can be used to provide p-type doping to the PbTe host.

The high electron mobilities of the metal chalcogenide thin films renders them suitable for use as conducting channels in field effect transistors (FET). Thus, in some embodiments of the methods for forming films comprising metal chalcogenides, the substrate onto which the film-forming solution is coated is a layer of a gate dielectric material, such as zinc oxide, silicon oxide or aluminum oxide. After the coated substrate has been annealed to form a film of the metal chalcogenide, the metal chalcogenide film and gate dielectric can be incorporated into an FET as the channel and gate dielectric, respectively.

One embodiment of an FET incorporating a metal chalcogenide channel comprises: a substrate; an active layer comprising grains of CdSe and defining a source region, a channel region and a drain region; a gate dielectric layer on the active region; a gate electrode on the gate dielectric layer; a source electrode in electrical communication with the source region; and a drain electrode in electrical communication with the drain region. In some embodiments of the FETs, the metal chalcogenide comprises CdSe and the gate dielectric comprises zinc oxide. As illustrated in the examples that follow, the FETs can have very high carrier mobilities, including carrier mobilities greater than 200 $cm^2/Vs$, greater than 300 $cm^2/Vs$, and greater than 400 $cm^2/Vs$. In addition, the FET can provide fast switching. For example, some embodiments of the FETs exhibit switching with a −3 dB frequency of at least 2 MHz.

Embodiments of methods of making metal chalcogenide thin films are illustrated in the examples that follow and also in: Jang et al., *Nano Lett.,* 2015, 15 (10), pp 6309-6317; and Dolzhnikov et al., *Science,* 2015: 347 (6220) pp. 425-428, the disclosures of which are incorporated herein by reference.

EXAMPLE 1

This example illustrates the design of chalcogenidometallate "solders" for technologically important II-VI, IV-VI and V-VI semiconductors, including CdSe, CdTe, $Hg_xCd_{1-x}Te$, PbTe, $(Bi_xSb_{1-x})_2Te_3$ and $Bi_2Te_3$, which are widely used in photovoltaics, thermoelectrics, etc.

The use of chalcogenidometallates as soluble precursors for inorganic semiconductors was first introduced by Mitzi et al., who utilized the ability of $N_2H_4$ to dissolve metal chalcogenides in the presence of elemental chalcogens, forming soluble hydrazinium chalcogenidometallates. (See, D. B. Mitzi, L. L. Kosbar, C. E. Murray, M. Copel, A. Afzali, High-Mobility Ultrathin Semiconducting Films Prepared by Spin Coating. *Nature* 428, 299-303 (2004).) These species cleanly decompose back into semiconducting metal chalcogenides upon heating. This simple approach works very well for the chalcogenides of Cu, Ga, Ge, In, Sb, Sn, and mixed phases like $Cu(In_{1-x}Ga_x)Se_2$ and $Cu_2ZnSn(S,Se)_4$, but showed no success for Cd-, Pb- and Bi-chalcogenides, which are among the most widely used binary and ternary semiconductors. (See, D. B. Mitzi, Solution Processing of Chalcogenide Semiconductors via Dimensional Reduction. *Adv. Mater.* 21, 3141-3158 (2009); D. B. Mitzi et al., A High-Efficiency Solution-Deposited Thin-Film Photovoltaic Device. *Adv. Mater.* 20, 3657-3662 (2008); T. K. Todorov, K. B. Reuter, D. Mitzi, B., Photovoltaic Devices: High-Efficiency Solar Cell with Earth-Abundant Liquid-Processed Absorber. *Adv. Mater.* 22, E156-E159 (2010); R. Y. Wang et al., Universal and Solution-Processable Precursor to Bismuth Chalcogenide Thermoelectrics. *Chem. Mater.* 22, 1943-1945 (2010); and D. H. Webber, R. L. Brutchey, Alkahest for $V_2VI_3$ Chalcogenides: Dissolution of Nine Bulk Semiconductors in a Diamine-Dithiol Solvent Mixture. *J. Am. Chem. Soc.* 135, 15722-15725 (2013).) Here is proposed the origin of this limitation and a general solution, which substantially expands the list of solution-processed semiconductors.

In the above process, the formation of a soluble chalcogenidometallate begins with the reduction of an elemental chalcogen (Ch═S, Se or Te) by $N_2H_4$ following the equation (1)

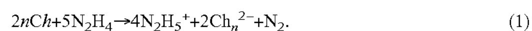

$$2nCh+5N_2H_4 \rightarrow 4N_2H_5^+ + 2Ch_n^{2-} + N_2. \quad (1)$$

The $Ch_n^{2-}$ reacts with electron deficient metal centers at the surface of a solid metal chalcogenide ($M_xCh_y$), generating soluble $M_xCh_{(y+m)}^{2m-}$ chalcogenidometallate ions:

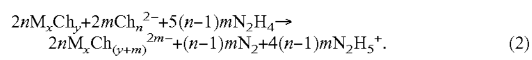

$$2nM_xCh_y + 2mCh_n^{2-} + 5(n-1)mN_2H_4 \rightarrow 2nM_xCh_{(y+m)}^{2m-} + (n-1)mN_2 + 4(n-1)mN_2H_5^+. \quad (2)$$

The progression of reaction (2) is determined by the balance between the lattice energy of the metal chalcogenide and the free energy of formation and solvation of the chalcogenidometallate complex. Reactivity of $Ch_n^{2-}$ is highest at n=1 and significantly decreases as n increases. The reducing potential of $N_2H_4$ in reaction (1) is not sufficient to bring Se and Te into their most reactive $Ch^{2-}$ state. XANES measurements show that reaction (1) generates soluble Se or Te species with an oxidation state close to zero, equivalent to large n.

In this example, $A_2Se$ or $A_2Te$ (A=Na, K and Cs) was used instead of elemental chalcogens to increase the driving force for reaction (2) and it was found that for n=1, reaction (2) proceeds smoothly for a number of metal chalcogenides previously considered unreactive, including CdSe, CdTe, PbS, PbSe, PbTe, $Bi_2S_3$, $Bi_2Se_3$, $Bi_2Te_3$, $(Bi_xSb_{1-x})_2Te_3$, and others. These reactions can also be conveniently carried out in one pot, e.g., by adding alkali metal hydride to the stoichiometric mixture of CdTe and Te in $N_2H_4$: CdTe+Te+2NaH→$Na_2CdTe_2$+gaseous products.

Figure 1A:
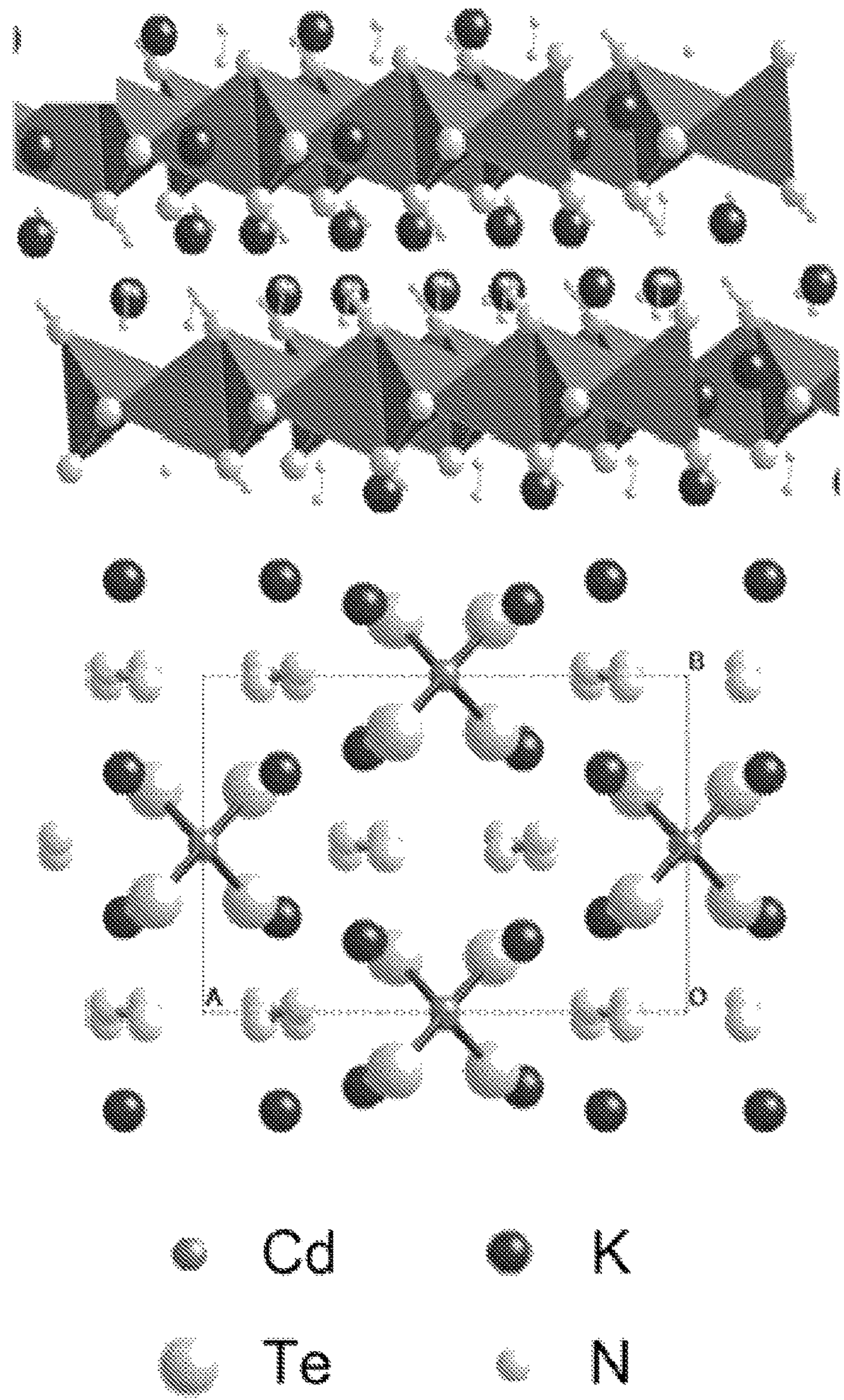
FIG. 1A. Crystal structure of $K_2CdTe_2.2N_2H_4$ determined using single crystal X-ray diffraction. Hydrogen atoms are not shown for clarity.

FIG. 1A shows the structure of $K_2CdTe_2.2N_2H_4$ crystallized from the reaction mixture. It contains molecular chains built of edge-sharing, slightly-distorted [$CdTe_4$] tetrahedrons with Te—Cd—Te angles of 99.4 and 119.1 degrees.

Figure 1B:
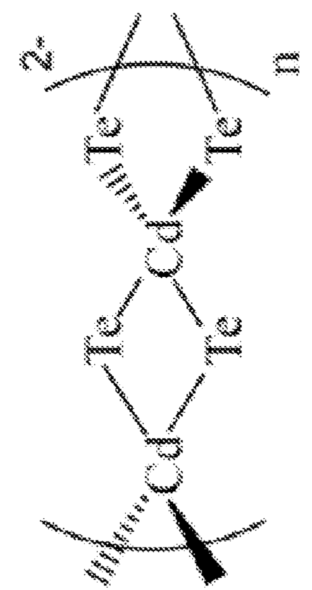
FIG. 1B. Depending on solvent polarity and coordinating ability, $[CdTe_2^{2-}]_\infty$ can exist in two equilibrium forms.
Figure 1B:
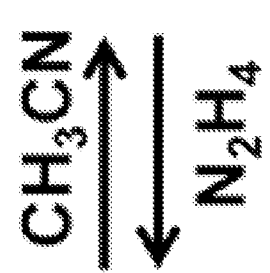
Figure 1B:
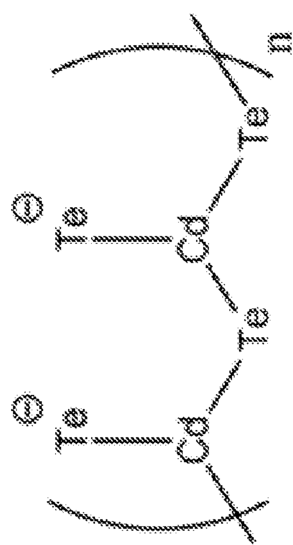

The bonds between Cd and Te are 2.81 Å and 2.83 Å, which are similar to the bond length of zinc blende CdTe (2.81 Å). To the best of the inventors' knowledge, this structural motif with one-dimensional "molecular wires" has not been reported for chalcogenidocadmates. In the crystal lattice, $[CdTe_2^{2-}]_\infty$ chains are separated with $N_2H_4$ molecules, which leads to the facile solubility of the compound in various solvents, e.g., up to 600 mg/mL in $N_2H_4$ (FIG. 1B). The solubility of ditellurometallates can be further tailored by cation exchange. For example, $Na^+$ or $K^+$ can be exchanged for alkylammonium cations such as didodecyldimethyl ammonium ($DDA^+$) or tetraethyl ammonium ($NEt_4^+$), providing good solubility of $DDA_2CdTe_2$ in toluene, and of $(NEt_4)_2CdTe_2$ in acetonitrile ($CH_3CN$) or N,N-dimethylfomamide (DMF), respectively (FIG. 1B). Exchange of $K^+$ with hydrazinium cations can be used to facilitate thermal decomposition of the resulting hydrazinium salts.

The X-ray diffraction and EXAFS studies of ditellurocadmates provided evidence that, in solution, $[CdTe_2^{2-}]_\infty$ chains can exist in the equilibrium forms outlined in FIG. 1C. In a strongly coordinating solvent like $N_2H_4$, the equilibrium shifts toward the $[CdTe(\mu\text{-}Te)]_n^{2n-}$ structure where each Cd atom has 3 Te neighbors and Te has, on average, 1.5 Cd atoms in the first coordination shell. On the other hand, weakly coordinating solvents like $CH_3CN$ shift the equilibrium toward the structure with two bridging Te atoms per $[CdTe_2]^{2-}$ unit. These variations in coordination environment were reflected by fully reversible shifts of the absorption bands in mixtures of $N_2H_4$ and $CH_3CN$ with $N_2H_4$:$CH_3CN$ solvent volume ratios of 80:20, 60:40, 40:60, and 20:80.

Reacting $Na_2CdTe_2$ with a stoichiometric amount of $CdCl_2$ in $N_2H_4$ resulted in the formation of an air-stable white amorphous gel, further referred to as "CdTe-gel" (FIG. 1B), which is an important addition to the chalcogel family. The gel can be easily separated from NaCl byproduct by centrifugation and can be redispersed in N-methylformamide (NMF) or $N_2H_4$, forming a stable gel of $[CdTe_2]^{2-}$ polyions cross-linked with $Cd^{2+}$. Upon heating above 250° C., the CdTe-gel transformed into crystalline CdTe.

$[CdTe_2^{2-}]_\infty$ ions, similar to other chalcogenidometallates, can be used as capping ligands for colloidal nanocrystals (NCs). $[CdTe_2]^{2-}$-capped CdTe quantum dots showed bright band-edge photoluminescence. The presence of strong emission after the ligand exchange suggests that $[CdTe_2]^{2-}$ ions did not introduce fast recombination centers at the CdTe surface.

Figure 2A:
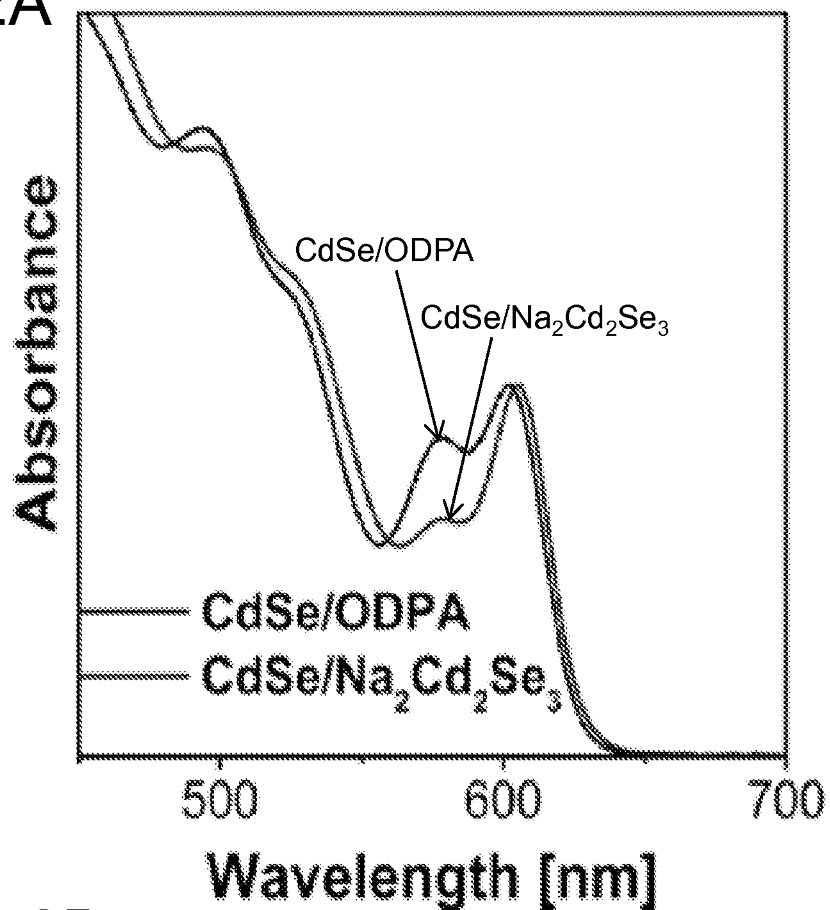
FIG. 2A. Absorption spectra of 4.7 nm CdSe NCs capped with n-octadecylphosphonic acid (ODPA) and $[Cd_2Se_3]^{2-}$ ligands.
Figure 2B:
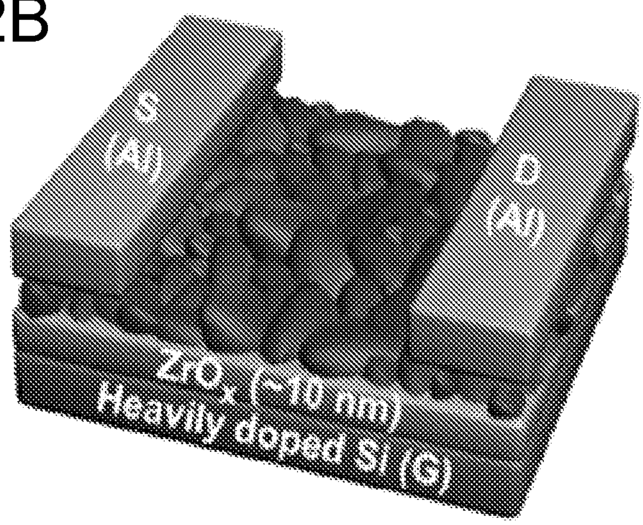
FIG. 2B. Scheme of an FET device with a 10 nm $ZrO_2$ gate dielectric and Al source and drain electrodes.
Figures 2C, 2D:
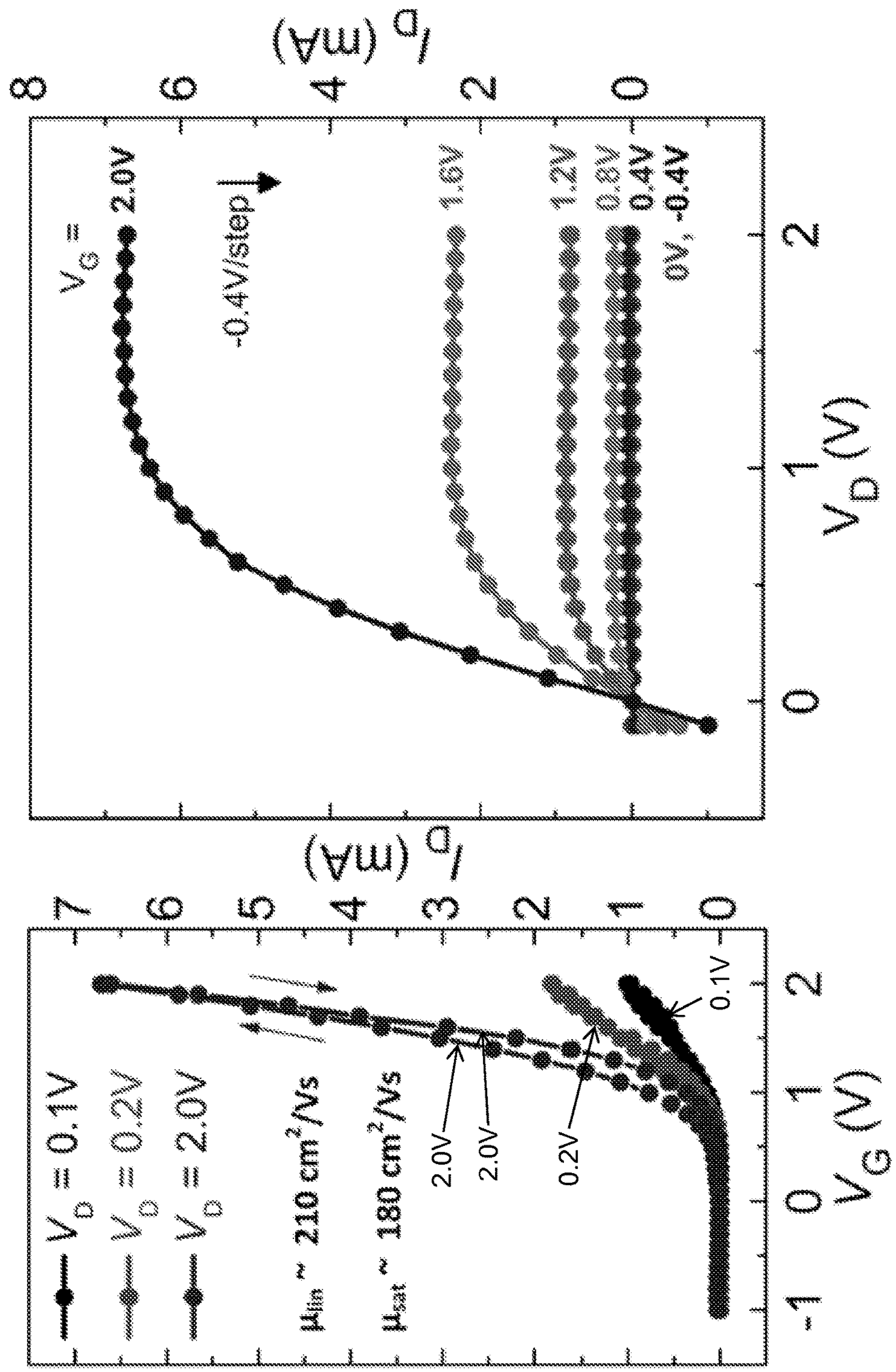
FIG. 2C. Transfer characteristics of the FET device of FIG. 2B.
FIG. 2D: Output characteristics of an FET with a channel made of spin-coated 4.7 nm $[Cd_2Se_3]^{2-}$-capped CdSe NCs annealed at 250° C. for 30 min. FET channel width and length are 1500 μm and 30 μm, respectively.

Following similar approaches, a series of new soluble Cd-, Pb-, and Bi-chalcogenidometallates and chalcogels were synthesized and characterized. These chalcogenidometallates can be dispersed in solvents, including polar solvents, such as $N_2H_4$, ethylenediamine, NMF, dimethyl sulfoxide (DMSO), formamide (FA), DMF, and $N_2H_4$/water mixtures. Such chemical versatility allows for the design of compositionally matched "solders" for practical semiconductors. These solders can be used in various capacities, e.g., to consolidate nano- or mesoscopic grains, or to bond single-crystal wafers. In one example, $Na_2Cd_2Se_3$ solder was applied to CdSe NCs: colloidal 4.7 nm CdSe NCs capped with n-ctadecylphosphonic acid (ODPA) were ligand-exchanged with $[Cd_2Se_3]^{2-}$ ions. A stable colloidal solution of $[Cd_2Se_3]^{2-}$-capped CdSe NCs was obtained, which preserved the original quantum dot excitonic features, with a small red shift of the first absorption peak (FIG. 2A). This shift is likely due to the expansion of wavefunctions into the compositionally-matched ligand shell. The solution of $[Cd_2Se_3]^{2-}$-capped CdSe NCs was spin-coated on heavily doped Si substrates with a ~10 nm thick $ZrO_x$ gate dielectric, and annealed under nitrogen at various temperatures for 30 min. Mobility measurements were carried out using standard field-effect transistor (FET) geometry (FIG. 2B). (See, D. V. Talapin, C. B. Murray, PbSe Nanocrystal Solids for n- and p-Channel Thin Film Field-Effect Transistors. *Science* 310, 86-89 (2005) and D. S. Chung et al., Low Voltage, Hysteresis Free, and High Mobility Transistors from All-Inorganic Colloidal Nanocrystals. *Nano Lett.* 12, 1813-1820 (2012).) Even 250° C. annealing was sufficient to achieve excellent output and transfer characteristics (FIGS. 2C-D) with an electron mobility of 210 $cm^2$/Vs, which is believed to be the record value for any solution-processed inorganic semiconductor. Annealing NC films at 300° C. results in devices with FET mobility above 300 $cm^2$/Vs (FIG. 4A and FIG. 4B). In control experiments, it was found that FETs with channels made of pure CdSe NCs, $Na_2Cd_2Se_3$ or $(N_2H_5)_2Cd_2Se_3$ showed mobilities less than 4 $cm^2$/Vs.

In recent years, various organic and inorganic ligands (1,4-phenylenediamine, $In_2Se_4^{2-}$, $SCN^-$, etc.) have been used as "electronic linkers" for CdSe NCs. The highest reported FET mobilities of annealed CdSe NC samples were on the order of 35 $cm^2$/Vs, which is about 5% of the mobility of CdSe single crystals at 300 K. (S. S. Devlin, *Physics and Chemistry of II-VI Compounds*. (North Holland, Amsterdam, 1967.) In the present case, $Cd_2Se_3^{2-}$ ions worked as a compositionally-matched "solder" that improved carrier transport up to almost half of the single-crystal value, which is surprising given that the Scherrer size of CdSe grains was about 15 nm and 22 nm for samples annealed at 250° C. and 300° C., respectively. This grain size was also confirmed by TEM measurements of annealed films. Studies have shown that simply increasing CdSe grain size does not improve FET mobility. Therefore, this high mobility is attributed to exceptional transparency of the grain boundaries, which do not introduce significant transport bottlenecks.

The molecular "solders" can function not only for nano-, but also for mesoscale grains. For example, PbTe, $Bi_2Te_3$ or CdTe films can be obtained by "soldering" micro-articles, obtained by ball-milling of ingots, using $Na_2PbTe_2$, $(N_2H_5)_4Bi_2Te_5$ or CdTe-gel as solders, respectively (FIGS. 3B-D and FIGS. 5A-C). In the first case, the sodium salt was applied because $Na^+$ is a commonly used p-type dopant for PbTe. A suspension of PbTe micro-particles with a small amount (2-5 wt. %) of $Na_2PbTe_2$ solder was drop-cast on a hydrophilized glass substrate and annealed at 500° C. for 30 min, resulting in a continuous thin film with a uniform thickness of ~7 μm with well-connected dense grains (FIG. 3B). The film exhibited a Hall mobility of 58 $cm^2$/Vs, which is comparable to that (~100 $cm^2$/Vs) of optimized Na-doped PbTe thermoelectric pellets made at a similar temperature by spark-plasma sintering or hot pressing. (See, S. N. Girard et al., High Performance Na-doped PbTe—PbS Thermoelectric Materials: Electronic Density of States Modification and Shape-Controlled Nanostructures, *J. Am. Chem. Soc.* 133, 16588-16597 (2011) and K. Biswas et al., High-Performance Bulk Thermoelectrics with All-Scale Hierarchical Architectures, *Nature* 489, 414-418 (2012).) In control experiments, no continuous films were obtained from suspensions of PbTe and other micro-particles without addition of solder. After annealing under identical conditions, the material remained powdery (e.g., FIG. 3A). The above examples show that chalcogenidometallates and chalcogels, mixed with nano- and micro-particles, offer a viable path toward solution processing of thin-film semiconductors.

The solder effect can be applied to consolidate micro-particles (PbTe, $Bi_2Te_3$, $Bi_{0.5}Sb_{1.5}Te_3$, CdTe, etc.) into three-dimensional blocks cast using a mold (FIG. 3E). The addition of few weight percent of molecular or gel "solder" helps to connect the micro-particles and allows the casting of solid pellets using graphite molds with no external pressure, similar to molding metal particles. Disk-, triangle-, square-, and bar-shaped blocks were obtained via annealing various combinations of nano- and micro-particles (PbTe, $Bi_2Te_3$, $Bi_{0.5}Sb_{1.5}Te_3$, CdTe) with corresponding compositionally-matched molecular chalcogenidometallates or chalcogels. In control experiments without solders, the micro-particles molded under the same conditions remained powdery. To the best of the inventors' knowledge, this is the first example of casting three-dimensional metal chalcogenide semiconductors from particles without applying external pressure or extreme temperatures. Comparison of FIGS. 3A and 3B show that the addition of molecular "solder" facilitates sintering and grain growth compared to pure components.

Chalcogenidometallate solders can be used for bonding metal chalcogenide crystals under modest pressures and temperatures. FIG. 3F shows an example where two polished (111) CdTe surfaces are bonded at ~0.5 MPa and 500° C. using a minuscule amount of $Na_2CdTe_2$ solution in $N_2H_4$. No physical bonding between CdTe crystals occurred in control experiments with similarly prepared crystal surfaces but no "solder".

Materials and Methods:

I. Chemicals and Materials.

CdTe (powder, 99.99% trace metal basis), CdSe (powder, 99.99% trace metal basis), CdO (powder, ≥99.99%) didodecyldimethylammonium bromide (DDAB, powder, 98%), $Bi_2Se_3$ (granular, 99.999% trace metal basis), $Bi_2Te_3$ (beads, 99.99% trace metal basis), $Bi_{0.5}Sb_{1.5}Te_3$ (beads, 99.99% trace metal basis), sodium (Na, lumps in kerosene, 99%), potassium (K, chunks in mineral oil, 98%), sodium hydride (NaH, 95%), sulfur (S, 99.998% metal basis), selenium (Se, powder, 100 mesh, 99.99% metal basis), tellurium (Te, shot, 99.999%), tetramethylammonium hydroxide solution in methanol ($N(CH_3)_4^+OH^-$, 25 wt. %), tetraethylammonium hydroxide solution in methanol ($N(C_2H_5)_4^+OH^-$, 25 wt. %), tri-n-octylphosphine oxide (TOPO, 99%), oleic acid (OA, 90%), 1-octadecene (ODE, 90%), tri-n-butylphosphine (TBP, 97%), hydrazine ($N_2H_4$, anhydrous, ≥98%), formamide (FA, ≥99.5%), dimethyl sulfoxide (DMSO, anhydrous, ≥99.9%), N,N-dimethylformamide (DMF, anhydrous, 99.8%), ethylenediamine (en, ≥99.5%), toluene (anhydrous, ≥99.8%), acetonitrile (anhydrous, ≥99.8%) were purchased from Sigma Aldrich. PbSe (99.99%), $K_2S$ (anhydrous, min. 95%), tri-n-octylphosphine (TOP, 97%) were purchased from Strem. PbTe (ingot, 99.999%) was purchased from Alfa Aesar. $Na_2Te$ (99.9%) and $Na_2Se$ (99.9%) were purchased from Materion. n-Octadecylphosphonic acid (ODPA, 99%) was purchased from TCI, and recrystallized for the synthesis of CdSe nanocrystals. Hydrazine was purified by distillation and handled in a $N_2$-filled glove box. Ethylenediamine was refluxed over sodium to remove residual water and stored over molecular sieves in a $N_2$-filled glovebox. N-methylformamide (NMF, 99%) was purchased from Alfa Aesar and dried prior to use in the glovebox. All other chemicals were used as received. CdTe (111)B single crystals (undoped, P-type, 10×10×1.0 mm, 2 side polished) were purchased from MTI Corp.

II. Syntheses of Chalcogenidometallates.

All the syntheses and purification procedures were performed in a $N_2$-filled glovebox with anhydrous solvents. $Na_2Se$ and $Na_2Te$ were synthesized by reacting Na and Se or Te in liquid ammonia or purchased from Materion. Commercial $Na_2Se$ and $Na_2Te$ often contained polychalcogenide impurities that did not have a significant impact on the quality of the final product. (See, G. Brauer, *Handbook of Preparative Inorganic Chemistry*. (Academic Press, Inc., New York, 1963) and L. D. Schultz, Synthesis and Characterization of Potassium Polytellurides in Liquid Ammonia Solution. *Inorg. Chim. Acta* 176, 271 (1990).) $K_2S$ was purchased from Strem and used without purification.

$Na_2CdTe_2$. (Method 1) 2 mmol CdTe and 2 mmol $Na_2Te$ were mixed in 4 mL of $N_2H_4$ and stirred at room temperature for ~3 days. Upon stirring, the mixture initially formed a green solution with a small amount of unreacted CdTe powder. The solution eventually turned yellow during stirring and all of the CdTe dissolved. The yellow solution was filtered through a 0.45 μm PTFE filter. The compound ($Na_2CdTe_2$) was precipitated out with acetonitrile and separated from a clear solution by centrifugation to remove excess $Na_2Te$. The yellow precipitate was soluble in hydrazine with concentrations up to 620 mg/mL (or 1.5 mol/L). It was also soluble in NMF, FA, and a mixture of $N_2H_4/H_2O$ (1:1 in volume) with concentrations of ~140, 50 and 50 mg/mL, respectively. Using the same method for synthesis and purification, solutions of $A_2CdTe_2$ with other alkali metals (A=K, Cs) can be obtained.

(Method 2)As an alternative route, 2 mmol CdTe, 2 mmol Te and 4 mmol NaH were mixed in 4 mL of $N_2H_4$ and stirred for 3 days at room temperature, forming the same product as in Method 1. $Na_2Te$ formed in situ and reacted with CdTe producing a yellow solution of $Na_2CdTe_2$.

(Method 3)1 mmol CdO, 2 mmol Te and 4 mmol NaH were mixed in 4 mL of $N_2H_4$ and stirred for 3 days at room temperature, forming the same product as in Method 1. As in Method 2, $Na_2Te$ formed in situ and reacted with CdO.

The stoichiometry of the compounds was identified with ICP-OES. For example, $Na_2CdTe_2$ was dissolved in concentrated nitric acid and diluted down to be suitable for measurements. ICP-OES showed that the Na:Cd:Te ratio was equal to 2:1:2 for different batches of samples.

$K_2CdTe_2.2N_2H_4$ Crystal Growth. The crystals were grown by placing a solution of $K_2CdTe_2$ in hydrazine in a tube and adding a layer of anhydrous acetonitrile above it. Slow diffusion of acetonitrile into the hydrazine layer led to nucleation and growth of $K_2CdTe_2.2N_2H_4$ crystals. Crystals do not have to be large (e.g., one of the crystals was 0.4×0.28×0.12 mm) to give good diffraction signals during the measurement due to the high nuclear charge of the elements in the compound.

$Na_2Cd_2Se_3$. 1 mmol of CdSe and 1 mmol of $Na_2Se$ were mixed in 16 mL of $N_2H_4$ and stirred for ~5 days. Upon stirring, the mixture formed a pink solution with a small amount of unreacted CdSe powders as precipitates. The solution changed to white with white precipitates during stirring and all the CdSe dissolved. The solution was centrifuged to remove the unreacted precipitates. The compound ($Na_2Cd_2Se_3$) was precipitated out of solution with acetonitrile to remove excess $Na_2Se$. The white precipitate was separated from clear solution by centrifugation, and redispersed in hydrazine with concentrations up to about 25 mg/mL. It was also soluble in a mixture of $N_2H_4/H_2O$ (1:1 in volume). Using the same method for synthesis and purification, a solution of $K_2Cd_2Se_3$ can be obtained. The same method as for $Na_2CdTe_2$ was implemented to analyze the composition of the compounds. Based on ICP-OES results the composition had a ratio A:Cd:Se equal to 2:2:3.

$Na_4Bi_2Te_5$: 0.5 mmol of $Bi_2Te_3$ and 1.0 mmol of $Na_2Te$ were mixed in 5 mL of $N_2H_4$ and stirred for ~5 days. Upon stirring, the mixture dissolved in $N_2H_4$ with a small amount of unreacted $Bi_2Te_3$ as a precipitate. A greenish dark solution of $Na_4Bi_2Te_5$ was separated from the precipitate by centrifugation, followed by filtration through 0.45 μm PTFE filter. Additional washing with anhydrous acetonitrile was applied to remove unreacted $Na_2Te$. $Na_4Bi_2Te_5$ was readily soluble in $N_2H_4$ at a high concentration (up to ~300 mg/mL) or other solvents like NMF, FA, DMSO, DMF, en or a mixture of $N_2H_4/H_2O$ (4:1 in volume). Similar synthetic and purification procedures can be extended to chalcogenidometallates with different alkali cations ($K^+$ or $Cs^+$). The stoichiometry of this compound was estimated by ICP-OES analysis. For example, $Na_4Bi_2Te_5$ was dissolved in aqua regia and diluted by DI water for measurements. ICP-OES showed that the ratio of Na:Bi:Te was close to 4:2:5 for several batches of samples.

$Na_4Bi_2Se_5$ was synthesized by mixing 0.25 mmol of $Bi_2Se_3$ and 0.5 mmol of $Na_2Se$ in 2.5 mL of $N_2H_4$ and stirring for up to 5 days. The red solution of $Na_4Bi_2Se_5$ was separated from unreacted solids and purified by adding anhydrous acetonitrile (~2:1 in volume). After centrifugation, the solid-form $Na_4Bi_2Se_5$ can be redispersed in $N_2H_4$. $Na_4Bi_2Se_5$ can also dissolve in other solvents, including NMF, FA, DMSO, en or a mixture of $N_2H_4/H_2O$ (4:1 in volume). ICP-OES analysis on purified compound (digested by aqua regia and diluted with DI water) suggested a 4:2:5 ratio for Na:Bi:Se.

$Na_6Bi_{0.5}Sb_{1.5}Te_6$: In the synthesis of $Na_6Bi_{0.5}Sb_{1.5}Te_6$, 0.25 mmol of finely ground $Bi_{0.5}Sb_{1.5}Te_3$ and 0.5 mmol of $Na_2Te$ were mixed and dissolved in 2.5 mL of $N_2H_4$ and stirred for ~5 days to form a brownish red solution. The pristine solution of $Na_6Bi_{0.5}Sb_{1.5}Te_6$ in $N_2H_4$ was separated from the insoluble parts and purified to remove excess $Na_2Te$ by adding ~7.5 mL acetonitrile. Similarly to $Na_4Bi_2Te_5$, $Na_6Bi_{0.5}Sb_{1.5}Te_6$ can dissolve in a wide range of solvents (NMF, FA, DMSO, DMF, en, $N_2H_4/H_2O$). The tentative composition for this compound was determined based on ICP-OES analysis.

$Na_2PbTe_2$: Ball milled PbTe powders (1.25 mmol) and $Na_2Te$ (1.25 mmol) were mixed in 5 mL of $N_2H_4$ and stirred for up to 5 days at room temperature. After reaction, a dark reddish $Na_2PbTe_2$ solution was separated from the unreacted PbTe powder by centrifugation. To remove the excess $Na_2Te$, the $Na_2PbTe_2$ solution in $N_2H_4$ was mixed with anhydrous acetonitrile. After centrifugation, gel like $Na_2PbTe_2$ can be separated from the unreacted $Na_2Te$ in the supernatant. $Na_2PbTe_2$ can be dissolved in $N_2H_4$ with a high concentration (≥300 mg/mL), forming a dark reddish solution. Similar synthetic and purification procedures can be applied to the synthesis of PbTe based chalcogenidometallates with other alkali cations ($K^+$ or $Cs^+$). The composition of $Na_2PbTe_2$ was estimated by ICP-OES analysis on samples digested by aqua regia and diluted with DI water.

$Na_2PbSe_2$: Ball milled PbSe powders (0.625 mmol) and $Na_2Se$ (0.625 mmol) were mixed in 2.5 mL of $N_2H_4$ and stirred for several days, forming a light red solution. $Na_2PbSe_2$ was separated from the unreacted $Na_2Se$ by adding acetonitrile (~1:1 in volume) and centrifuging of the solution. The precipitate was dissolved in $N_2H_4$ and formed a stable, red solution. A 2:1:2 ratio of Na:Pb:Se was observed in ICP-OES analysis of several batches of samples.

Chalcogenidometallates with Mixed Chalcogenides: Cadmium, bismuth and lead inter-chalcogenidometallates (containing S/Se, S/Te, or Se/Te) were synthesized by mixing metal (Cd, Bi, Pb) chalcogenides and alkali chalcogenides in $N_2H_4$ at room temperature for several days. For instance, $Na_6Bi_2Se_3Te_3$ was synthesized with $Na_2Te$ (0.50 mmol) and $Bi_2Se_3$ (0.25 mmol) or $Na_2Se$ (0.50 mmol) and $Bi_2Te_3$ (0.25 mmol). Further purification was applied to remove the unreacted bismuth chalcogenides and the excess amount of $Na_2Se$ or $Na_2Te$. The ratio of chalcogens in the mixed chalcogenides can be readily controlled by the ratio of starting materials, as indicated by ICP-OES results.

Cation Exchanges for Cadmium, Lead and Bismuth Chalcogenidometallates

Amberlyst-15 hydrogen form resin (strongly acidic, cation exchanger, dry) was purchased from Fluka. To load $N_2H_5^+$ cations, resin beads were mixed with purified $N_2H_4$ solvent and vortexed for several minutes in a $N_2$-filled glovebox. During the mixing, the terminal $H^+$ on the resin reacted with $N_2H_4$ exothermically forming $N_2H_5^+$. The slightly colored supernatant was separated from the resin, followed by the addition of fresh $N_2H_4$. This process was repeated several times until the supernatant became colorless and no heat was released upon the addition of fresh $N_2H_4$, indicating the completeness of $N_2H_5^+$ loading.

Similarly, the substitution of terminal $H^+$ on Amberlyst-15 resin with $NR_4^+$ (R=methyl, ethyl) was carried out by saturating resin beads in the methanol solution of $NR_4OH$ (R=methyl and ethyl). The $NR_4^+$-resin was dried under vacuum at ~40° C. to remove any residual solvents and stored in a $N_2$-filled glovebox.

Cation exchange for Cd-, Pb-, and Bi-chalcogenidometallates with $N_2H_5^+$ or $NR_4^+$ (R=methyl, ethyl) was carried out in a $N_2$-filled glovebox. Solutions of chalcogenidometallates in $N_2H_4$ were mixed with an excess amount (~10 molar equivalent of alkali cations) $N_2H_5^+$- or $NR_4^+$-resin and vigorously vortexed for ~10 min. A stable solution containing chalcogenidometallates with $N_2H_5^+$ or $NR_4^+$ (R=methyl and ethyl) cations was then separated from resin beads by centrifugation. Chalcogenidometallates with $N_2H_5^+$ or $NR_4^+$ can be redispersed in $N_2H_4$ (for $N_2H_5^+$ or $NR_4^+$) or acetonitrile and DMF (for $NR_4^+$).

Cation exchange for Cd chalcogenidometallates with didocelydimethylammonium ($DDA^+$) was carried out in the $N_2$-filled glovebox via phase transfer. Phase transfer of $[CdTe_2]^{2-}$ occurred almost instantaneously after addition of didodecyldimethylammonium bromide (DDAB) to the toluene phase, which was resting on top of a hydrazine phase with $Na_2CdTe_2$. The hydrazine phase, after stirring, became clear, indicating complete phase transfer and cation exchange. Elemental analysis with ICP-OES showed an absence of sodium in the toluene phase and a cadmium to tellurium ratio of 1:2.

CdTe-Gel. Mixing of equal amounts of 0.5M $Na_2CdTe_2$ and $CdCl_2$ solutions in hydrazine resulted in the formation of white amorphous product. It formed a suspension that was stable for a long time. Its viscosity can be tuned by changing the amount of hydrazine added to the system. The CdTe gel can be separated from formed NaCl and unreacted precursors by repeating centrifugation/addition of hydrazine or NMF. After drying, the CdTe gel was dissolved in concentrated nitric acid and was used in ICP-OES analysis. It showed that the gel was composed of equimolar amounts of Cd and Te.

III. Synthesis of CdSe and CdTe Nanocrystals (NCs)

CdSe NCs. The synthesis of CdSe NCs was performed using a literature method with slight modifications. (See, L. Carbone et al., Synthesis and Micrometer-Scale Assembly of Colloidal CdSe/CdS Nanorods Prepared by a Seeded Growth Approach. *Nano Lett.* 7, 2942 (2007).) TOPO (6 g), recrystallized ODPA (0.56 g) and CdO (0.12 g) were mixed in a 50 mL three-neck round bottom flask and degassed at 150° C. for 1 hour. After refilling the flask with nitrogen, the solution was heated to 370° C. and TOP (3 g) was injected. After the system regained a temperature of 370° C., a solution of Se in TOP (1.7 M) was injected and the reaction mixture was allowed to stir for 5 minutes. Afterwards, the solution was allowed to naturally cool down to room temperature (~23° C.). CdSe NCs were precipitated with ethanol and redispersed in toluene. This process was repeated 3 times prior to the transfer of NCs in a $N_2$-filled glovebox. CdSe NCs were further purified in a glove box with a triple wash with methanol/toluene, followed by the wash with ethanol/toluene four times. CdSe NCs were finally redispersed in toluene with a concentration of 50 mg/mL.

CdTe NCs. CdTe NCs were synthesized following a procedure described by Panthani et al. (See, M. G. Panthani et al., High Efficiency Solution Processed Sintered CdTe Nanocrystal Solar Cells: The Role of Interfaces. *Nano Lett.* 14, 670 (2013).) ODE (20 g), OA (21.2 g) and CdO (2.4 g) were mixed in a 150 mL three-necked round bottom flask and degassed at 80° C. for an hour. The mixture was heated to 240° C. under $N_2$ until a clear solution formed. The solution was cooled down to 110° C. and evacuated again to remove formed water. The solution was then heated to 270° C. and 12 mL of 10 wt. % solution of Te in TBP was injected under $N_2$. The heating mantle was immediately removed and the solution was allowed to cool down naturally to room temperature. CdTe NCs were precipitated out with ethanol and redispersed in toluene. This washing procedure was repeated several times to ensure a complete removal of excess organic ligands.

Exchange of Surface Ligands for CdSe NCs with $Cd_2Se_3^{2-}$

The ligand exchange for CdSe NCs was carried out in a $N_2$-filled glovebox via a phase transfer of NCs from nonpolar toluene into the polar $N_2H_4$ phase. ODPA-capped CdSe NCs have been carefully washed from excess organic ligands by multiple precipitation with methanol or ethanol and redissolution in toluene or hexane. 1.4 mL of 4.7 nm CdSe NCs solution in toluene with a concentration of ca. 6 mg CdSe substance per mL was mixed with 1.4 mL of ~7 mM solution of $Na_2Cd_2Se_3$ in $N_2H_4$. The mixture was stirred until the upper phase was colorless or only slightly colored. The phase transfer of NCs occurred due to the substitution of ODPA ligands on the surface of NCs with $[Cd_2Se_3]^{2-}$ ions. The red-colored bottom polar phase was separated, washed with toluene 3 times and filtered through a 0.2 μm PTFE filter. $[Cd_2Se_3]^{2-}$-capped CdSe NCs were precipitated out with acetonitrile and dissolved in hydrazine. Absorption spectra of organic-capped and $[Cd_2Se_3]^{2-}$-capped CdSe NCs are shown in FIG. 2A. A small red shift of the first excitonic peak by about 4 nm was observed in the solution of $[Cd_2Se_3]^{2-}$-capped NCs. A similar procedure was adopted in the case of ligand exchange of CdTe NCs with $Na_2CdTe_2$ ligands.

IV. Fabrication of Thin Films and Casting Various-Shaped Solids from the Suspension of Microparticles Mixed with Chalcogenidometallate and Chalcogel Solders in $N_2H_4$.

All procedures were carried out in a $N_2$-filled glovebox. Micro-sized powders (or microparticles) were obtained from corresponding bulk materials (CdTe, PbTe, PbSe, $Bi_2Te_3$, $Bi_{0.5}Sb_{1.5}Te_3$) via ball milling for 3 h (SPEX 8000D Mixer/Mill). In the fabrication of PbTe thin films, 100 mg of PbTe microparticles was mixed with 0.3 mL of $Na_2PbTe_2$ in $N_2H_4$ (5, 10 or 20 wt. % of PbTe microparticles) and sonicated or vortexed at room temperature for 15-60 min. The obtained suspension was drop cast on a glass substrate. Prior to the deposition, the glass substrate was hydrophilized by oxygen plasma for 15 min. The as-deposited $PbTe/Na_2PbTe_2$ thin films were dried at room temperature, followed by annealing at 500° C. for 30 min, resulting in a continuous thin film. The Na concentration in the annealed film can be controlled by adjusting the ratio between PbTe micro-particles and $Na_2PbTe_2$ solder. Control experiments were carried out on PbTe micro-particles without the $Na_2PbTe_2$ solder, where the micro-particles remained powderish and no thin film was obtained. A similar procedure was applied in the fabrication of thin films with other combinations of micro-particles and chalcogenidometallate/chalcogel solders.

For casting variously shaped solids, graphite molds machined with various shapes (disk, triangle, square, rod) were used. For instance, the meta-stable suspension of PbTe micro-particles (300 mg) with $Na_2PbTe_2$ solder in $N_2H_4$ (0.1-0.2 mL) was filled into the graphite mold. After drying at room temperature, the suspension in the mold was annealed at 500° C. for 30 min. After cooling down to room temperature, the molded PbTe pellet (~6 mm in diameter/side and 1-3 mm in thickness, depending on the shape) was ejected from the mold, showing good mechanical strength and decent charge transport properties. On the contrary, no molding effect was observed using the suspension of only micro-particles. Using this technique, various composites were achieved by tuning the combination of micro-sized powders (PbTe, $Bi_2Te_3$, $Bi_{0.5}Sb_{1.5}$ $Te_3$, CdTe) and chalcogenidometallate/chalcogel solders ($Na_2PbTe_2$, $Na_2PbSe_2$, $Na_2PbTe_2$/Te, Te, Se, $Na_4Bi_2Te_5$, $(N_2H_5)_4Bi_2Te_5$, $Na_6Bi_{0.5}Sb_{1.5}Te_6$, $(N_2H_5)_6Bi_{0.5}Sb_{1.5}Te_6$, $Na_2CdTe_2$, $(N_2H_5)_2CdTe_2$).

Hall effect measurement of thin films made of PbTe micro-particles with $Na_2PbTe_2$ was conducted with Van der Pauw geometry in a physical property measurement system (PPMS, Quantum Design) under a helium atmosphere. Electrical measurements were carried out using a Keithley 2400 sourcemeter (Keithley Instrument, Inc.) through a Labview interface.

V. Characterization Techniques.

The Transmission Electron Microscopy (TEM). TEM images were obtained using a 300 kV FEI Tecnai F30 microscope.

Scanning Electron Microscopy (SEM). SEM analysis was carried out on a FEI Nova NanoSEM 230 operating at 10 kV.

Wide Angle Powder X-Ray Diffraction (XRD) patterns were collected using a Bruker D8 diffractometer with Cu $K_\alpha$ X-ray source operating at 40 kV and 40 mA. Thin films of NCs or CdTe chalcogels were prepared by drop casting corresponding solutions on a glass substrate and dried at room temperature in a $N_2$-filled glove box. To investigate the evolution of the NCs/CdTe gels during annealing, the thin films were annealed in an oven in the glovebox under various temperatures. To avoid oxidation or hydrolysis, thin film samples were sealed in a $N_2$-filled dome with a plastic cover during the measurements.

Inductively Coupled Plasma Optical Emission Spectroscopy (ICP-OES) analysis was carried out using an Agilent 700 Series spectrometer. Samples were digested by a mixture of deionized ultrafiltered water and nitric acid ($HNO_3$, ≥69.0%, TraceSELECT, for trace analysis, from Sigma Aldrich) or aqua regia (HCl used for aqua regia is purchased from Sigma Aldrich, ≥37%, TraceSELECT, for trace analysis, fuming) in a plastic container. Note that glass containers may release $Na^+$ or $K^+$ and interfere with the detection of Na or K. The compositions and empirical formula of various chalcogenidometallates or chalcogels were determined based on the ICP-OES results. Optical Absorption Measurements.

The UV-vis spectra were collected using a Cary 5000 UV-Vis-NIR spectrophotometer.

Thermogravimetric Analysis (TGA) data were obtained using TA Instruments SDT Q600 thermal analyzer at a heating rate of 3° C./min and cooling rate of 10° C./min under a nitrogen flow in the temperature range from 40 to 500° C.

Single Crystal X-Ray Data Collection. A crystal was included within a sealed capillary. The capillary was mounted and centered on a Bruker SMART APEX system at room temperature. Frames separated in reciprocal space were obtained and provided an orientation matrix and initial cell parameters. Final cell parameters were obtained from the full data set.

A "full sphere" data set was obtained which samples approximately all of reciprocal space to a resolution of 0.84 Å using 0.3° steps in $\omega$ using 10 second integration times for each frame. Integration of intensities and refinement of cell parameters were done using SAINT. Absorption corrections were applied using SADABS based on redundant diffractions. All software and sources of scattering factors are contained in the SHELXTL (version 5.1) program library (G. Sheldrick, Bruker Analytical X-ray Systems, Madison, Wis.).

X-Ray Absorption Spectroscopy was carried out for the Cd K-edge (26,711 eV) and Te K-edge (31.814 eV). EXAFS measurements were carried out at the MRCAT 10-ID undulator beamline at the Advanced Photon Source, Argonne National Laboratory in order to study the local environment around the Cd and Te atoms in $Na_2CdTe_2$. (See, C. U. Segre, et al., *The MRCAT Insertion Device Beamline at the Advanced Photon Source*. Synchrotron Radiation Instrumentation: Eleventh U.S. Conference CP521, 419-422 (2000).) Measurements were done in the transmission mode with samples loaded in plastic cuvettes resistant to hydrazine solvent. For references, CdTe powder and Te powder were spread on tapes and stacked for obtaining appropriate XANES edge height. Other reference samples included CdTe NC solution and Te solution in hydrazine.

The spot size of the incident X-ray beam on the sample was 400 micron by 400 micron. Cd foil and Te powder were measured as references before sample measurements were taken at the Cd edge and Te edge respectively. The undulator parameters (taper and gap) were optimized to obtain a large photon flux with nearly constant intensity within the scanned energy range. Around 10 scans were recorded for each sample to ensure repeatability and averaged to improve statistics.

Field Effect Transistor (FET) Device Fabrication and Characterization.

Preparation of Zirconium Oxide Gate Dielectric: 243.8 mg of Zr(IV) acetylacetonate ($Zr(C_5H_7O_2)_4$) (98%, Sigma Aldrich) was dissolved in 5 mL DMF in air. An equimolar amount (30.18 μL) of ethanolamine ($C_2H_7NO$) (>99%, Sigma Aldrich) was added to the solution in a $N_2$-filled glove box and the solution was stirred at 70° C. for 3 h to promote hydrolysis. Prime grade Si wafers (0.01-0.02 Ωcm, University Wafers) were used as gate substrates for FET fabrication. Prior to the deposition of the $ZrO_x$ sol-gel solution, the Si substrates were cleaned with piranha solution, followed by multiple rinsing with DI water. The $ZrO_x$ sol-gel solution was filtered through a 0.2 μm PTFE filter and spin-coated on the Si substrates at 4000 rpm for 50 s. The sol-gel films were thermally annealed at 400° C. for 1 h in a furnace under a $N_2$ atmosphere, and then cooled to room temperature.

FET Fabrication: The $ZrO_x$ films were hydrophilized by oxygen plasma treatment (5 min) prior to NC deposition. All following fabrication steps were performed in a $N_2$-filled glove box. Solutions of $[Cd_2Se_3]^{2-}$-capped CdSe NCs (50 mg/mL in hydrazine) were spin-coated (spread: 600 rpm, 6 s; spin: 2000 rpm, 50 s) on the $ZrO_x$ films, which produced ~100 nm-thick NC films on top of the $ZrO_x$ films. The NC films were annealed at 80° C. for 1 h for solvent evaporation, and then annealed at 250° C. for 30 min to decompose the ligand and to promote NC grain growth. 100 nm-thick Al source/drain electrodes were deposited through a shadow mask using a thermal evaporator to complete a top-contact, bottom-gate FET structure (channel length L/width W: 30 μm/1500 μm=50).

FET Characterization: All electrical measurements were performed in a $N_2$-filled glove box. For capacitance measurements, sandwich-type devices were fabricated by depositing 100 nm-thick Al electrodes (various-sized dots with diameters 500 μm, 650 μm, and 800 μm) directly on top of the plasma-treated $ZrO_x$ films. The capacitance measurements were performed using an LCR meter (SR 720) with frequencies ranging from 100 Hz to 100 kHz. The capacitance value measured at 100 Hz was used to extract FET mobility. FET measurements were performed either using a semiconductor analyzer (Agilent B1500A) or using a Keithley dual channel sourcemeter (Keithley 2636A) controlled by a Labview interface.

Calculation of Field-Effect Mobility. In the gradual channel approximation, current in the FET channel can be analytically described for two different regimes of operation. (See, *Thin Film Transistors*, ed. C. R. Kagan and P. Andry. Marcel Dekker, New York 2003.)

At low $V_D$, $I_D$ increases linearly with $V_D$ (linear regime):

$$I_D = \frac{WC_i\mu_{lin}}{L}\left(V_G - V_T - \frac{V_D}{2}\right)V_D,$$

where L is the channel length, W is the channel width, $C_i$ is the capacitance per unit area of the insulating layer (700 nF/cm$^2$), $V_T$ is the threshold voltage, and $\mu_{lin}$ is the linear regime field-effect mobility. $\mu_{lin}$ is calculated from the transconductance $$g_m = \frac{\partial I_D}{\partial V_G}\bigg|_{V_D=const} = \frac{WC_iV_D}{L}\mu_{lin}$$

by plotting $I_D$ vs. $V_G$ at a constant low $V_D$, with $V_D \ll (V_G - V_T)$. The slope of this plot is equal to $g_m$.

For $V_D > (V_G - V_T)$, $I_D$ tends to saturate due to pinch-off of the accumulation layer (saturation regime). This case is approximately described by the equation $$I_D = \frac{WC_i\mu_{sat}}{2L}(V_G - V_T)^2$$

$\mu_{sat}$ is calculated from the slope of $\sqrt{|I_D|}$ vs. $V_G$.

$K_2CdTe_2.2N_2H_4$ X-Ray Structure Solution and Refinement

The space group was determined as C2/c based on systematic absences and intensity statistics. Patterson methods were used to locate the Cd and Te atoms. Repeated difference Fourier maps allowed recognition of the expected K and N atoms. Final refinement was anisotropic for all atoms. No anomalous bond lengths or thermal parameters were noted.

EXAFS Analysis

Collected data were processed using Athena software by extracting the EXAFS oscillations $\chi(k)$ as a function of photoelectron wave number k following standard procedures. (See, M. Newville, IFEFFIT: interactive EXAFS analysis and FEFF fitting. *J. Synchr. Radn.* 8, 322-324 (2001).) The theoretical paths were generated using FEFF6 and the models were tested in the conventional way using the fitting program Artemis. (See, J. J. Rehr, R. C. Albers, Theoretical approaches to x-ray absorption fine structure. *Rev. Mod. Phys.* 72, 621-654 (2000) and B. Ravel, M. Newville, ATHENA, ARTEMIS, HEPHAESTUS: data analysis for X-ray absorption spectroscopy using IFEFFIT. *J. Synchr. Radn.* 12, 537-541 (2005).) Fitting parameters were obtained by modeling the EXAFS data of each sample until a satisfactory fit describing the system was obtained. Data sets were simultaneously fitted in the radial distance space with k-weights of 1, 2 and 3.

The Fourier transforms of $k^2$-weighted Te K-edge spectra for the $Na_2CdTe_2$ and CdTe powder showed that the signal from the $Na_2CdTe_2$ sample had smaller amplitude compared to the CdTe powder, implying fewer Cd atoms bonded to each Te atom. The shift of the first shell peak (1.9 and 2.7 Å) in the $Na_2CdTe_2$ solution to lower radial distance implies shorter Te—Cd bonds. For $Na_2CdTe_2$ the absence of the second shell peak at 4.5 Å corresponding to Te—Te coordination sphere was noted, presumably due to dynamic disorder in solution. The Fourier transformed Cd-edge for $Na_2CdTe_2$ solution and CdTe powder show that the signal from the $Na_2CdTe_2$ also had a smaller amplitude compared to CdTe, corresponding to lower coordination number for the Cd atoms in $Na_2CdTe_2$. The first shell peaks (2 and 2.7 Å), corresponding to the Cd—Te bonds, also shifted to lower radial distances. This would imply shorter Cd—Te bonds in the samples in comparison to the CdTe.

Fourier transformed (FT) spectra were obtained and fit for the CdTe powder (Cd edge and Te edge, respectively). The R-factors for all the fits were below 0.03. For CdTe the coordination numbers have been fixed to the values obtained from the crystallographic structure and the bond lengths were comparable to the expected values.

FT data and fits were also obtained for the Cd and Te edge of $Na_2CdTe_2$, respectively. For $Na_2CdTe_2$, fits reveal shorter Cd—Te bonds compared to CdTe powder by 0.05 Å. $Na_2CdTe_2$ also showed lower coordination numbers compared to CdTe. On average, Cd atoms are bonded to 2.8±0.2 Te atoms in the $Na_2CdTe_2$ solution. No Cd—Cd bonds were observed. Te atoms, on the other hand, are bonded to 1.3±0.3 Cd atoms and no Te—Te bonds have been observed in $Na_2CdTe_2$ sample.

Additional Experiments to Verify FET Mobility Measurements. Different instruments (Agilent B1500 Semiconductor Parameter Analyzer and Keithley 2636A Dual Channel Sourcemeter) were used to measure FET transfer and output characteristics. Both instruments yielded FET transfer characteristics with identical FET mobility values. FET devices with 10 nm $ZrO_x$ ($C_i$ 700 nF/cm$^2$) and 100 nm $SiO_2$ gate dielectrics ($C_i$ 30 nF/cm$^2$) were compared. As expected, a thick and low-k $SiO_2$ dielectric resulted in higher FET operation voltages. The devices with a $SiO_2$ gate dielectric annealed at 250° C. showed quite high electron mobility ($\mu$>100 cm$^2$/Vs), much higher than any previously studied solution-deposited CdSe. The observation of somewhat lower mobility in devices with $SiO_2$ gate dielectric compared to FETs with high-k gate dielectric ($Al_2O_3$, $ZrO_x$, $HfO_2$, etc) is consistent with previous observations, both for NC FETs and OFETs.

EXAMPLE 2

This example demonstrates high-performance solution-processed CdSe nanocrystal (NC) field-effect transistors (FETs) that exhibit very high carrier mobilities (over 400 cm$^2$/Vs). This is comparable to the carrier mobilities of crystalline silicon-based transistors. Furthermore, our NC FETs exhibit high operational stability and MHz switching speeds. These NC FETs were prepared by spin coating colloidal solutions of CdSe NCs capped with molecular solders $[Cd_2Se_3]^{2-}$ onto various oxide gate dielectrics followed by thermal annealing. This example shows that the nature of gate dielectrics plays an important role in soldered CdSe NC FETs. The capacitance of dielectrics and the NC electronic structure near the gate dielectric affect the distribution of localized traps and trap filling, determining carrier mobility and operational stability of the NC FETs. This example also expands the application of the NC soldering process to core-shell NCs consisting of a III-V InAs core and a CdSe shell with composition-matched $[Cd_2Se_3]^{2-}$ molecular solders. As demonstrated here, soldering CdSe shells forms nano-heterostructured material that combines high electron mobility and near-IR photoresponse.

In this example, systematic parametric studies of soldered CdSe NC FETs prepared from colloidal CdSe NCs capped with $Na_2Cd_2Se_3$ metal chalcogenide complex (MCC) ligands were performed. In addition, a proof-of-concept study for using the soldering process for nano-heterostructures was conducted. Colloidal solutions of CdSe NCs capped with $Na_2Cd_2Se_3$ MCC ligands were spin-coated on various oxide gate dielectrics ($SiO_2$, $Al_2O_3$, and $ZrO_x$) to form thin films of NC arrays. The effects of annealing temperature on FET performance and grain growth have been studied to find the relationship between carrier mobility and NC grain size. A record-high electron mobility up to ~450 cm$^2$/Vs in solution-processed CdSe thin films was demonstrated and it was shown that high-mobility FETs are remarkably stable with respect to a number of consecutive operation cycles and different gate-voltage sweep rates. Furthermore, these high performance and stable solution-processed FETs exhibited fast switching with a −3 dB frequency of 2.3 MHz, despite their simple device architecture and a 50 μm-long FET channel. Finally, the potential for designing complex nano-heterostructured layers with high electron mobility by soldering core-shell NCs consisting of an InAs core and a CdSe shell capped with $Na_2Cd_2Se_3$ MCC ligands was demonstrated.

Soldered CdSe NC FETs with Various Oxide Dielectrics.

The synthesis of CdSe NCs and $Na_2Cd_2Se_3$ metal chalcogenide complexes (MCCs) and the exchange of the original organic NC surface ligands with $Na_2Cd_2Se_3$ was performed as detailed in Example 1. (Dolzhnikov, D. S.; Zhang, H.; Jang, J.; Son, J. S.; Panthani, M. G.; Shibata, T.; Chattopadhyay, S.; Talapin, D. V. *Science* 2015, 347, 425-428, which is incorporated herein by reference.) It should be noted that excessive MCC ligands that were not bound to the NC surface do not need to be removed because they act as "molecular solder" for CdSe grains. FIG. 6A compares the absorption spectra of n-octadecylphosphonic acid (ODPA)-capped and $[Cd_2Se_3]^{2-}$-capped CdSe NCs. The colloidal solution of $[Cd_2Se_3]^{2-}$-capped CdSe NCs preserved the original quantum dot excitonic features and showed a small red shift (4 nm) of the first excitonic peak, likely due to the expansion of wavefunctions into the compositionally matched ligand shell.

To make thin films of $[Cd_2Se_3]^{2-}$-capped CdSe NCs, solutions of the NCs were spin-coated on top of three different oxide gate dielectric layers prepared on heavily doped Si wafers: (1) commercial thermally grown 100 nm-thick $SiO_2$, (2) ~37 nm-thick $Al_2O_3$ grown with atomic layer deposition (ALD), and (3) ~10 nm-thick $ZrO_x$ prepared by spin coating $ZrO_x$ sol-gel precursors, followed by thermal annealing at 400° C. (See, Chua, L.-L.; Zaumseil, J.; Chang, J.-F.; Ou, E. C. W.; Ho, P. K. H.; Sirringhaus, H.; Friend, R. H. *Nature* 2005, 434, 194-199.) The NC films were dried at 100° C. for 1 h to remove residual solvent. This was followed by thermal annealing at 250° C. to induce soldering of CdSe NCs by $Na_2Cd_2Se_3$, leading to efficient CdSe grain growth. FIG. 6B shows the typical cross-sectional scanning electron microscopy (SEM) image of a soldered CdSe NC film on a $SiO_2$ dielectric. To complete top-contact bottom-gate FET geometry, Al source/drain (S/D) electrodes were deposited onto the NC film through a shadow mask by thermal evaporation (FIG. 6C). The heavily doped Si wafer served as the gate terminal. All FET fabrication and measurement processes were carried out in nitrogen atmosphere.

FIGS. 7A-F show representative transfer (drain current vs gate voltage, $I_D$ vs $V_G$) and output ($I_D$ vs drain voltage $V_D$) characteristics of CdSe NC FETs using $SiO_2$ (FIGS. 7A and 7D), $Al_2O_3$ (FIGS. 7B and 7E), and $ZrO_x$ (FIGS. 7C and 7F) gate dielectrics (hereafter, CdSe NC FETs using $SiO_2$, $Al_2O_3$, and $ZrO_x$ gate dielectrics will be referred to as $SiO_2$—, $Al_2O_3$—, and $ZrO_x$-based FETs, respectively, according to the identity of the gate dielectric). The properties of the gate dielectrics and NC FETs using the dielectrics are summarized in Table 1. All FETs exhibited remarkably high performance with carrier mobilities (μ) of >90 $cm^2/Vs$. These results emphasize the potential of soldered CdSe NCs as the active material of FETs using various gate dielectric materials. Among the three kinds of FETs, the $ZrO_x$-based FETs showed superior performance with the highest μ (~210 $cm^2/Vs$ in the linear regime, ~180 $cm^2/Vs$ in the saturation regime). To understand why the FETs showed different performance with different gate dielectrics, the charge per unit area on the semiconductor side of the insulator ($Q_s$) needs to be taken into account. The $Q_s$, determined as the areal capacitance ($C_i$) multiplied by the maximum gate voltage during operation, is directly related to the filling of trap states in the FET channel. (See, Dimitrakopoulos, C. D.; Purushothaman, S.; Kymissis, J.; Callegari, A.; Shaw, J. M. *Science* 1999, 283, 822-824.) With a sufficiently large value of $Q_s$, all localized states can be filled and subsequently injected carriers can move without trapping. (See, Dimitrakopoulos, C. D.; Purushothaman, S.; Kymissis, J.; Callegari, A.; Shaw, J. M. *Science* 1999, 283, 822-824.) This consideration provides insight into the superior performance of the $ZrO_x$-based FETs. As shown in Table 1, $Q_s$ is about 1.5 times larger for $ZrO_x$-based FETs than for $SiO_2$- and $Al_2O_3$-based FETs. Having a larger $Q_s$ is expected to lead to charge transport with a lower concentration of empty trap sites, resulting in superior carrier mobility. This explanation is supported by the smallest hysteresis in transfer characteristics (FIGS. 7A-C) and the most well-saturated drain current in output characteristics (FIGS. 2D-F) of the $ZrO_x$-based FETs. (See, Dimitrakopoulos, C. D.; Kymissis, I.; Purushothaman, S.; Neumayer, D. A.; Duncombe, P. R.; Laibowitz, R. B. *Adv. Mater.* 1999, 11, 1372-1375.) In addition, the three different gate dielectrics may cause different concentrations of trap sites at the dielectric-channel interface because of different densities of trapping sites (e.g., hydroxyl groups). (See, Chua, L.-L.; Zaumseil, J.; Chang, J.-F.; Ou, E. C. W.; Ho, P. K. H.; Sirringhaus, H.; Friend, R. H. *Nature* 2005, 434, 194-199.) This interfacial trap density ($N_{trap}$) can be estimated from the subthreshold slope (S) of the FET transfer characteristics: $N_{trap} \approx [qS \log(e)/k_B T - 1] C_i / q$, where q is the electronic charge, $k_B$ is Boltzmann's constant, and T is the temperature. (See, McDowell, M.; Hill, I. G.; McDermott, J. E.; Bernasek, S. L.; Schwartz, J. *Appl. Phys. Lett.* 2006, 88, 073505.) The CdSe NC FETs with $ZrO_x$ gate dielectrics show significantly smaller S than devices with $SiO_2$ dielectrics (FIGS. 8A and 8B), resulting in estimated $N_{trap}$ values of $9.8\times10^{12}$ $cm^{-2}$ and $2.1\times10^{13}$ $cm^{-2}$ for the FETs using $ZrO_x$ and $SiO_2$ dielectrics, respectively. The $N_{trap}$ of $ZrO_x$ devices is about two times lower than that of $SiO_2$ devices, which supports that, in addition to higher $Q_s$ charge, the use of $ZrO_x$ gate dielectrics reduces the density of localized trap states at the dielectric-channel interface.

TABLE 1

Summary of electrical properties of gate dielectrics and soldered CdSe NC FETs annealed at 250° C.

| Dielectric | $C_i$ ($nF/cm^2$) | Maximum gate Voltage (V) | $Q_s$ ($\mu C/cm^2$) | μ ($cm^2/Vs$) |
|---|---|---|---|---|
| $SiO_2$ | 31.2 | 30 | 0.938 | 91 |
| $Al_2O_3$ | 192 | 5 | 0.960 | 102 |
| $ZrO_x$ | 710 | 2 | 1.420 | 210 |

The Effects of Annealing Temperature on Grain Growth and FET Characteristics of CdSe NC Thin Films. The effects of annealing temperature on the grain growth of CdSe NCs when soldered with $[Cd_2Se_3]^{2-}$ molecular solders was also studied. First, powder X-ray diffraction (XRD) measurements were performed. Solutions of CdSe NCs with $[Cd_2Se_3]^{2-}$ ligands were spin-coated onto $SiO_2$ and $ZrO_x$ gate dielectrics and then annealed at different temperatures for 30 min. The Scherrer size of CdSe grains is shown FIG. 9A. As shown in FIG. 9A, $[Cd_2Se_3]^{2-}$-capped CdSe NCs did not show noticeable grain growth until 200° C. It was found that the NCs started growing rapidly between 200° C.-250° C. and the grain growth was nearly saturated above 350° C. In addition, the NC films on $SiO_2$ and $ZrO_x$ gate dielectrics showed almost the same trend with annealing temperatures and very similar Scherrer grain sizes at each temperature. To examine the morphology of the NCs, SEM measurements of the NCs annealed at 250° C., 300° C., and 350° C. were performed (FIG. 13). Consistent with XRD results, both the NCs on $SiO_2$ and $ZrO_x$ dielectrics showed apparent grain growth as the annealing temperature was increased from 250° C. to 350° C. At the same time, the gate dielectric did not significantly affect sintering and grain growth of CdSe NCs. These results suggest the possibility of improving carrier mobility of soldered CdSe thin films by increasing CdSe NC grain size using elevated annealing temperatures.

To check this possibility, FETs of $[Cd_2Se_3]^{2-}$-capped CdSe NCs were fabricated and annealed at 300° C. and 350° C. using $SiO_2$, $Al_2O_3$, and $ZrO_x$ gate dielectrics. FIG. 9B plots the mobilities of the NC FETs depending on the annealing temperature and gate dielectric. The mobility discussed throughout this disclosure is typically the linear regime FET mobility. The saturation regime mobility was found to be about ~60-100% of the linear regime mobility, as normally observed in NC FETs. All FETs using different gate dielectrics showed an increase in mobility at elevated annealing temperatures, which agreed well with the results of XRD and SEM analyses. The mobility increased by ~41% for $SiO_2$-based FETs, ~32% for $Al_2O_3$-based FETs, and ~115% for $ZrO_x$-based FETs as the annealing temperature was elevated from 250° C. to 350° C. Interestingly, the enhancement of mobility with elevated annealing temperature was much larger for $ZrO_x$-based FETs compared to the other devices. Considering that the grain size of the NCs was almost identical at each temperature regardless of the dielectrics (FIG. 9A and FIG. 13), the predominantly improved performance of $ZrO_x$-based FETs may be due to factors other than the grain size. These surprisingly high carrier mobilities of $ZrO_x$-based FETs could not be artifacts caused by gate leakage currents. Gate leakage currents in the FETs during the gate voltage sweep were about 2-4 orders of magnitude smaller than the $I_D$, suggesting no severe contribution of gate leakage currents to the $I_D$. The FETs show high mobilities across a wide range of gate voltages, with a linear $I_D$ VS $V_G$ relation in the $V_G$ range for mobility extraction. This observation confirmed that estimated $\mu$ values reflect an equilibrium charge carrier concentration and current carrying capability of the device. Therefore, it was concluded that $ZrO_x$ gate dielectrics provide a more favorable surface for charge transport at the interface between NCs and the dielectric with reduced density of localized traps, as supported by the analysis of FET subthreshold slopes and interfacial trap densities (FIGS. 8A and 8B). Combined with the largest value of $Q_s$, the $ZrO_x$ gate dielectrics enable FETs with superior characteristics.

Relation Between Trap Distributions in Soldered CdSe Films and Operational Stability of NC FETs. To evaluate the prospects of soldered CdSe NCs for real-world device applications, a consecutive cycling of gate voltage sweeps for the NC FETs was performed. Each cycle consisted of a "forward" gate voltage sweep ($V_G$: from negative to positive) and a subsequent "backward" gate voltage sweep ($V_G$: from positive to negative). For this experiment, $ZrO_x$-based FETs were operated under similar values of $Q_s$ as those for $SiO_2$- and $Al_2O_3$-based FETs to compare device stability. Therefore, the maximum gate voltage of $ZrO_x$-based FETs was reduced to 1.5V, resulting in a $Q_s$ of ~1.0 μC/cm$^2$, similar to those of $SiO_2$- and $Al_2O_3$-based FETs. FIG. 10B summarizes the mobilities and on/off ratios corresponding to a cycling experiment of $ZrO_x$-based FETs annealed at 250° C. for a consecutive cycling of $V_G$ sweeps.

$ZrO_x$-based FETs showed outstanding electrical stability against a consecutive cycling of gate voltage sweeps without significant drops in either the carrier mobility or on/off ratio (FIG. 10B). On the other hand, the $SiO_2$-based FETs showed consistent decreases of both the carrier mobility and on/off ratio during the same experiment. In general, the stability against a consecutive cycling of gate voltage sweeps was closely related to the number of trap sites and the time scale that the charge carrier spends being trapped on the traps (i.e., trap life time). If charge carriers are trapped during an FET operation and those carriers cannot be released before the start of the next cycle, the trapped carriers cannot participate in charge transport, leading to lowered $I_D$ and $\mu$. These results provided additional support to the conclusion that the superior performance of $ZrO_x$-based FETs originated from the combination of the lowest density of localized traps and the largest values of $Q_s$, as schematically explained in FIG. 10A.

The $ZrO_x$-based FETs with NCs annealed at 300° C. also showed an excellent level of stability against the cycling of gate voltage sweeps as shown in FIG. 10C. Evident hysteresis behavior can be seen at the low gate voltage region ($V_G$: −0.2V~1V) in the transfer characteristics, with higher channel current during off-to-on switching than the current during on-to-off switching. This type of hysteresis behavior can be generally explained by the presence of states in the forbidden gap of a semiconductor as discussed in Chung, D. S.; Lee, J.-S.; Huang, J.; Nag, A.; Ithurria, S.; Talapin, D. V. *Nano Lett.* 2012, 12, 1813-1820. The hysteresis completely disappeared as the positive gate bias increased. The results suggest that localized tail states in $ZrO_x$-based FETs are not deep traps but shallow traps and that these shallow traps are almost filled up during an FET operation because of the large $Q_s$ value.

FET measurements with different sweeping rates of gate voltage were also performed in order to get more insight into the localized trap states. Generally, slower sweeping of gate voltage leads to a longer time for charge carriers to stay in the channel, resulting in more charge trapping. As shown in FIG. 10D, although the carrier mobility slightly decreased as the sweeping rate reduced from 1.20 V/s to 0.54 V/s, the mobility still maintained ~90% of its initial value. This result also indicates that the number of traps in $ZrO_x$-based FETs is small and the traps are almost inactive during an FET operation.

Switching Speed of Soldered CdSe NC FETs. In practical applications, transistors are the key component as switching devices in integrated circuits. The switching speed is, therefore, important and depends on many device parameters, including carrier mobility. In addition, measurement of the switching speed allows independent verification of the mobility values extracted from quasi-static FET characteristics. The high carrier mobility of the soldered CdSe NCs offers an opportunity to construct fast switching FETs via a solution-based route. Therefore, the switching speed of the NC FETs was estimated by measuring the channel current response to square-wave modulation of the gate voltage. In the AC measurements of FETs, parasitic capacitance between the source/drain (S/D) electrodes and the gate electrode plays a crucial role. When an AC $V_G$ voltage was applied, the charges induced by parasitic capacitance contribute to an AC channel current. The amplitude of induced AC current increases as the FET switching frequency is increased and becomes significant at high frequency. To reduce the effects of parasitic capacitance, a different device architecture using a patterned titanium gate electrode and an ALD-deposited $Al_2O_3$ gate dielectric was introduced, as shown in FIG. 11A. The ALD-deposited $Al_2O_3$ thin films were the best choice among dielectric candidates because they could be deposited at a relatively low temperature (80° C.) with good step coverage over the patterned gate electrode (e.g., the fabrication of $ZrO_x$ gate dielectrics involves a thermal annealing process at 400° C., which severely destroys patterned Ti gate electrodes). As shown in FIGS. 11B and 11C, the FETs with patterned gates exhibited good transfer and output characteristics with carrier mobilities of ~84 cm$^2$/Vs. This value is slightly lower than that of normal $Al_2O_3$-based FETs using unpatterned, doped Si gate electrodes (~100 cm$^2$/Vs). This might result from the reduction of charge carrier injection from the source electrode due to a decrease in the overlap area between the S/D and gate electrodes.

To estimate the switching speed of the NC FETs, the $I_D$ response over time was measured and a square shape $V_G$ signal was applied at different frequencies. FIG. 11D shows a typical $I_D$ response at two different $V_G$ signal frequencies, 1 kHz and 200 kHz. As shown in FIG. 11D, clear on/off responses of the $I_D$ have been observed. Sharp current spikes started emerging at the frequency of 100 kHz when the $V_G$ signal was being inverted. These current spikes came from parasitic capacitances present between the S/D and gate electrodes. It is difficult to eliminate the parasitic capacitance without introducing a fine patterning process and a specialized device architecture for ultra high-speed measurements. However, the simple devices can be used to evaluate the switching speed and extract the transit time of the charge carriers in the FET channel. The transit time between source and drain electrodes ($\tau$) can be expressed as $\tau=L/(\mu E)=L^2/(\mu V_D)$, where E is the electric field. $\tau$ can be measured in the frequency domain and related to the −3 dB frequency (the frequency where signal power drops by half) as $f_{3\ dB}=(2\pi\tau)^{-1}$. For this case, these relations, using experimental values of L, $\mu$, and $V_D$, predict $\tau$=62.5 ns and $f_{3\ dB}$=2.55 MHz. As shown in FIG. 11E, the measured $f_{3\ dB}$ of the devices is about 2.3 MHz. The deviation of the measured $f_{3\ dB}$ from the ideal value was small and may result from several factors like charge carrier trapping and detrapping. In addition, the hysteresis in transfer characteristic also causes additional energy dissipation during transistor switching, which is especially significant for analog circuits. The measured $f_{3\ dB}$=2.3 MHz is orders of magnitude higher than previously reported values for NC FETs and comparable to or higher than the $f_{3\ dB}$ of the best organic FETs with submicron channels optimized for fast switching. (See, Chung, D. S.; Lee, J.-S.; Huang, J.; Nag, A.; Ithurria, S.; Talapin, D. V. *Nano Lett.* 2012, 12, 1813-1820; Noh, Y.-Y.; Zhao, N.; Caironi, M.; Sirringhaus, H. *Nat. Nanotech.* 2007, 2, 784-789 and Wagner, V.; Wöbkenberg, P.; Hoppe, A.; Seekamp, J. *Appl. Phys. Lett.* 2006, 89, 243515.) These switching speeds further support the high carrier mobilities of the soldered NC FETs and demonstrate prospects of these FETs for real-world applications, such as RFID tags. Much faster speeds can be achieved when combined with optimized device designs such as dielectric engineering for eliminating hysteresis and fine patterning and alignments of S/D and gate electrodes for reducing the channel length as well as parasitic capacitances. (See, Chung, D. S.; Lee, J.-S.; Huang, J.; Nag, A.; Ithurria, S.; Talapin, D. V. *Nano Lett.* 2012, 12, 1813-1820; Uemura, T.; Matsumoto, T.; Miyake, K.; Uno, M.; Ohnishi, S.; Kato, T.; Katayama, M.; Shinamura, S.; Hamada, M.; Kang, M. J.; Takimiya, K.; Mitsui, C.; Okamoto, T.; Takeya, J. *Adv. Mater.* 2014, 26, 2983-2988 and Uno, M.; Nakayama, K.; Soeda, J.; Hirose, Y.; Miwa, K.; Uemura, T.; Nakao, A.; Takimiya, K.; Takeya, J. *Adv. Mater.* 2011, 23, 3047-3051.)

Soldering of InAs/CdSe Core-Shell NCs with $Na_2Cd_2Se_3$ Molecular Solders. As shown in Example 1 and discussed in this example, the soldering of NCs with composition-matched molecular solders is advantageous for designing chalcogenide semiconductor solids and improving device performance. At the same time, elimination of grain boundaries between individual NCs relaxes the quantum confinement of charge carriers. Taking the benefits of NC soldering while maintaining the quantum-confined nature of NCs or designing materials with embedded nano-heterostructures can open up completely new avenues for solution-processed optoelectronic devices. Here, a proof-of-concept study for soldering nano-heterostructures using InAs/CdSe core-shell NCs and $Na_2Cd_2Se_3$ molecular solders is reported. Soldering the CdSe shell with the composition-matched molecular solders improves electrical properties without sintering the InAs cores. An InAs core was chosen because: (i) it is a typical example of a III-V semiconductor; (ii) the lattice parameter of InAs matches that of the cubic CdSe phase within 1%, favoring epitaxial interfaces; and (iii) the optical properties of obtained composite materials can be tailored in the near-IR region.

InAs/CdSe core-shell NCs consisting of a 5.6 nm InAs core and a 3-layer CdSe shell were synthesized following the reported recipe with minor modifications. (See, Cao, Y. W.; Banin, U. *J. Am. Chem. Soc.* 2000, 122, 9692-9702.) The first excitonic peak of InAs NCs shifted from 1265 nm to 1584 nm as the thickness of CdSe shell increased from 0 to 3 unit cells. This is due to the expansion of the electron wavefunction into the CdSe shell (FIG. 12A). The organic ligands of the core-shell NCs were exchanged with $Na_2Cd_2Se_3$ with the same procedure described for CdSe NCs. As shown in the transmission electron microscopy (TEM) image in FIG. 12B, the InAs/CdSe core-shell NCs have an average size of ~10 nm. After annealing at 250° C. or 300° C. for 30 min, those NCs formed a continuous thin film and the film was investigated with a TEM (FIG. 12C). The TEM images showed that the annealed film consisted of well connected ~10 nm-sized crystalline grains. To gain more insight, powder XRD measurements were performed on thin films of InAs/CdSe core-shell NCs capped with $[Cd_2Se_3]^{2-}$ after annealing at different temperatures for 30 min (FIG. 12D). It was obvious that the core-shell NCs were much less sintered than the CdSe NCs capped with $[Cd_2Se_3]^{2-}$ molecular solders. Both X-ray diffraction and high-resolution TEM suggested soldering of CdSe shells. For example, the peaks of wurtzite CdSe phase (2Φ~24° and ~27°) gradually got sharper as the annealing temperature increased. Because of similarity in the lattice constants, the diffraction peaks from the InAs core were superposed onto the peaks from the CdSe shell and broadening of the XRD peaks cannot be used to extract information about the sintering of InAs cores. However, previous studies and control experiments showed that InAs NCs are much more stable against sintering compared to CdSe NCs. Thus, InAs NCs capped with various MCC ligands showed no sign of sintering up to at least 350° C. The additional evidence for the absence of sintering of InAs cores was obtained from scanning TEM (STEM) elemental mapping that revealed preservation of InAs cores after sintering CdSe shells.

To check the electrical properties of the soldered InAs/CdSe core-shell NCs, FETs were fabricated with annealing temperatures of 250° C., 300° C., and 350° C. FIGS. 12E and 12F, respectively, show the transfer characteristics of the soldered InAs/CdSe core-shell NC FETs and the plot of carrier mobilities over annealing temperature. The FETs annealed at 250° C. exhibited good performance with a mobility of ~4 $cm^2$/Vs. As the annealing temperature increased to 300° C., the performance of the FETs remarkably improved with enhanced mobilities up to ~26 $cm^2$/Vs (see FIG. 12F). The mobility did not further increase with annealing at 350° C. It could be due to suppressed grain growth for CdSe shells caused by pinning of grain boundaries by InAs cores, and due to additional electron scattering at the InAs—CdSe interfaces.

InAs is a narrow gap semiconductor that can efficiently absorb near-IR radiation. In contrast, CdSe should not absorb light at a wavelength above its fundamental edge at 713 nm at 300K. Therefore, the photoconductivity of CdSe NCs and InAs/CdSe core-shells were compared, both soldered with $[Cd_2Se_3]^{2-}$ solder, under illumination with 980 nm (1.27 eV) photons. As shown in FIG. 12G, soldered CdSe NCs do not show any photoconductivity at this wavelength. At the same time, the materials made by soldering InAs/CdSe core-shells demonstrated a clear photoresponse at 980 nm, showing that InAs absorb near-IR photons and supply mobile carriers to electronically connected and "soldered" CdSe shells (FIG. 12G). The soldering of nano-heterostructures offers a unique potential for designing complex semiconductor solids via appropriate band structure engineering between the quantum-confined core and the shell, aiming at optoelectronic device applications with improved charge transport properties.

In summary, a record high electron mobility above 400 $cm^2/Vs$ and MHz switching speeds were achieved for solution-processed transistors prepared from colloidal CdSe quantum dots capped with $Na_2Cd_2Se_3$ ligands using the NC soldering process. Various oxide thin films were introduced as gate dielectrics for the CdSe NC FETs and thermal annealing of the NCs formed on the dielectrics at different temperatures was performed to investigate the origin of the outstanding carrier mobility. $ZrO_x$ gate dielectrics provide a favorable surface for charge transport of $[Cd_2Se_3]^{2-}$-capped CdSe NCs with reduced numbers of localized traps. FETs showed carrier mobilities of ~200-450 $cm^2/Vs$, depending on NC annealing temperatures and remarkable electrical stability against a number of consecutive operation cycles and different gate-voltage sweep rates. The NC FETs using a patterned Ti gate electrode and $Al_2O_3$ dielectric exhibited very fast switching speeds with a high $f_{3\ dB}$ of ~2.3 MHz. Finally, high performance $[Cd_2Se_3]^{2-}$-capped InAs/CdSe core-shell NC FETs soldered while maintaining InAs quantum dot cores inside the NC films were demonstrated. This example illustrates high-performance electronic and optoelectronic devices using a low-cost solution process while retaining electronic properties comparable to those of crystalline semiconductors.

Detailed Materials and Methods

Chemicals and Substrates. CdSe (powder, 99.99% trace metal basis), CdO (powder, ≥99.99%), selenium (Se, powder, 100 mesh, 99.99% metal basis), indium (III) chloride ($InCl_3$, anhydrous, powder, 99.999%), tri-n-octylphosphine oxide (TOPO, 99%), hydrazine ($N_2H_4$, anhydrous, ≥98%), toluene (anhydrous, ≥99.8%), acetonitrile (anhydrous, ≥99.8%), Zr(IV) acetylacetonate ($Zr(C_5H_7O_2)_4$) (98%), ethanolamine ($C_2H_7NO$) (>99%), and N,N-dimethylformamide (DMF, anhydrous, 99.8%), were purchased from Sigma Aldrich. $Na_2Se$ (99.9%) was purchased from Materion. n-Octadecylphosphonic acid (ODPA, 99%) was purchased from TCI, and recrystallized for the synthesis of CdSe nanocrystals. Trioctylphosphine (TOP, 98%) and dimethylcadmium ($Cd(Me)_2$, 97%) were purchased from Strem Chemicals Inc. Tris(trimethylsilyl)arsine ($(TMS)_3As$) was prepared as detailed in the literature. (See, Becker, G.; Gutekunst, G.; Wessely, H. J. Z. *Anorg. Allg. Chem.* 1980, 462, 113.) Hydrazine was purified by distillation, then stored and handled inside a nitrogen-filled glovebox. All other chemicals were used as received. <100>-oriented, n-doped silicon (Si) wafers (resistivity: <0.005 Ωcm, thickness=525±25 μm) coated with 100 nm of thermal oxide ($SiO_2$) growth were purchased from Namkang Hi-tech Co., Ltd. Prime grade, <100>-oriented, p-doped silicon (Si) wafers (resistivity=0.01-0.02 Ωcm, thickness=525±25 μm) with native oxide were purchased from University Wafers. <100>-oriented, n-doped silicon (Si) wafers (resistivity=0.001-0.005 Ωcm, thickness=525±25 μm) coated with 300 nm of thermal oxide ($SiO_2$) growth were purchased from Silicon Inc.

Synthesis of CdSe Colloidal Nanocrystals. TOPO (6 g), recrystallized ODPA (0.56 g) and CdO (0.12 g) were mixed in a 50 mL three-neck round bottom flask and degassed at 150° C. for 1 hour. After refilling the flask with nitrogen, the solution was heated to 370° C. and TOP (3 g) was injected. After the system regained 370° C. temperature, a solution of Se in TOP (1.7 M) was injected and reaction mixture was allowed to stir for 5 minutes. Afterwards, the solution was allowed to naturally cool down to room temperature. CdSe NCs were precipitated with ethanol and redispersed in toluene. This process was repeated 3 times prior to the transfer of NCs in a $N_2$-filled glovebox. CdSe NCs were further purified in a glove box with a triple wash with methanol/toluene, followed by the wash with ethanol/toluene four times. CdSe NCs were finally redispersed in toluene with a concentration of 50 mg/mL.

Calculation of CdSe NC Size. The d of a synthesized CdSe NC was calculated based on the first excitonic peak position using the following equation:

$$E_g(\text{eV}) = 1.858 + \frac{1}{0.220d^2 + 0.008d + 0.373}.$$

(See, Čapek, K.; R.; Moreels, I.; Lambert, K.; De Muynck, D.; Zhao, Q.; Van Tomme, A.; Vanhaecke, F.; Hens, Z. *J. Phys. Chem. C* 2010, 114, 6371.)

Synthesis of $Na_2Cd_2Se_3$ MCCs. All synthesis and ligand exchange were performed in an $N_2$-filled glove box as detailed in a previously published procedure. (See, Dolzhnikov, D. S.; Zhang, H.; Jang, J.; Son, J. S.; Phantani, M. G.; Shibata, T.; Chattopadhyay, S.; Talapin, D. V. *Science* 2015, 347, 425.) For the synthesis of $Na_2Cd_2Se_3$ MCCs, CdSe (1 mmol) and $Na_2Se$ (1 mmol) were mixed in 16 mL of hydrazine. After stirring for ~5 days at room temperature, a transparent and colorless solution of $Na_2Cd_2Se_3$ was formed and the $Na_2Cd_2Se_3$ was precipitated with acetonitrile to separate from excess $Na_2Se$. The white precipitate was redispersed in hydrazine with concentrations of ~25 mg/mL.

Exchange of Original Organic NC Surface Ligands with $Na_2Cd_2Se_3$. As-synthesized CdSe NCs are capped with ODPA and finally dispersed in toluene with a concentration of 50 mg/ml. Before the ligand exchange, excess organic ligands were carefully removed by multiple washings with methanol or ethanol. For the ligand exchange of ODPA-capped CdSe NCs with $Na_2Cd_2Se_3$ MCCs, 1.4 ml of NC solution in toluene (~6 mg/ml) was mixed with 1.4 ml of MCC solution in hydrazine (~7 mM). The solution was stirred for a few minutes to completely transfer NCs from the toluene to the hydrazine phase. After removing the toluene phase, the hydrazine phase was washed with toluene 3 times to remove the residual organic ligands and then filtered through a 0.2 μm PTFE filter for further purification. $[Cd_2Se_3]^{2-}$-capped CdSe NCs with some amount of $Na_2Cd_2Se_3$ MCCs were precipitated with anhydrous acetonitrile and dispersed in hydrazine again for use in the device fabrication step. Here, excessive MCC ligands that were not bound to the NC surface do not need to be removed because they would act as "molecular solder" for CdSe grain growth.

Synthesis of InAs Colloidal Nanocrystals. Two grams of TOP was heated to 300° C. under $N_2$ while being vigorously stirred magnetically. One mL stock solution of $InCl_3$ and $(TMS)_3As$ in TOP (see below) was swiftly injected to promote NC nucleation. The growth temperature was maintained at 260° C. To monitor NC growth, absorption spectra of the aliquots with increasing duration were measured. Two more dropwise injections were needed to obtain InAs NCs with sizes larger than 5 nm. The reaction was stopped and cooled to room temperature once the desired size was reached. Then the solution was transferred into a glovebox and diluted with 15 mL anhydrous toluene. The NCs were washed once with toluene and ethanol as the solvent and non-solvent, respectively. The size distribution of as-synthesized InAs NCs was around 12%. It can be further improved to 7-10% with a size selective precipitation approach by gradually adding more ethanol as the nonsolvent.

Calculation of InAs NC Size. The diameter (d) of a synthesized InAs NC was calculated based on the first excitonic peak position (x) using the following equation: $=0.00000196x^{2.08}$.

(See, Xie, R.; Peng, X. *Angew. Chem. Int. Ed.* 2008, 47, 7677.)

Stock Solution for InAs NC Synthesis. 3.5 g of $InCl_3$ was dissolved into 10 g of TOP under $N_2$ at 260° C. while being stirred. The solution was cooled down to room temperature and transferred into a glovebox. The stock solution was prepared by mixing $InCl_3$-TOP solution and $(TMS)_3As$ with In:As in a molar ratio of 3:2.

Synthesis of InAs/CdSe Core-Shell NCs. One mL of InAs NCs solution in toluene (13 mg/mL), six mL of TOP and 0.42 g of TOPO were mixed in a 25 mL three-neck round-bottom flask. Toluene was evacuated at 80° C. The solution was heated up to 220° C. The calculated amount of Cd/Se stock solution (1.2:1 by molar) was slowly injected into the solution to obtain roughly three layers shell thickness. For thicker ones, a successive ionic layer adsorption and reaction (SILAR) approach with the sequence of Cd and Se precursors was used to prevent secondary nucleation. After the reaction was over, the solution was transferred into an oxygen-free glovebox. The solution turned out to be stabilized by adding a small amount of $Cd(Me)_2$ stock solution. The NCs were precipitated with ethanol and redispersed in toluene for storage. Absorption spectra were taken in trichloroethylene.

Stock Solution for InAs/CdSe Synthesis. Selenium (113 mg) and TOP (10 mL) were stirred at room temperature for 1 hour to form TOPSe stock solution (0.143 mmol/mL); $Cd(Me)_2$ stock solution (0.143 mmol/mL) was prepared by adding 204.2 mg $Cd(Me)_2$ into 10.0 mL TOP solution.

Device Fabrication and Characterization. All Si substrates were cleaned with a piranha treatment, rinsed with DI water multiple times, and blown with $N_2$ before use.

Preparation of $SiO_2$ and $Al_2O_3$ Gate Dielectrics: Thermally grown 100 nm-thick $SiO_2$ gate dielectrics on Si substrates were used as received after piranha treatment. For the fabrication of $Al_2O_3$ gate dielectrics, Si wafers with native oxide cleaned with piranha treatment were used as gate substrates. About ~37 nm-thick $Al_2O_3$ films were grown using an atomic layer deposition (ALD) system (Cambridge Nanotech) using $H_2O$ and trimethylaluminum as precursors at 80° C. for 330 cycles (~1.1 Å/cycle). The films were subsequently annealed at 250° C. in a furnace with a $Ar/H_2$ (500 sccm/500 sccm) flow for 30 min to reduce the amount of hydroxyl groups and dangling bonds.

Preparation of $ZrO_x$ Gate Dielectrics: A procedure reported in the literature with slight modification in each step was followed. (See, Park, Y. M.; Daniel, J.; Heeney, M.; Salleo, A. *Adv. Mater.* 2011, 23, 971.) 243.8 mg of Zr(IV) acetylacetonate ($Zr(C_5H_7O_2)_4$) (98%, Sigma Aldrich) was dissolved in 5 mL DMF in air. An equimolar amount (30.18 μL) of ethanolamine ($C_2H_7NO$) (>99%, Sigma Aldrich) was added to the solution in a $N_2$-filled glove box and the solution was stirred at 70° C. for 3 h to promote hydrolysis. Si wafers with native oxide cleaned with piranha treatment were used as gate substrates. The $ZrO_x$ sol-gel solution was filtered through 0.2 μm PTFE filter and spin-coated on the Si substrates at 4000 rpm for 50 s in air or $N_2$ atmosphere. (In case of high relative humidity of >40%, coating in $N_2$ atmosphere was required to achieve uniform and clean $ZrO_x$ sol-gel films.) The sol-gel films were thermally annealed at 400° C. for 1 h in a furnace under a $N_2$ atmosphere, and then cooled to room temperature.

FET Fabrication: For the fabrication of FET devices, thermally grown $SiO_2$ gate dielectrics were used just after cleaning with piranha treatment. The $Al_2O_3$ and $ZrO_x$ gate dielectrics were hydrophilized by oxygen plasma treatment (3-5 min) prior to NC deposition. All following fabrication steps were performed in a $N_2$-filled glove box. Solutions of $[Cd_2Se_3]^{2-}$-capped CdSe NCs (~50 mg/mL in hydrazine) were spin-coated (spread: 600 rpm, 6 s; spin: 2000 rpm, 50 s) onto the $SiO_2$, $Al_2O_3$, and $ZrO_x$ films. The NC films were annealed at 100° C. for 1 h for solvent evaporation, and then annealed at 250° C., 300° C., or 350° C. for 30 min to decompose the ligand and to induce "soldering" of CdSe NCs for grain growth. 100 nm-thick Al source/drain (S/D) electrodes were deposited through a shadow mask using a thermal evaporator to complete a top-contact, bottom-gate FET structure (channel length L/width W: 30 μm, 50 μm, 60 μm, or 125 μm/1500 μm). For device fabrication of switching speed measurements, a 40 nm-thick titanium (Ti) gate electrode was deposited on 300 nm-thick $SiO_2$ substrates through a shadow mask using a thermal evaporator. (Here, 300 nm-thick $SiO_2$ substrates just acted as insulating substrates. $SiO_2$ substrates were used instead of glass substrates to achieve lower roughness.) ~37 nm-thick $Al_2O_3$ thin films were deposited by an ALD system onto the Ti gate patterned substrates. Hereafter, the same fabrication process was used with the process for standard FET devices described above. For the FETs for switching speed measurements, a different shadow mask was used for more efficient alignment of S/D electrodes with the gate electrode (L/W: 50 μm/280 μm). The FET devices should be handled and stored under inert atmosphere. Proper device encapsulation is desirable for long-term operational stability of n-type FET devices in air, which is a general issue for thin-film n-type semiconductors.

Device Characterization: All electrical measurements were performed in a $N_2$-filled glove box. For capacitance measurements, sandwich-type devices were fabricated by depositing 100 nm-thick Al electrodes (various-sized dots with diameters 500 μm, 650 μm, and 800 μm) directly on top of piranha-cleaned $SiO_2$ and plasma-treated $Al_2O_3$ and $ZrO_x$ films. The capacitance measurements were performed using an LCR meter (SR 720) with frequencies ranging from 100 Hz to 100 kHz. The capacitance values measured at 100 Hz were averaged and used for mobility extraction. FET measurements were performed either using a semiconductor analyzer (Agilent B1500A) or using a Keithley dual channel sourcemeter (Keithley 2636A) controlled by a Labview interface. All electron mobility values have been extracted from the forward gate voltage sweep that provides a conservative estimate for electron mobility.

Calculation of Field-Effect Mobility: In the gradual channel approximation, current in the FET channel can be analytically described for two different regimes of operation, the linear and saturation regimes. (See, Kagan, C. R. and Andry, P. *Thin Film Transistors*, ed. Marcel Dekker, New York 2003.38.)

The linear regime FET mobility ($\mu_{lin}$) was calculated by fitting the experimental data to the following equation:

$$\mu_{lin} = \frac{L}{WC_i V_D} \frac{dI_D}{dV_G},$$

where $C_i$, $V_D$, $I_D$, and $V_G$ are the areal capacitance, drain voltage, drain current, and gate voltage, respectively.

The saturation regime FET mobility ($\mu_{sat}$) was calculated by fitting the experimental data to the following equation and using the slope of $|I_D|^{1/2}$ vs. $V_G$:

$$I_D = \frac{WC_i\mu_{sat}}{2L}(V_G - V_T)^2,$$

where $V_T$ is the threshold voltage. The mobility discussed throughout this disclosure is mostly the linear regime FET mobility $\mu_{lin}$. The saturation regime mobility ($\mu_{sat}$) was found to be about ~60-100% of $\mu_{lin}$, as normally observed in NC FETs.

Switching Speed Measurements: Drain current response was recorded using an oscilloscope (Agilent Technologies, DSO 6014A) by reading voltage drop thorough a resistor (100Ω). The constant $V_D$ was applied by a Keithley 2400 source meter and the square-shape AC gate signal was applied by a function generator (SRS DS 345). An FET was placed on a prove station inside a glove box and S/D/G electrodes were contacted by prove tips which were connected with BNC cables that directly went to each equipment.

Photoresponse Measurements: For the photoresponse versus time measurements, standard top-contact bottom-gate NC FETs were used. The devices were biased using a semiconductor analyzer (Agilent B1500A). The photocurrent was measured under illumination by a continuous wave light-emitting diode emitting at 980 nm (1.27 eV) on top of the devices, controlled with a laser diode controller (Thorlabs LDC 205 C).

Characterization Techniques

Optical Absorption Measurements: UV-vis spectra were collected using a Cary 5000 UV-Vis-NIR spectrophotometer.

Scanning Electron Microscopy (SEM): SEM analysis was carried out on a FEI Nova NanoSEM 230 operating at 10 kV.

Wide Angle Powder X-Ray Diffraction (XRD): XRD patterns were collected using a Bruker D8 diffractometer with Cu $K_a$ X-ray source operating at 40 kV and 40 mA. To prepare samples, solutions of CdSe NCs capped with $[Cd_2Se_3]^{2-}$ were spin-coated onto the $SiO_2$ and $ZrO_x$ films. The NC films were annealed at 100° C. for 1 h to evaporate solvent. Each substrate coated with a NC film was then cleaved into 6 pieces and each piece was annealed at 200° C., 250° C., 300° C., 350° C., 400° C. for 30 min on a hot plate (one piece was not annealed in this step and used for the sample of 100° C.).

Transmission Electron Microscopy (TEM): TEM images were obtained using a 300 kV FEI Tecnai F30 microscope.

Scanning TEM (STEM) and Energy-Dispersive X-Ray (EDX) Analyses: STEM and EDX analyses were performed using an aberration-corrected JEOL JEM-200CF equipped with an Oxford X-MaxN 100TLE silicon drift X-ray detector and operated at 200 kV. The microscope was equipped with a cold field-emission source, which yields an energy resolution of 0.35 eV; it allows for 73 μm spatial resolution at 200 kV with the probe spherical-aberration corrector. To achieve a high-brightness probe for EDX mapping, a convergence semi-angle of 28 mrad at 200 kV primary energy, a 110-440 mrad collection semi-angle for high-angle annular dark-field imaging, and a 14-28 mrad collection semi-angle for annular bright field imaging were used.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a structure comprising a metal chalcogenide, the method comprising:

coating a surface of a substrate with a dispersion comprising metal chalcogenide particles, a compositionally matched metal chalcogenide precursor and a solvent, wherein the metal chalcogenide precursor is a chalcogenidometallate of a group IIB, group IV or group V element; and annealing the coating to form the structure comprising the metal chalcogenide.

2. The method of claim 1, wherein the metal chalcogenide precursor is an alkali metal-containing chalcogenidometallate.

3. The method of claim 2, wherein the metal chalcogenide particles are cadmium chalcogenide particles, bismuth chalcogenide particles or lead chalcogenide particles and the metal chalcogenide precursor is an alkali metal-containing chalcogenidometallate of cadmium, bismuth or lead.

4. The method of claim 3, further comprising reacting an alkali metal chalcogenide with a chalcogenide of cadmium, bismuth or lead in a solvent to form the metal chalcogenide precursor.

5. The method of claim 4, further comprising reacting an alkali metal hydride with an elemental chalcogen in a solvent to form the alkali metal chalcogenide.

6. The method of claim 3, further comprising reacting an alkali metal hydride with an elemental chalcogen and cadmium oxide, lead oxide or bismuth oxide in a solvent to form the metal chalcogenide precursor.

7. The method of claim 3, wherein the alkali metal-containing chalcogenidometallate is selected from the group consisting of $A_2CdTe_2$, $A_2PbTe_2$, $A_2PbSe_2$, $A_2Cd_2Se_3$, $A_4Bi_2Te_5$, $A_4Bi_2Se_5$, and $A_6Bi_{0.5}Sb_{1.5}Te_6$, where A is K, Na or Cs.

8. The method of claim 1, wherein the metal chalcogenide precursor is an alkylammonium-containing metal chalcogenide precursor.

9. The method of claim 8, further comprising forming the alkylammonium-containing metal chalcogenide precursor by forming an alkali metal-containing chalcogenidometallate of a group IIB, group IV or group V element; and replacing the alkali metal with an alkylammonium cation via ion exchange to provide the alkylammonium-containing metal chalcogenide precursor.

10. The method of claim 1, wherein the metal chalcogenide precursor is an organic cation-containing metal chalcogenide precursor or an ammonium cation-containing metal chalcogenide precursor.

11. The method of claim 10, further comprising forming the metal chalcogenide precursor by forming an alkali metal-containing chalcogenidometallate of a group IIB, group IV or group V element; and replacing the alkali metal with a cation selected from ammonium, alkylammonium, hydrazinium, alkylhydrazinium, sulfonium, and iodonium cations, via ion exchange to provide the metal chalcogenide precursor.

12. The method of claim 1, wherein the metal chalcogenide particles are core-shell particles comprising a core comprising a first material and a shell comprising the metal chalcogenide surrounding the core.

13. The method of claim 12, wherein the first material is a group III-V semiconductor.

14. A method of molding a three-dimensional object of a metal chalcogenide, the method comprising:

filling a mold with a dispersion comprising metal chalcogenide particles, a compositionally matched metal chalcogenide precursor and a solvent;

evaporating excess solvent to form a dried composite; and annealing the dried composite to form a molded three-dimensional object of a metal chalcogenide.

15. The method of claim 14, wherein the metal chalcogenide precursor is an alkali metal-containing chalcogenidometallate of a group IIB, group IV or group V element.

16. The method of claim 15, wherein the metal chalcogenide precursor is an alkali metal-containing chalcogenidometallate of cadmium, bismuth, lead, zinc, mercury, antimony, tin, or germanium.

17. A method of bonding metal chalcogenide surfaces, the method comprising:

coating a first metal chalcogenide surface with a dispersion comprising a compositionally matched metal chalcogenide precursor and a solvent;

contacting a second metal chalcogenide surface with the first metal chalcogenide surface; and annealing the coating to bond the second metal chalcogenide surface to the first metal chalcogenide surface.

18. The method of claim 17, wherein the first and second metal chalcogenide surfaces are located on two different macroscopic objects.

19. The method of claim 17, wherein the first and second metal chalcogenide surfaces are substantially planar.

20. The method of claim 18, wherein the first and second metal chalcogenide surfaces are located on two different metal chalcogenide wafers.

21. A method of making a field effect transistor, the method comprising:

coating a layer of a dielectric material with a dispersion comprising metal chalcogenide particles, a compositionally matched metal chalcogenide precursor and a solvent, wherein the metal chalcogenide precursor is a chalcogenidometallate of a group IIB, group IV or group V element;

annealing the coating to form a film comprising the metal chalcogenide;

forming a source electrode on the film comprising the metal chalcogenide;

forming a drain electrode on the film comprising the metal chalcogenide;

forming a gate electrode on the layer of dielectric material.

22. The method of claim 21, wherein the dielectric material is zinc oxide and the metal chalcogenide particles are CdSe particles.

* * * * *

UNITED STATES PATENT AND TRADEMARK OFFICE

CERTIFICATE OF CORRECTION

PATENT NO. : 10,283,357 B2
APPLICATION NO. : 15/528871
DATED : May 7, 2019
INVENTOR(S) : Dmitriy S. Dolzhnikov et al.

It is certified that error appears in the above-identified patent and that said Letters Patent is hereby corrected as shown below:

In the Specification

On Column 1, Line 14, before the “BACKGROUND”, please insert the following paragraph:
--REFERENCE TO GOVERNMENT RIGHTS
This invention was made with government support under grant numbers DE-EE0005312 and DE- AC02-06CH11357 awarded by the Department of Energy, and grant number DMR 082-0054 awarded by the National Science Foundation. The government has certain rights in the invention.--

Signed and Sealed this
Second Day of July, 2019

Andrei Iancu
*Director of the United States Patent and Trademark Office*